US006818372B2

(12) United States Patent
Kunita et al.

(10) Patent No.: US 6,818,372 B2
(45) Date of Patent: Nov. 16, 2004

(54) LITHOGRAPHIC PRINTING PLATE PRECURSOR

(75) Inventors: Kazuto Kunita, Shizuoka (JP); Hiromitsu Yanaka, Shizuoka (JP)

(73) Assignee: Fuji Photo Film Co., Ltd., Ashigara (JP)

( * ) Notice: Subject to any disclaimer, the term of this patent is extended or adjusted under 35 U.S.C. 154(b) by 215 days.

(21) Appl. No.: 10/091,439

(22) Filed: Mar. 7, 2002

(65) Prior Publication Data

US 2003/0084806 A1 May 8, 2003

(30) Foreign Application Priority Data

Mar. 7, 2001 (JP) .................................... P.2001-063824

(51) Int. Cl.$^7$ ............................ B41N 1/00; B41N 3/03; G03F 7/11; G03F 7/031

(52) U.S. Cl. .................... 430/138; 430/944; 430/271.1; 430/281.1; 430/288.1; 430/287.1; 430/176; 430/171; 430/283.1; 430/273.1; 101/467; 101/456; 101/453

(58) Field of Search ................................ 430/138, 944, 430/271.1, 281.1, 288.1, 287.1, 176, 171, 283.1, 273.1; 101/467, 456

(56) References Cited

U.S. PATENT DOCUMENTS

| | | | | | |
|---|---|---|---|---|---|
| 6,476,092 | B1 | * 11/2002 | Kunita | .................... | 430/288.1 |
| 2001/0046638 | A1 | * 11/2001 | Yanaka et al. | .............. | 430/138 |
| 2002/0102488 | A1 | 8/2002 | Yanaka et al. | | |

FOREIGN PATENT DOCUMENTS

| | | | | |
|---|---|---|---|---|
| EP | 1091247 | A2 * | 4/2001 | ........... G03F/7/027 |

* cited by examiner

*Primary Examiner*—Cynthia Hamilton

(74) *Attorney, Agent, or Firm*—Burns, Doane, Swecker & Mathis, L.L.P.

(57) ABSTRACT

A lithographic printing plate precursor comprising a hydrophilic support having provided thereon an image-forming layer containing a radical initiator, an infrared absorbing dye, and at least one component selected from fine particles containing a radical polymerizable compound having the specific structure and microcapsules encapsulating a radical polymerizable compound having the specific structure.

17 Claims, No Drawings

LITHOGRAPHIC PRINTING PLATE PRECURSOR

FIELD OF THE INVENTION

The present invention relates to a lithographic printing plate precursor. More particularly, the present invention relates to a lithographic printing plate precursor capable of performing plat-making with scanning exposure based on digital signals, having high-sensitivity and good press life, capable of providing printed matters free from stains, and capable of being mounted on a printing machine as it is for printing without development processing.

BACKGROUND OF THE INVENTION

In recent years, various investigations have been made with respect to printing plates for a computer to plate system with the remarkable progress in the field. Among the investigations, for purposes of more rationalizing the plate-making process and solving the waste liquor treatment problem, lithographic printing plate precursors capable of being mounted on a printing machine as it is for printing without development processing after exposure have been studied and various methods have been proposed.

One method for eliminating processing steps is a method called on-machine development wherein an exposed printing plate precursor is mounted on a cylinder of printing machine and a fountain solution and printing ink are supplied on the printing plate precursor while rotating the cylinder, thereby removing a non-image area of the printing plate precursor. Specifically, according to the method, after exposing a printing plate precursor, the printing plate precursor is mounted on a printing machine as it is and processing is completed in an ordinary printing step.

The lithographic printing plate precursor suitable for such an on-machine development is required to have a photosensitive layer soluble in a fountain solution and an ink solvent and also a light-room handling property capable of development on a printing machine placed in a light room.

For instance, a lithographic printing plate precursor comprising a hydrophilic support provided thereon a photosensitive layer containing fine particles of a thermoplastic hydrophobic polymer dispersed in a hydrophilic binder polymer is described in Japanese Patent No. 2938397. In the patent, it is described that the lithographic printing plate precursor is exposed with an infrared laser to form images by coalescing the fine particles of the thermoplastic hydrophobic polymer by heat, mounted on a cylinder of a printing machine and subjected to the on-machine development with a fountain solution and/or printing ink.

Also, in JP-A-9-127683 (the term "JP-A" as used herein means an "unexamined published Japanese patent application") and WO 99/10186, it is described that after coalescing thermoplastic fine particles, a printing plate is prepared by the on-machine development.

However, the method of forming images by fusing of fine particles with heat as described above is accompanied with a problem that sensitivity is low or good press life is hardly obtained.

SUMMARY OF THE INVENTION

Therefore, an object of the present invention is to solve the problem, more specifically, to provide a lithographic printing plate precursor having a good on-machine developing property, high sensitivity and good press life.

Other objects of the present invention will become apparent from the following description.

As a result of the intensive investigations for attaining the above-described object, it has been found that the problem of the above-described prior art technique is solved by a lithographic printing plate precursor described below.

(1) A lithographic printing plate precursor comprising a hydrophilic support having provided thereon an image-forming layer containing a radical initiator, an infrared absorbing dye, and at least one component selected from fine particles containing a radical polymerizable compound having a structure represented by formula (I) shown below and microcapsules encapsulating a radical polymerizable compound having a structure represented by formula (I) shown below.

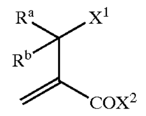

(I)

wherein $X^1$ and $X^2$, which may be the same or different, each represents a halogen atom or a group connected through a hetero atom; $R^a$ and $R^b$, which may be the same or different, each represents a hydrogen atom, a halogen atom, a cyano group or an organic residue; or $X^1$ and $X^2$, $R^a$ and $R^b$, or $X^1$ and $R^a$ or $R^b$ may combine with each other to form a cyclic structure.

DETAILED DESCRIPTION OF THE INVENTION

The lithographic printing plate precursor according to the present invention can form images by a scanning exposure based on digital signals. When heat is applied to the hydrophilic image-forming layer of the lithographic printing plate precursor by image-exposure, a reaction of the fine particles containing a radical polymerizable compound having a structure represented by formula (I) or the microcapsules encapsulating a radical polymerizable compound having a structure represented by formula (I) with the radical initiator and the infrared absorbing dye (also referred to as an infrared absorber hereinafter) occurs in the layer so that the printing plate precursor shows a good on-machine developing property, high sensitivity, and excellent press life due to increase in film strength of the image area heated.

The radical polymerizable compound having a structure represented by formula (I) hardly suffers polymerization inhibition due to oxygen in comparison with conventional polymerizable compounds, provides a photosensitive material having high sensitivity and forms a film having high hardness so that a lithographic printing plate having excellent press life can be obtained.

Now, the lithographic printing plate precursor according to the present invention is described in detail below.

First, each component of the image-forming layer, which is the feature of the lithographic printing plate precursor according to the present invention, is described.

<<Image-Forming Layer>>

<Compound having a Structure Represented by Formula (I) According to the Present Invention>

The radical polymerizable compound including at least one polymerizable group according to the present invention has the structure represented by formula (I).

The structure represented by formula (I) may form a monovalent or two or more valent substituent, or a compound in which all of $R^a$, $R^b$, $X^1$ and $X^2$ in formula (I) each represents a terminal group. When the structure represented by formula (I) forms a monovalent or two or more valent substituent, at least one of $R^a$, $R^b$, $X^1$ and $X^2$ in formula (I) has one or more connecting bonds. Further, $X^1$ or $X^2$ in formula (I) may form a connecting group having n's connectable parts, to terminals of which n's groups represented by formula (I) are bonded (wherein n represents an integer of 2 or more) (multifunctional compound).

Moreover, the structure represented by formula (I) may be bonded to a polymer chain at $X^1$ or $X^2$. In such a case, the structures represented by formula (I) are present in side chains of the polymer chain. The polymer chain includes a linear organic polymer described hereinafter. Specific examples of the polymer include a vinyl polymer, e.g., polyurethane, novolak or polyvinyl alcohol, polyhydroxystyrene, polystyrene, poly(meth)acrylic ester, poly(meth)acrylamide and polyacetal. The polymer may be a homopolymer or copolymer.

In formula (I), $X^1$ or $X^2$ represents a halogen atom or a group connected through a hetero atom, and may be a terminal group or a connecting group bonding to another substituent (the substituent includes the structure represented by formula (I) and polymer chain as described above). The hetero atom is preferably a non-metallic atom, and specifically includes an oxygen atom, a sulfur atom, a nitrogen atom and a phosphorus atom. The halogen atom include, for example, a chlorine atom, a bromine atom, an iodine atom and a fluorine atom.

$X^1$ is preferably a halogen atom or as the group connected through a hetero atom, a hydroxy group, a substituted oxy group, a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group or a heterocyclic group that is connected through a hetero atom included therein.

$X^2$ is preferably a halogen atom or as the group connected through a hetero atom, a hydroxy group, a substituted oxy group, a mercapto group, a substituted thio group, an amino group, a substituted amino group or a heterocyclic group that is connected through a hetero atom included therein.

In the case wherein $X^1$ or $X^2$ represents a connecting group to which another substituent is bonded, n's groups represented by formula (I) may be bonded to terminals of a connecting group having n's connectable parts obtained by eliminating n's hydrogen atoms (wherein n represents an integer of 2 or more).

Also, $X^1$ or $X^2$ may combine with each other to form a cyclic structure.

$R^a$ and $R^b$, which may be the same or different, each represents preferably a hydrogen atom, a halogen atom, a cyano group or as the organic residue, a hydrocarbon group which may have a substituent and/or an unsaturated bond, a substituted oxy group, a substituted thio group, a substituted amino group, a substituted carbonyl group or a carboxylato group.

Also, $R^a$ and $R^b$ may combine with each other to form a cyclic structure.

Each of the substituents included in $X^1$, $X^2$, $R^a$ and $R^b$ in formula (I) is described below.

The hydrocarbon group which may have a substituent and/or an unsaturated bond includes an alkyl group, a substituted alkyl group, an aryl group, a substituted aryl group, an alkenyl group, a substituted alkenyl group an alkynyl group and a substituted alkynyl group.

The alkyl group includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The substituted alkyl group is composed of a substituent bonding to an alkylene group. The substituent includes a monovalent non-metallic atomic group exclusive of a hydrogen atom. Preferred examples of the substituent for the alkyl group include a halogen atom (e.g., fluorine, bromine, chlorine or iodine), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, N'-arylureido group, an N',N'-diarylureido group, an N'-alkyl-N'-arylureido group, an N-alkylureido group, N'-alkyl-N'-arylureido group, an N-alkylureido group, N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, an acyl group, a carboxy group and a conjugate base group thereof (hereinafter, referred to as a carboxylato group), an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group ($—SO_3H$) and a conjugate base group thereof (hereinafter, referred to as a sulfonato group), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, an N-acylsulfamoyl group and a conjugate base group thereof, an N-alkylsulfonylsulfamoyl group ($—SO_2NHSO_2$(alkyl)) and a conjugate base group thereof, an N-arylsulfonylsulfamoyl group ($—SO_2NHSO_2$ (aryl)) and a conjugate base group thereof, an N-alkylsulfonylcarbamoyl group ($—CONHSO_2$(alkyl)) and a conjugate base group thereof, an N-arylsulfonylcarbamoyl group (—$CONHSO_2$(aryl)) and a conjugate base group thereof, an alkoxysilyl group (—Si(O-alkyl)$_3$), an aryloxysilyl group (—Si(O-aryl)$_3$), a hydroxysilyl group (—Si $(OH)_3$) and a conjugate base group thereof, a phosphono group (—$PO_3H_2$) and a conjugate base group thereof (hereinafter, referred to as a phosphonato group), a dialkylphosphono group (—$PO_3$(alkyl)$_2$), a diarylphosphono group (—$PO_3$(aryl)$_2$), an alkylarylphosphono group (—$PO_3$ (alkyl) (aryl)), a monoalkylphosphono group (—$PO_3$H (alkyl)) and a conjugate base group thereof (hereinafter, referred to as an alkylphosphonato group), a monoarylphosphono group (—$PO_3$H(aryl)) and a conjugate base group thereof (hereinafter, referred to as an arylphosphonato group), a phosphonoxy group (—$OPO_3H_2$) and a conjugate base group thereof (hereinafter, referred to as a phosphonatoxy group), a dialkylphosphonoxy group (—$OPO_3$(alkyl)$_2$), a diarylphosphonoxy group (—$OPO_3$ (aryl)$_2$), an alkylarylphosphonoxy group (—$OPO_3$(alkyl) (aryl)), a monoalkylphosphonoxy group (—$OPO_3$H(alkyl)) and a conjugate base group thereof (hereinafter, referred to as an alkylphosphonatoxy group), a monoarylphosphonoxy group (—$OPO_3$H(aryl)) and a conjugate base group thereof (hereinafter, referred to as an arylphosphonatoxy group), a cyano group, a nitro group, an aryl group, an alkenyl group and an alkynyl group.

Specific examples of the alkyl group in the substituents include those described above. Specific examples of the aryl group in the substituents include phenyl, biphenyl, naphthyl, tolyl, xylyl, mesityl, cumenyl, fluorophenyl, chlorophenyl, bromophenyl, chloromethylphenyl, hydroxyphenyl, methoxyphenyl, ethoxyphenyl, phenoxyphenyl, acetoxyphenyl, benzoyloxyphenyl, methylthiophenyl, phenylthiophenyl, methylaminophenyl, dimethylaminophenyl, acetylaminophenyl, carboxyphenyl, methoxycarbonylphenyl, ethoxycarbonylphenyl, phenoxycarbonylphenyl, N-phenylcarbamoylphenyl, phenyl, nitrophenyl, cyanophenyl, sulfophenyl, sulfonatophenyl, phosphonophenyl and phosphonatophenyl groups. Specific examples of the alkenyl group include vinyl, 1-propenyl, 1-butenyl, cinnamyl and 2-chloro-1-ethenyl groups. Specific examples of the alkynyl group include ethynyl, 1-propynyl, 1-butynyl, trimethylsilylethynyl and phenylethynyl groups.

In the acyl group ($R^4CO$—) described above, $R^4$ represents a hydrogen atom, or the above-described alkyl group, aryl group, alkenyl group or alkynyl group.

In the substituted alkyl group, an alkylene group includes a divalent organic residue obtained by eliminating any one of hydrogen atoms on the alkyl group having from 1 to 20 carbon atoms described above, and preferably a straight chain alkylene group having from 1 to 12 carbon atoms, a branched alkylene group having from 3 to 12 carbon atoms and a cyclic alkylene group having from 5 to 10 carbon atoms. Specific preferred examples of the substituted alkyl group include chloromethyl, bromomethyl, 2-chloroethyl, trifluoromethyl, methoxymethyl, methoxyethoxyethyl, allyloxymethyl, Phenoxymethyl, methylthiomethyl, tolylthiomethyl, ethylaminoethyl, diethylaminopropyl, morpholinopropyl, acetyloxymethyl, benzoyloxymethyl, N-cyclohexylcarbamoyloxyethyl, N-phenylcarbamoyloxyethyl, acetylaminoethyl, N-methylbenzoylaminopropyl, 2-oxoethyl, 2-oxopropyl, carboxypropyl, methoxycarbonylethyl, methoxycarbonylmethyl, methoxycarbonylbutyl, ethoxycarbonylmethyl, butoxycarbonylmethyl, allyloxycarbonylmethyl, benzyloxycarbonylmethyl, methoxycarbonylphenylmethyl, trichloromethylcarbonylmethyl, allyloxycarbonylbutyl, chlorophenoxycarbonylmethyl, carbamoylmethyl, N-methylcarbamoylethyl, N,N-dipropylcarbamoylmethyl, N-(methoxyphenyl) carbamoylethyl, N-methyl-N-(sulfophenyl) carbamoylmethyl, sulfopropyl, sulfobutyl, sulfonatobutyl, sulfamoylbutyl, N-ethylsulfamoylmethyl, N,N-dipropylsulfamoylpropyl, N-tolylsulfamoylpropyl, N-methyl-N-(phosphonophenyl)sulfamoyloctyl, $CH_3CONHSO_2CH_2CH_2CH_2CH_2$—,

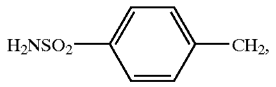

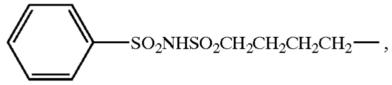

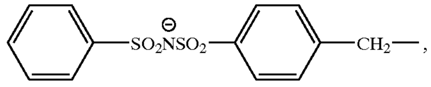

HS—$CH_2CH_2CH_2CH_2$,

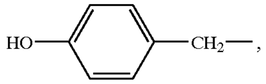

phosphonobutyl, phosphonatohexyl, diethylphosphonobutyl, diphenylphosphonopropyl, methylphosphonobutyl, methylphosphonatobutyl, tolylphosphonohexyl, tolylphosphonatohexyl, phosphonoxypropyl, phosphonatoxybutyl, benzyl, phenethyl, α-methylbenzyl, 1-methyl-1-phenylethyl, p-methylbenzyl, cinnamyl, allyl, 1-propenylmethyl, 2-butenyl, 2-methylallyl, 2-methylpropenylmethyl, 2-propynyl, 2-butynyl and 3-butynyl groups.

The aryl group includes a condensed ring of one to three benzene rings and a condensed ring of a benzene ring and a 5-membered unsaturated ring. Specific examples of the aryl group include phenyl, naphthyl, anthryl, phenanthryl, indenyl, acenaphthenyl and fluorenyl groups. A phenyl group and a naphthyl group are preferred.

The substituted aryl group is a group formed by bonding a substituent to an aryl group and includes groups having a monovalent non-metallic atomic group exclusive of a hydrogen atom, as a substituent, on the ring-forming carbon atom of the above-described aryl group. Examples of the substituent include the above-described alkyl and substituted alkyl group and the substituents for the substituted alkyl group. Specific preferred examples of the substituted aryl group include biphenyl, tolyl, xylyl, mesityl, cumenyl, chlorophenyl, bromophenyl, fluorophenyl, chloromethylphenyl, trifluoromethylphenyl, hydroxyphenyl, methoxyphenyl, methoxyethoxyphenyl, allyloxyphenyl, phenoxyphenyl, methylthiophenyl, tolylthiophenyl, phenylthiophenyl, ethylaminophenyl, diethylaminophenyl, morpholinophenyl, acetyloxyphenyl, benzoyloxyphenyl, N-cyclohexylcarbamoyloxyphenyl, N-phenylcarbamoyloxyphenyl, acetylaminophenyl, N-methylbenzoylaminophenyl, carboxyphenyl, methoxycarbonylphenyl, allyloxycarbonylphenyl, chlorophenoxycarbonylphenyl, carbamoylphenyl, N-methylcarbamoylphenyl, N,N-dipropylcarbamoylphenyl, N-(methoxyphenyl)carbamoylphenyl, N-methyl-N-(sulfophenyl)carbamoylphenyl, sulfophenyl, sulfonatophenyl, sulfamoylphenyl, N-ethylsulfamoylphenyl, N,N-dipropylsulfamoylphenyl, N-tolylsulfamoylphenyl, N-methyl-N-(phosphonophenyl)sulfamoylphenyl, phosphonophenyl, phosphonatophenyl, diethylphosphonophenyl, diphenylphosphonophenyl, methylphosphonophenyl, methylphosphonatophenyl, tolylphosphonophenyl, tolylphosphonatophenyl, allylphenyl, 1-propenylmethylphenyl, 2-butenylphenyl, 2-methylallylphenyl, 2-methylpropenylphenyl, 2-propynylphenyl, 2-butynylphenyl and 3-butynylphenyl groups.

The alkenyl group includes that described above. The substituted alkenyl group is a group formed by replacing a hydrogen atom of the alkenyl group with a substituent. Examples of the substituent include the substituents for the substituted alkyl group described above, and the alkenyl group is that described above. Preferred examples of the substituted alkenyl group include the following groups:

$CH_3O_2CCH_2CH{=}CHCH_2—$ ,

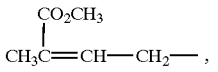

$HO_2CCH_2CH{=}CHCH_2—$ ,

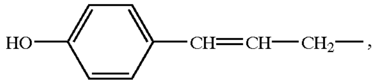

$CH_2{=}CH—CH{=}CH—CH_2—$ , $Cl—CH_2CH{=}CHCH_2—$ ,

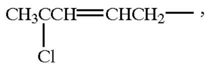

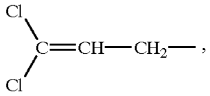

$HS—CH_2CH{=}CHCH_2—$

The alkynyl group includes that described above. The substituted alkynyl group is a group formed by replacing a hydrogen atom of the alkynyl group with a substituent. Examples of the substituent include the substituents for the substituted alkyl group described above, and the alkynyl group is that described above.

The heterocyclic group includes a monovalent group formed by eliminating one hydrogen atom on the hetero ring and a monovalent group (a substituted heterocyclic group) formed by further eliminating one hydrogen atom from the above-described monovalent group and bonding a substituent selected from the substituents for the substituted alkyl group described above. Preferred examples of the hetero ring are set forth below.

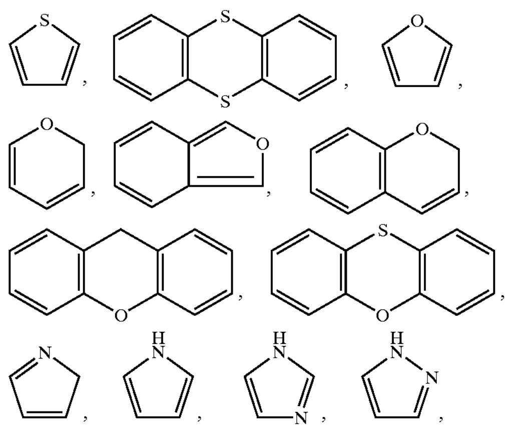

-continued

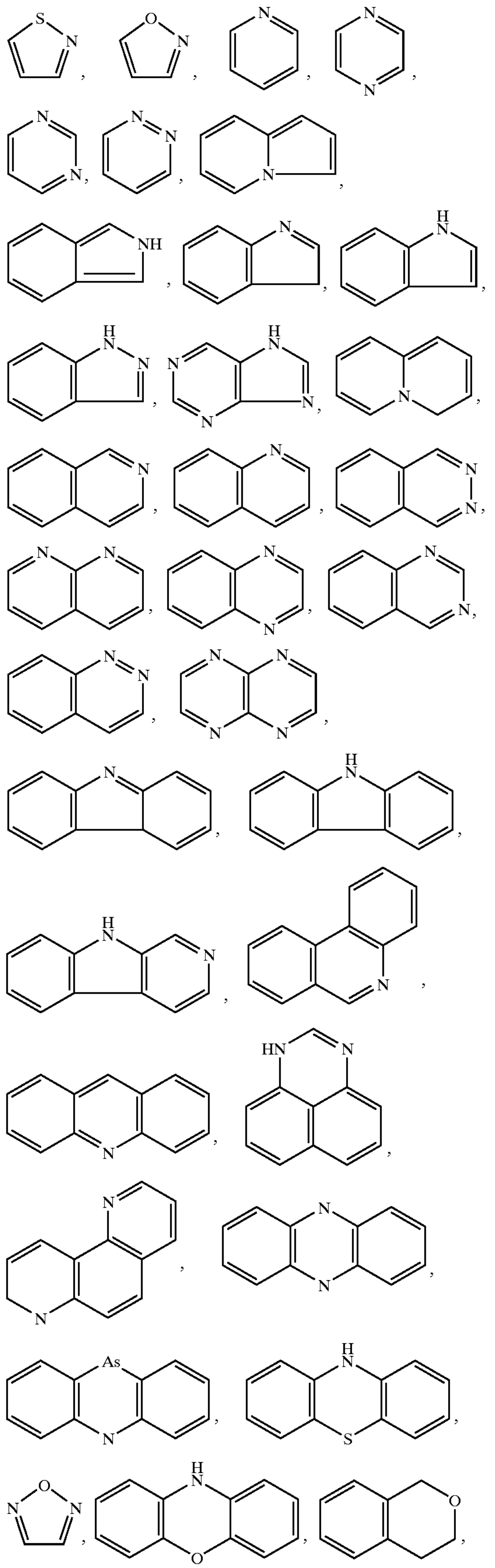

-continued

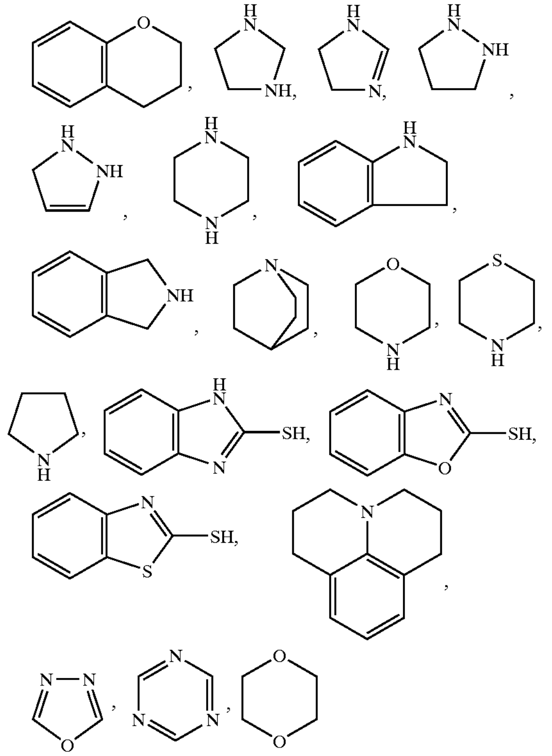

In the substituted oxy group ($R^5O$—) described above, $R^5$ represents a monovalent non-metallic atomic group excusive of a hydrogen atom. Preferred examples of the substituted oxy group include an alkoxy group, an aryloxy group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, a phosphonoxy group and a phosphonatoxy group. The alkyl group and aryl group in the above-described substituted oxy group include those described for the alkyl group, substituted alkyl group, aryl group and substituted aryl group above. In an acyl group ($R^6CO$—) in the acyloxy group described above, $R^6$ represents the alkyl group, substituted alkyl group, aryl group and substituted aryl group described above. Of the substituted oxy groups, an alkoxy group, an aryloxy group, an acyloxy group and an arylsulfoxy group are more preferred. Specific preferred examples of the substituted oxy group include methoxy, ethoxy, propyloxy, isopropyloxy, butyloxy, pentyloxy, hexyloxy, dodecyloxy, benzyloxy, allyloxy, phenethyloxy, carboxyethyloxy, methoxycarbonylethyloxy, ethoxycarbonylethyloxy, methoxyethoxy, phenoxyethoxy, methoxyethoxyethoxy, ethoxyethoxyethoxy, morpholinoethoxy, morpholinopropyloxy, allyloxyethoxyethoxy, phenoxy, tolyloxy, xylyloxy, mesityloxy, cumenyloxy, methoxyphenyloxy, ethoxyphenyloxy, chlorophenyloxy, bromophenyloxy, acetyloxy, benzoyloxy, naphthyloxy, phenylsulfonyloxy, phosphonoxy and phosphonatoxy groups.

In the substituted thio group ($R^7S$—) described above, $R^7$ represents a monovalent non-metallic atomic group excusive of a hydrogen atom. Preferred examples of the substituted thio group include an alkylthio group, an arylthio group, an alkyldithio group, an aryldithio group and an acylthio group. The alkyl group and aryl group in the above-described substituted thio group include those described for the alkyl group, substituted alkyl group, aryl group and substituted aryl group above. In an acyl group ($R^6CO$—) in the acylthio group described above, $R^6$ has the same meaning as described above. Of the substituted thio groups, an alkylthio group and an arylthio group are more preferred. Specific preferred examples of the substituted thio group include methylthio, ethylthio, phenylthio, ethoxyethylthio, carboxyethylthio and methoxycarbonylthio groups.

In the substituted amino group ($R^8NH$— or $(R^9)(R^{10})N$—) described above, $R^8$, $R^9$ and $R^{10}$ each represents a monovalent non-metallic atomic group excusive of a hydrogen atom. Preferred examples of the substituted amino group include an N-alkylamino group, an N,N-dialkylamino group, an N-arylamino group, an N,N-diarylamino group, an N-alkyl-N-arylamino group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group an aryloxycarbonylamino group, an N-alkyl-N-alkoxycarbonylamino group, an N-alkyl-N-aryloxycarbonylamino group, an N-aryl-N-alkoxycarbonylamino group and an N-aryl-N-aryloxycarbonylamino group. The alkyl group and aryl group in the above-described substituted amino group include those described for the alkyl group, substituted alkyl group, aryl group and substituted aryl group above. In an acyl group ($R^6CO$—) in the acylamino group, N-alkylacylamino group or N-arylacylamino group described above, $R^6$ has the same meaning as described above. Of the substituted amino groups, an N-alkylamino group, an N,N-dialkylamino group, an N-arylamino group and an acylamino group are more preferred. Specific preferred examples of the substituted amino group include methylamino, ethylamino, diethylamino, morpholino, piperidino, pyrrolidino, phenylamino, benzoylamino and acetylamino groups.

In the substituted carbonyl group ($R^{11}$—CO—) described above, $R^{11}$ represents a monovalent non-metallic atomic group excusive of a hydrogen atom. Preferred examples of the substituted carbonyl group include an acyl group, a carboxy group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group and an N-alkyl-N-arylcarbamoyl group. The alkyl group and aryl group in the above-described substituted carbonyl group include those described for the alkyl group, substituted alkyl group, aryl group and substituted aryl group above. Of the substituted carbonyl groups, an acyl group, a carboxy group, an alkoxycarbonyl group, an aryloxycarbonyl group, a carbamoyl group, an N-alkylcarbamoyl group, an N,N-dialkylcarbamoyl group and an N-arylcarbamoyl group are more preferred, and an acyl group, an alkoxycarbonyl group and an aryloxycarbonyl group are still more preferred. Specific preferred examples of the substituted carbonyl group include formyl, acetyl, benzoyl, carboxy, methoxycarbonyl, allyloxycarbonyl, N-methylcarbamoyl, N-phenylcarbamoyl, N,N-diethylcarbamoyl and morpholinocarbonyl groups.

In the substituted sulfinyl group ($R^{12}$—SO—) described above, $R^{12}$ represents a monovalent non-metallic atomic group excusive of a hydrogen atom. Preferred examples of the substituted sulfinyl group include an alkylsulfinyl group, an arylsulfinyl group, a sulfinamoyl group, an N-alkyl sulfinamoyl group, an N,N-dialkylsulfinamoyl group, an N-arylsulfinamoyl group, an N,N-diarylsulfinamoyl group and an N-alkyl-N-arylsulfinamoyl group. The alkyl group and aryl group in the above-described substituted sulfinyl group include those described for the alkyl group, substituted alkyl group, aryl group and substituted aryl group above. Of the substituted sulfinyl groups, an alkylsulfinyl group and an arylsulfinyl group are more preferred. Specific examples of the substituted sulfinyl group include hexylsulfinyl, benzylsulfinyl and tolylsulfinyl groups.

In the substituted sulfonyl group ($R^{13}$—$SO_2$—) described above, $R^{13}$ represents a monovalent non-metallic atomic group excusive of a hydrogen atom. Preferred examples of the substituted sulfonyl group include an alkylsulfonyl group and an arylsulfonyl group. The alkyl group and aryl group in the above-described substituted sulfonyl group include those described for the alkyl group, substituted alkyl group, aryl group and substituted aryl group above. Specific examples of the substituted sulfonyl group include butylsulfonyl and chlorophenylsulfonyl groups.

The sulfonato group (—$SO_3^-$) described above means a conjugate base anion group of a sulfo group (—$SO_3H$) as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

The carboxylato group (—$CO_2^-$) described above means a conjugate base anion group of a carboxy group (—$CO_2H$) as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

The substituted phosphono group described above means a group formed by substituting one or two hydroxy groups of a phosphono group with one or two other organic oxy groups. Preferred examples of the substituted phosphono group include a dialkylphosphono group, a diarylphosphono group, an alkylarylphosphono group, a monoalkylphosphono group and a monoarylphosphono group as described above. Of the substituted phosphono groups, a dialkylphosphono group and a diarylphosphono group are more preferred. Specific examples of the substituted phosphono group include diethylphosphono, dibutylphosphono and diphenylphosphono groups.

The phosphonato group (—$PO_3^{2-}$ or —$PO_3H^-$) described above means a conjugate base anion group of a phosphono group (—$PO_3H_2$) resulting from primary acid dissociation or secondary acid dissociation as described above. Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

The substituted phosphonato group described above means a conjugate base anion group of a group formed by substituting one hydroxy group of a phosphono group with another organic oxy group. Specific examples of the substituted phosphonato group include a conjugate base group of a monoalkylphosphono group (—$PO_3H$(alkyl)) and a conjugate base group of a monoarylphosphono group (—$PO_3H$(aryl)). Ordinarily, it is preferred to use together with a counter cation. Examples of the counter cation include those conventionally known, for example, various oniums (e.g., ammonium, sulfonium, phosphonium iodonium or azinium) and metal ions (e.g., $Na^+$, $K^+$, $Ca^{2+}$ or $Zn^{2+}$).

Now, the cyclic structure formed by combining $X^1$ and $X^2$, $R^a$ and $R^b$, or $X^1$ and $R^a$ or $R^b$ with each other is described below. An aliphatic ring formed by combining $X^1$ and $X^2$, $R^a$ and $R^b$, or $X^1$ and $R^a$ or $R^b$ with each other includes a 5-membered, 6-membered, 7-membered and 8-membered aliphatic rings, and preferably a 5-membered and 6-membered aliphatic rings. The aliphatic ring may have one or more substituents (examples thereof include the substituents for the substituted alkyl group described above) on one or more carbon atoms forming the ring. Also, a part of the ring-forming carbon atoms may be replaced by hetero atom(s) (examples thereof include an oxygen atom, a sulfur atom and a nitrogen atom). Further, a part of the aliphatic ring may also form a part of an aromatic ring.

Specific examples of the compound having a structure represented by formula (I) are set forth below, but the present invention should not be construed as being limited thereto.

TABLE 1 i) Monofunctional Type

Group A

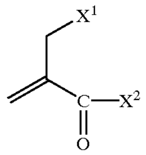

| No. | $X^1$ | $X^2$ |
|---|---|---|
| A-1 | OH | $OCH_3$ |
| A-2 | OH | $O(n)C_4H_9$ |
| A-3 | OH | $O(n)C_{12}H_{25}$ |

TABLE 1-continued
i) Monofunctional Type
Group A
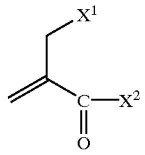
| No. | $X^1$ | $X^2$ |
|---|---|---|
| A-4 | OH | 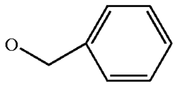 |
| A-5 | OH | 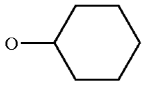 |
| A-6 | OH | 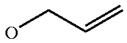 |
| A-7 | OH | 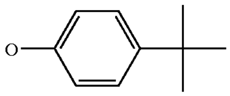 |
| A-8 | $OCH_3$ | $OC_2H_5$ |
| A-9 | 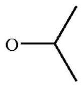 | $O(n)C_4H_9$ |
| A-10 | $O(n)C_8H_{17}$ | $OCH_3$ |
| A-11 | 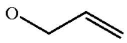 | 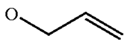 |
| A-12 | 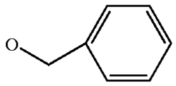 | $OCH_3$ |
| A-13 | 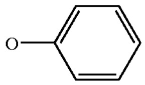 | $OCH_3$ |
| A-14 | 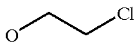 | $OCH_3$ |
| A-15 | 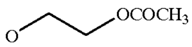 | $OC_2H_5$ |
| A-16 | 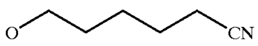 | $OC_2H_5$ |
| A-17 | $OCOCH_3$ | $OCH_3$ |
| A-18 | $OCO(n)C_8H_{13}$ | $OCH_3$ |
| A-19 | 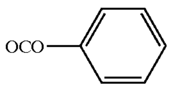 | $OCH_3$ |
| A-20 | $OSO_2CH_3$ | $OCH_3$ |
| A-21 | $OCO_2(n)C_4H_9$ | $OCH_3$ |
| A-22 | 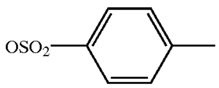 | $OCH_3$ |

TABLE 1-continued
i) Monofunctional Type
Group A
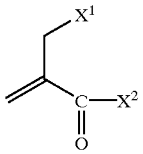
| No. | $X^1$ | $X^2$ |
|---|---|---|
| A-23 | $OSO_2CF_3$ | $OC_2H_5$ |
| A-24 | $SCH_3$ | $OC_2H_5$ |
| A-25 | $S(n)C_4H_9$ | $OC_2H_5$ |
| A-26 | 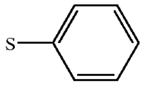 | $OC_2H_5$ |
| A-27 | 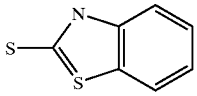 | $OCH_3$ |
| A-28 | 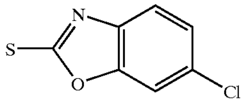 | $OCH_3$ |
| A-29 | F | $O(n)C_{12}H_{25}$ |
| A-30 | F | 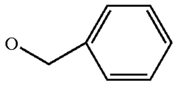 |
| A-31 | Cl | $OCH_3$ |
| A-32 | Cl | 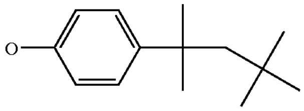 |
| A-33 | Br | $O(n)C_4H_9$ |
| A-34 | Br | 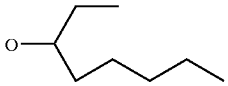 |
| A-35 | I | $O(n)C_4H_9$ |
| A-36 | I | 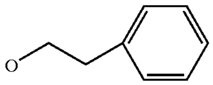 |
| A-37 | 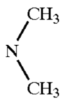 | $OC_2H_5$ |
| A-38 | 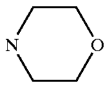 | $OC_2H_5$ |
| A-39 | 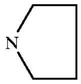 | $OC_2H_5$ |

TABLE 1-continued
i) Monofunctional Type
Group A
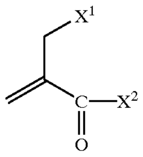
| No. | $X^1$ | $X^2$ |
| --- | --- | --- |
| A-40 | 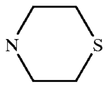 | $OC_2H_5$ |
| A-41 | 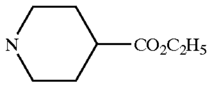 | $OC_2H_5$ |
| A-42 | 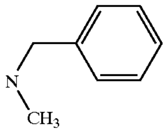 | $OC_2H_5$ |
| A-43 | 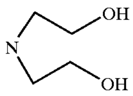 | $OC_2H_5$ |
| A-44 | 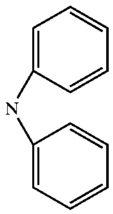 | $OC_2H_5$ |
| A-45 | 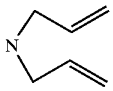 | $OC_2H_5$ |
| A-46 | $NHCOCH_3$ | $OCH_3$ |
| A-47 | $NHCO(n)C_4H_9$ | $O(n)C_4H_9$ |
| A-48 | 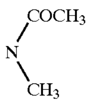 | $OCH_3$ |
| A-49 | $NHSO_2CH_3$ | $O(n)C_4H_9$ |
| A-50 | 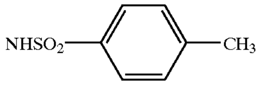 | $O(n)C_4H_9$ |
| A-51 | $OCOCH_3$ | 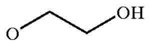 |
| A-52 | $OCOCH_3$ | 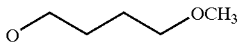 |
| A-53 | $OCOCH_3$ | 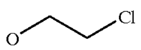 |

TABLE 1-continued
i) Monofunctional Type
Group A
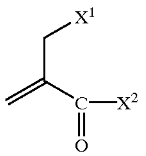
| No. | $X^1$ | $X^2$ |
|---|---|---|
| A-54 | $OCOCH_3$ | 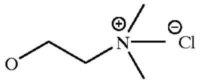 |
| A-55 | $OCOCH_3$ | 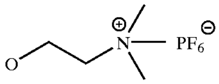 |
| A-56 | $OCOC_2H_5$ | 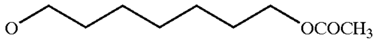 |
| A-57 | $OCOC_2H_5$ | 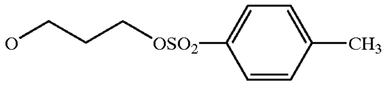 |
| A-58 | $OCOC_2H_5$ | 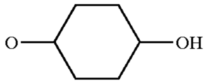 |
| A-60 | 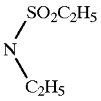 | $OCH_3$ |
| A-70 | $OCOCH_3$ | 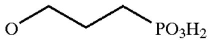 |
| A-71 | $OCOCH_3$ | 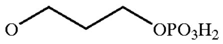 |
| A-72 | $OCOCH_3$ | 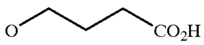 |
| A-73 | 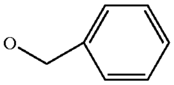 | OH |
| A-74 | 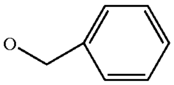 | $O^{\ominus}Na^{\oplus}$ |
| A-75 | 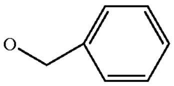 | 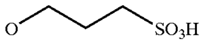 |
| A-76 | 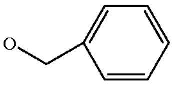 | 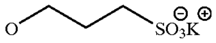 |
| A-77 |  | 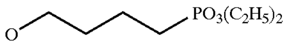 |
| A-78 | 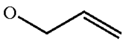 | 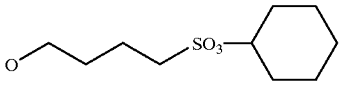 |

TABLE 1-continued
i) Monofunctional Type
Group A
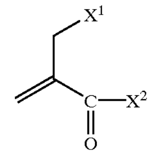
| No. | $X^1$ | $X^2$ |
|---|---|---|
| A-79 | OH | $OC_2H_5$ |
| A-80 | 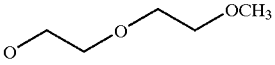 | $OCH_3$ |
| A-81 | 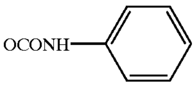 | $OCH_3$ |
| A-82 | 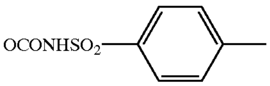 | $OCH_3$ |
| A-83 | 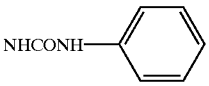 | $OCH_3$ |
| A-84 | $NHCO_2(n)C_6H_{13}$ | $OCH_3$ |
| A-85 | $OCSNH(n)C_4H_9$ | $OCH_3$ |
TABLE 2
| Group B | |
|---|---|
| B-1 | 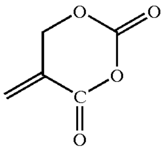 |
| B-2 | 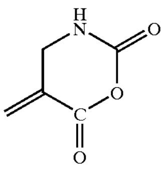 |
TABLE 2-continued
| Group B | |
|---|---|
| B-3 | 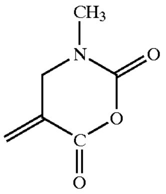 |
| B-4 | 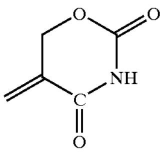 |

TABLE 2-continued
| Group B | |
|---|---|
| B-5 | 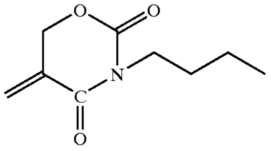 |
| B-6 | 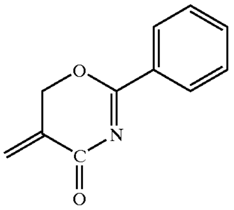 |
| B-7 | 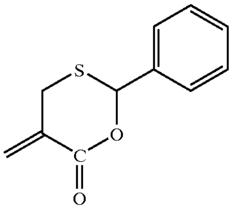 |
| B-8 | 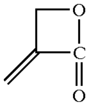 |
| B-9 | 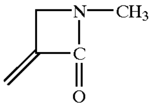 |
TABLE 3
ii) Difunctional Type
Group C
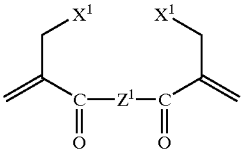
| No. | $X^1$ | $Z^1$ |
|---|---|---|
| C-1 | OH | 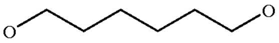 |
| C-2 | OH | 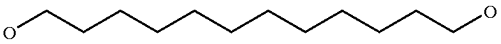 |
| C-3 | $OCOCH_3$ | 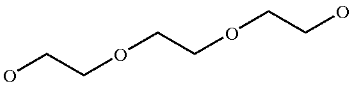 |
| C-4 | $OCOCH_3$ | 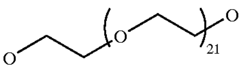 (average number) |
| C-5 | OH | 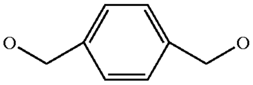 |
| C-6 | OH | 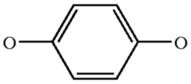 |
| C-7 | OH | 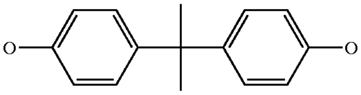 |
| C-8 | OH | 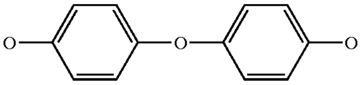 |

TABLE 3-continued
ii) Difunctional Type
Group C
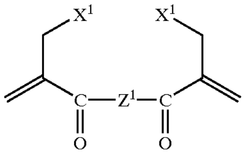
| No. | $X^1$ | $Z^1$ |
|---|---|---|
| C-9 | $OCH_3$ | 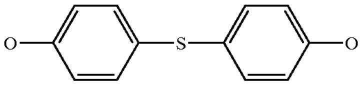 |
| C-10 | 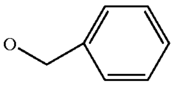 | 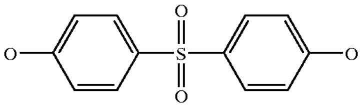 |
| C-11 | $OCOC_2H_5$ | 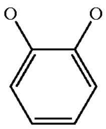 |
| C-12 | $OCOC_2H_5$ | 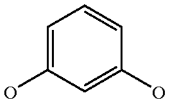 |
| C-13 | OH | 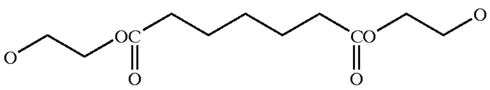 |
| C-14 | $OCOCH_3$ | 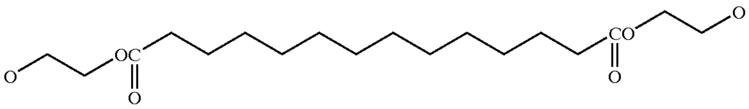 |
| C-15 | 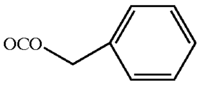 | 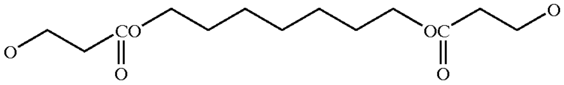 |
| C-16 | OH | 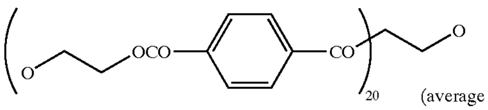 (average number) |
| C-17 | OH | 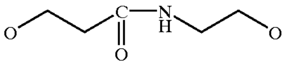 |
| C-18 | OH | 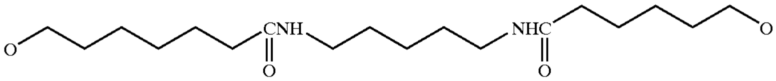 |
| C-19 | $OCOCH_3$ | 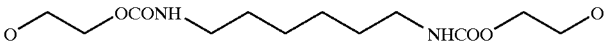 |
| C-20 | $OCOCH_3$ | 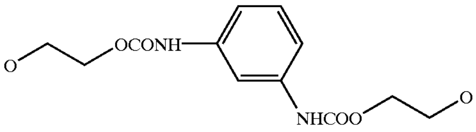 |

TABLE 3-continued
ii) Difunctional Type
Group C
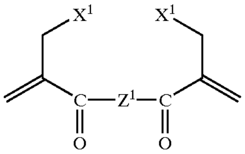
| No. | $X^1$ | $Z^1$ |
|---|---|---|
| C-21 | OCO(n)Pr | 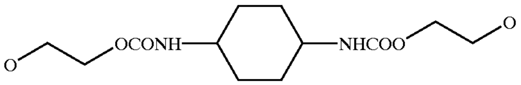 |
| C-22 | OCO(n)Pr | 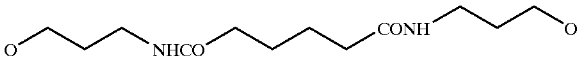 |
| C-23 | 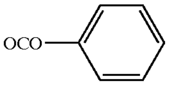 | 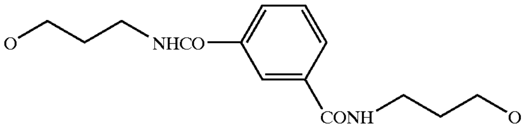 |
| C-24 | $SCH_3$ | 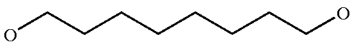 |
| C-25 | 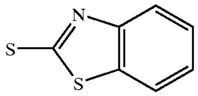 | 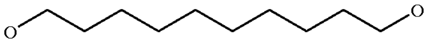 |
| C-26 | $SCOCH_3$ | 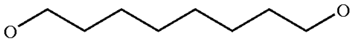 |
| C-27 | $OSO_2CH_3$ | 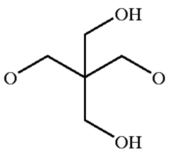 |
| C-28 | 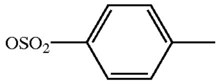 | 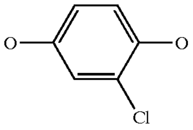 |
| C-29 | 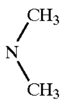 | 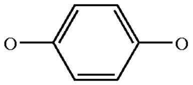 |
| C-30 | 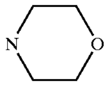 | 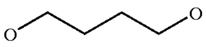 |
| C-31 | 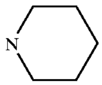 | 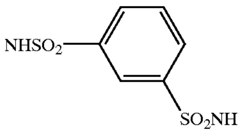 |
| C-32 | F | 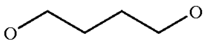 |

TABLE 3-continued
ii) Difunctional Type
Group C
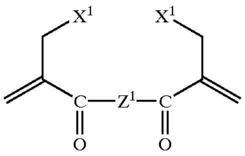
| No. | $X^1$ | $Z^1$ |
|---|---|---|
| C-33 | $NHCOCH_3$ | 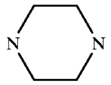 |
| C-34 | 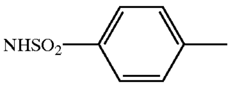 | 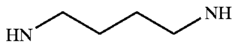 |
| C-35 | 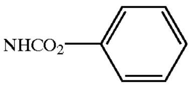 | 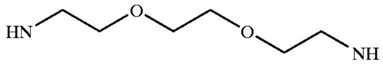 |
TABLE 4
Group D
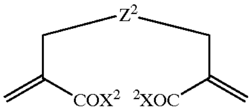
| No. | $X^2$ | $Z^2$ |
|---|---|---|
| D-1 | $OCH_3$ | 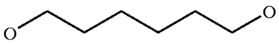 |
| D-2 | $OCH_3$ | 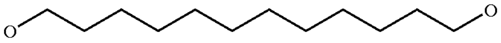 |
| D-3 | $OC_2H_5$ | 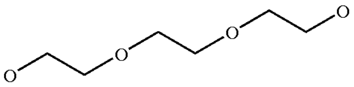 |
| D-4 | $OC_2H_5$ | 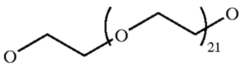 (average number) |
| D-5 | 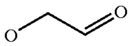 | 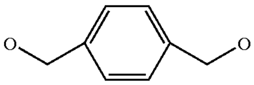 |
| D-6 | 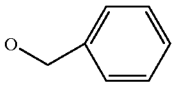 | 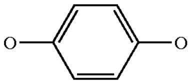 |
| D-7 | $OCH_3$ | 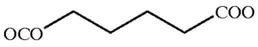 |
| D-8 | $OCH_3$ | 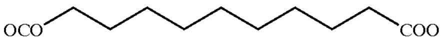 |
| D-9 | $O(n)C_4H_9$ | 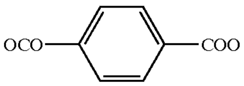 |

TABLE 4-continued
Group D
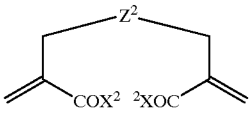
| No. | $X^2$ | $Z^2$ |
|---|---|---|
| D-10 | $O(n)C_4H_9$ | 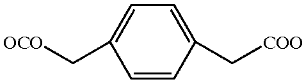 |
| D-11 | 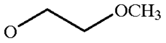 | 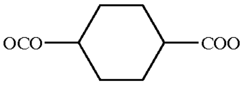 |
| D-12 | 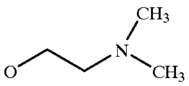 | 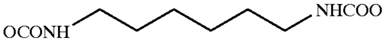 |
| D-13 | $OCH_3$ | 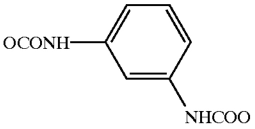 |
| D-14 | $OCH_3$ | 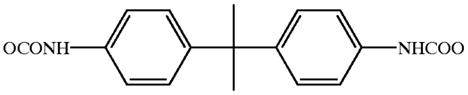 |
| D-15 | $OCH_3$ | 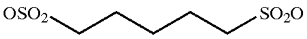 |
| D-16 | $O(n)C_{12}H_{25}$ | 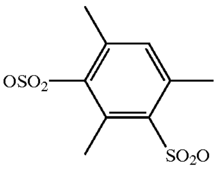 |
| D-17 | $OCH_3$ | 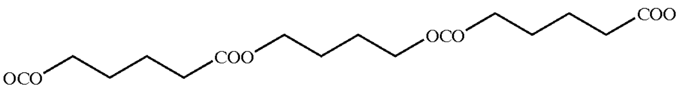 |
| D-18 | $OCH_3$ | 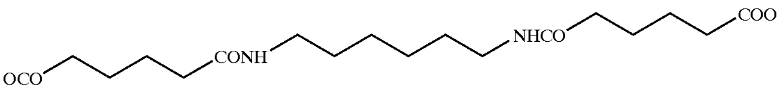 |
| D-19 | $OCH_3$ | 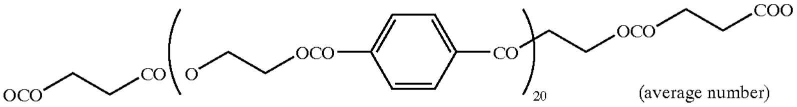 (average number) |
| D-20 | $OC_2H_5$ | 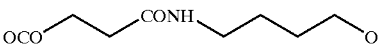 |
| D-21 | $OCH_3$ | 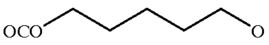 |
| D-22 | $SCH_3$ | 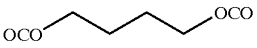 |
| D-23 | 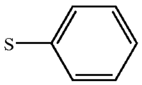 | 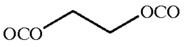 |

TABLE 4-continued
Group D
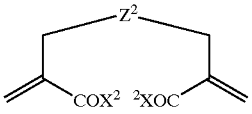
| No. | $X^2$ | $Z^2$ |
|---|---|---|
| D-24 | 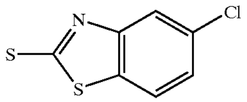 | 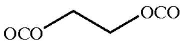 |
| D-25 | 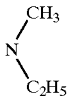 |  |
| D-26 | 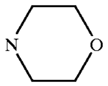 | 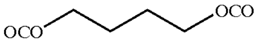 |
| D-27 | $NH(n)C_{12}H_{25}$ | 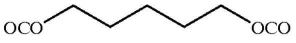 |
| D-28 | $OCH_3$ | 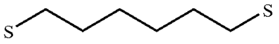 |
| D-29 | 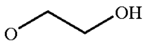 | 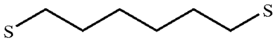 |
| D-30 | 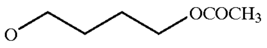 | 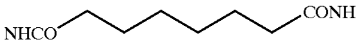 |
| D-31 | $OCH_3$ | 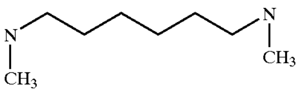 |
| D-32 | $OCH_3$ | 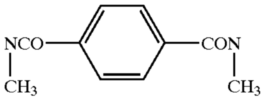 |
| D-33 | $OCH_3$ | 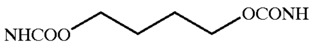 |
| D-34 | $OCH_3$ | 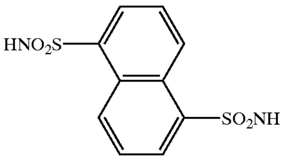 |
| D-35 | $OC_2H_5$ | O |

TABLE 5
iii) Trifunctional or More Type
Group E
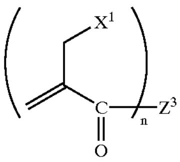 (n ≧ 3)
| No. | $X^1$ | $Z^3$ |
|---|---|---|
| E-1 | OH | 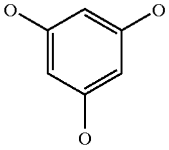 |
| E-2 | $OCH_3$ | 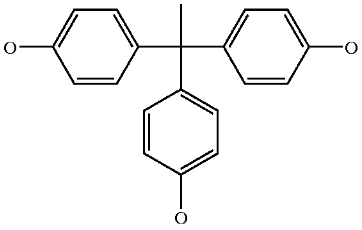 |
| E-3 | $OCOCH_3$ | 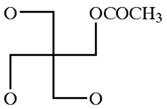 |
| E-4 | OH | 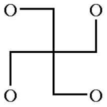 |
| E-5 | $OCOCH_3$ | 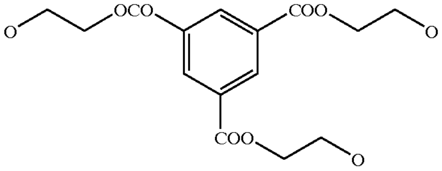 |
| E-6 | 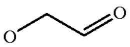 | 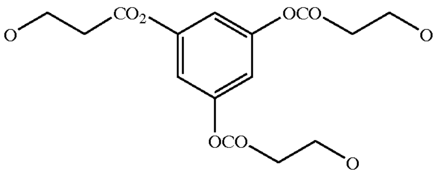 |
| E-7 | OH | 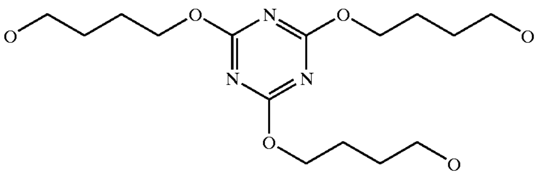 |

TABLE 5-continued
iii) Trifunctional or More Type
Group E
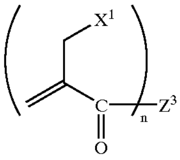
(n ≧ 3)
| No. | $X^1$ | $Z^3$ |
|---|---|---|
| E-8 | OH | 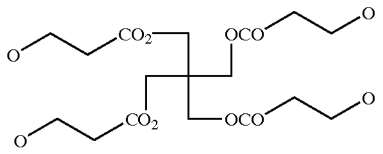 |
| E-9 | OH | 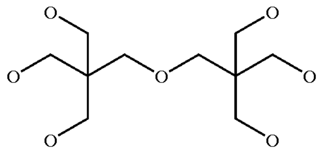 |
| E-10 | $OCOCH_3$ | 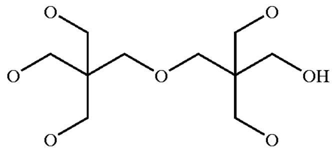 |
| E-11 | $SCH_3$ | 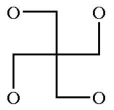 |
| E-12 | Cl | 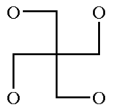 |
| E-13 | Br | 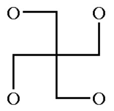 |
| E-14 | 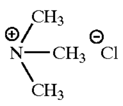 | 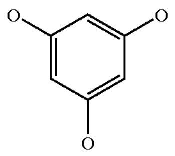 |
| E-15 | 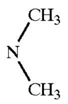 | 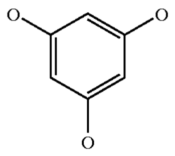 |
| E-16 | 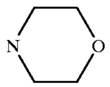 | 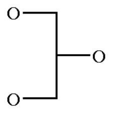 |

TABLE 5-continued
iii) Trifunctional or More Type
Group E
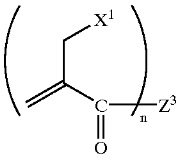
(n ≧ 3)
| No. | $X^1$ | $Z^3$ |
| --- | --- | --- |
| E-17 | $OCO(n)C_{12}H_{25}$ | 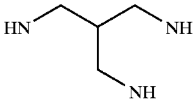 |
| E-18 | 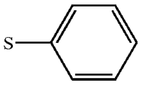 | 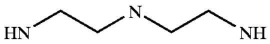 |
| E-19 | 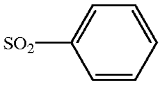 | 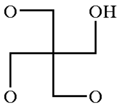 |
| E-20 | 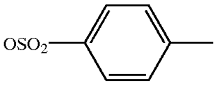 | 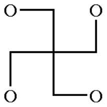 |
| E-21 | $NHCOCH_3$ | 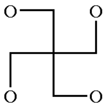 |
| E-22 | 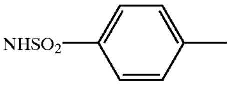 | 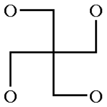 |
| E-23 | 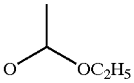 | 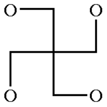 |
| E-24 | 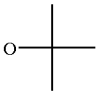 | 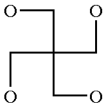 |
| E-25 | OH | 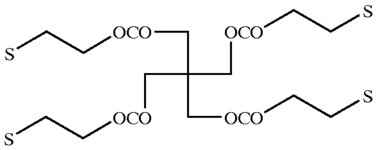 |
| E-26 | OH | 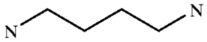 |

TABLE 6
Group F
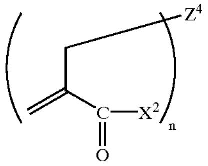
(n ≧ 3)
| No. | $X^2$ | $Z^4$ |
| --- | --- | --- |
| F-1 | OH | 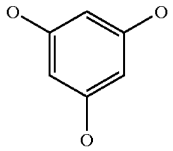 |
| F-2 | $OCH_3$ | 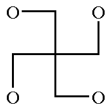 |
| F-3 | $OCH_3$ | 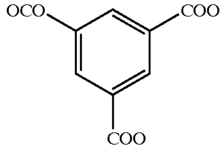 |
| F-4 | $OCH_3$ | 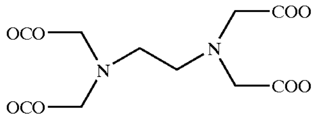 |
| F-5 | $OC_2H_5$ | 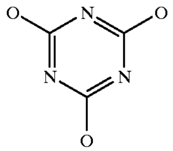 |
| F-6 | $OCH_3$ | 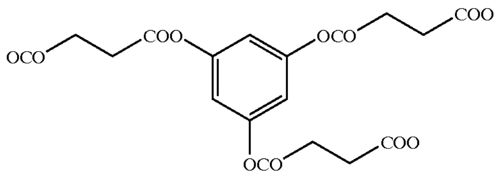 |
| F-7 | $OCH_3$ | 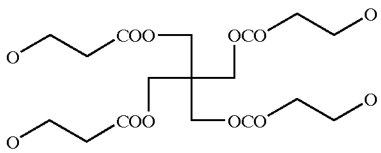 |
| F-8 | $O(n)C_3H_7$ | 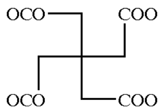 |

TABLE 6-continued
Group F
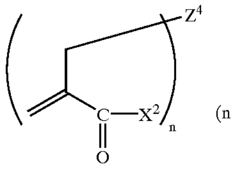
(n ≧ 3)
| No. | $X^2$ | $Z^4$ |
|---|---|---|
| F-9 | 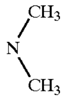 | 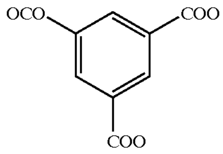 |
| F-10 | $O(n)C_{12}H_{25}$ | 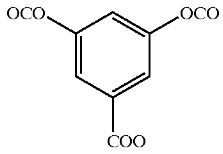 |
| F-11 | 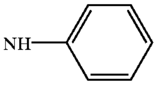 | 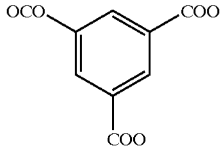 |
| F-12 | NH—$(n)C_4H_9$ | 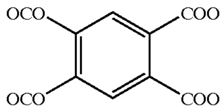 |
| F-13 | Cl | 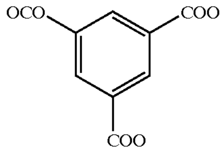 |
| F-14 | $O^{\ominus}Na^{\oplus}$ | 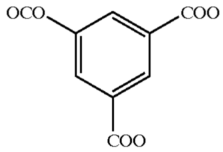 |
| F-15 | 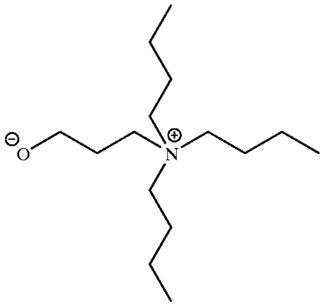 | 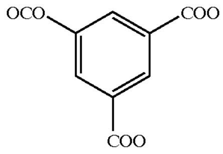 |

TABLE 6-continued
Group F
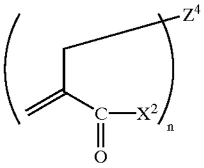
(n ≧ 3)
| No. | $X^2$ | $Z^4$ |
| --- | --- | --- |
| F-16 | $OCH_3$ | 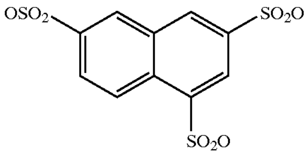 |
| F-17 | $OCH_3$ | 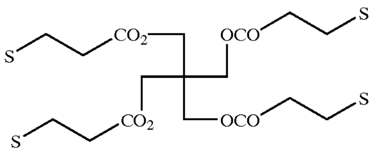 |
| F-18 | $OCH_3$ | 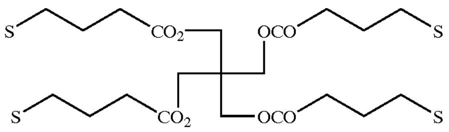 |
| F-19 | 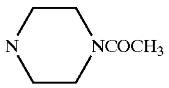 | 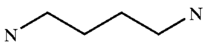 |
| F-20 | 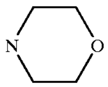 | 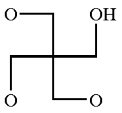 |
| F-21 | $OCH_3$ | 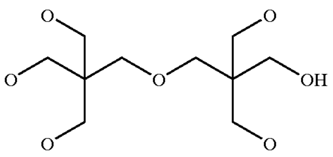 |
| F-22 | 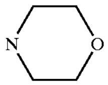 | 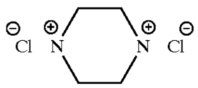 |

TABLE 7
| iv) Polymer Type<br>Group G | | |
|---|---|---|
| G-1 | 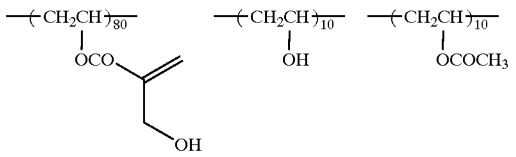 | Mw 20000 |
| G-2 | 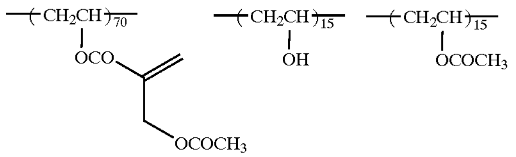 | Mw 15000 |
| G-3 | 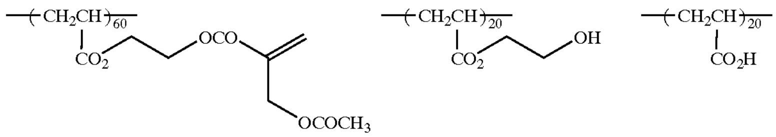 | Mw 30000 |
| G-4 | 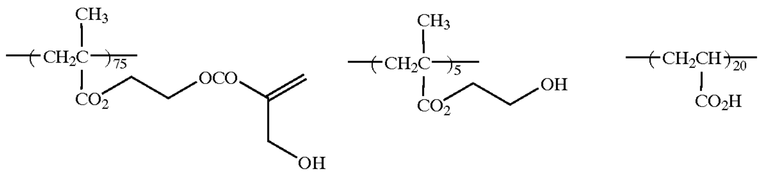 | Mw 50000 |
| G-5 | 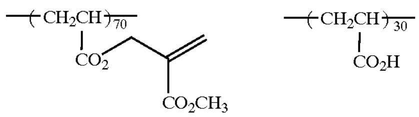 | Mw 20000 |
| G-6 | 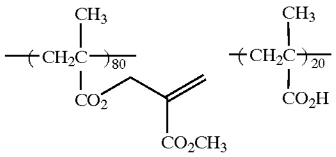 | Mw 10000 |
| G-7 | 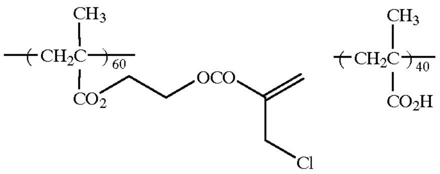 | Mw 20000 |
| G-8 | 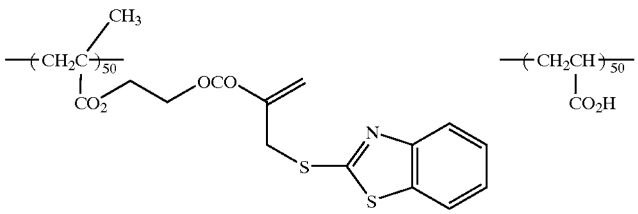 | Mw 20000 |

TABLE 7-continued
iv) Polymer Type
Group G
G-9
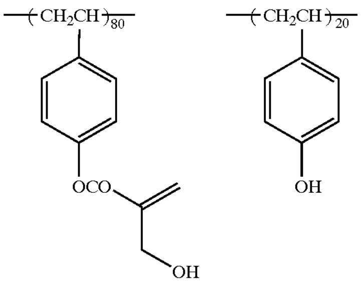
Mw 5000
G-10
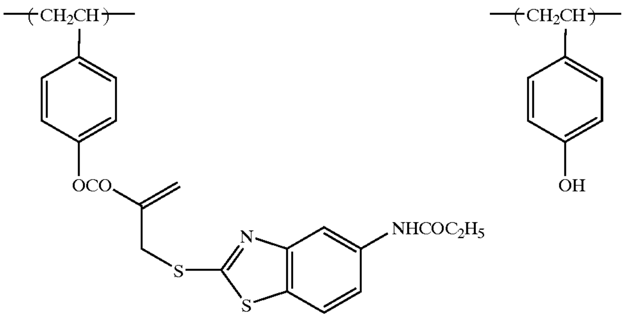
Mw 10000
G-11
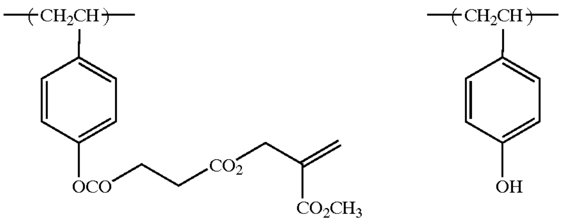
Mw 10000
G-12
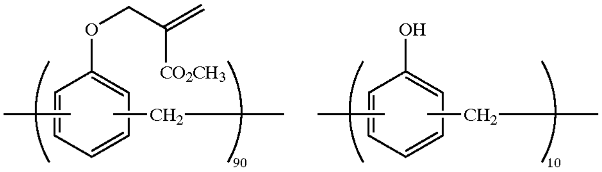
Mw 5000
G-13
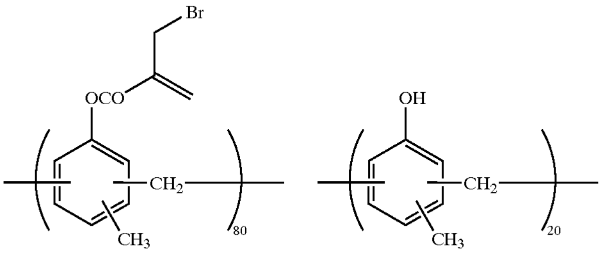
Mw 7500
(m/p = 6/4) (m/p = 6/4)

TABLE 7-continued
| iv) Polymer Type<br>Group G | | |
|---|---|---|
| G-14 | 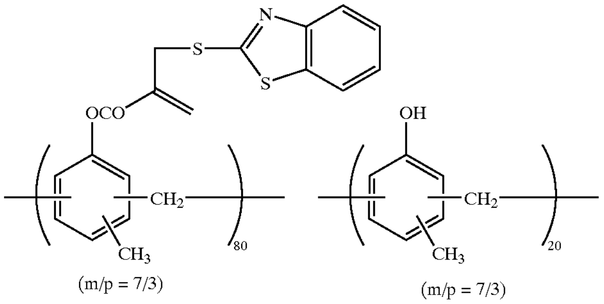 | Mw 4000 |
| G-15 | 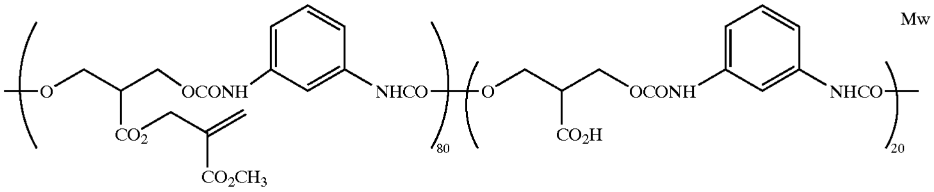 | Mw 10000 |
| G-16 | 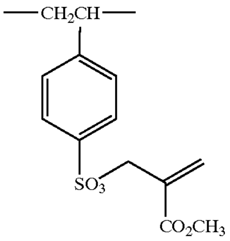 | Mw 100000 |
| G-17 | 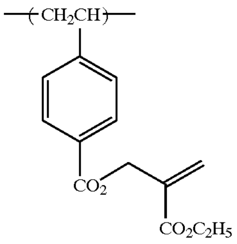 | Mw 15000 |
| G-18 | 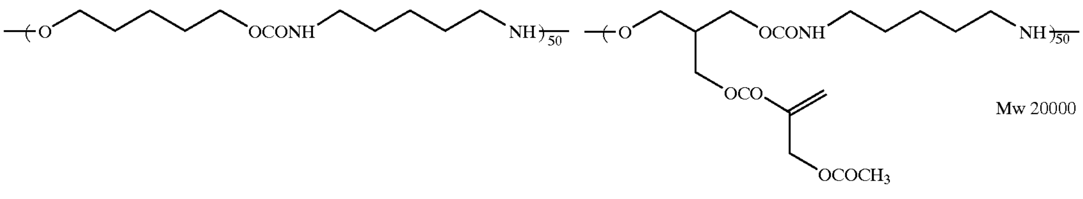 | Mw 20000 |
| G-19 | 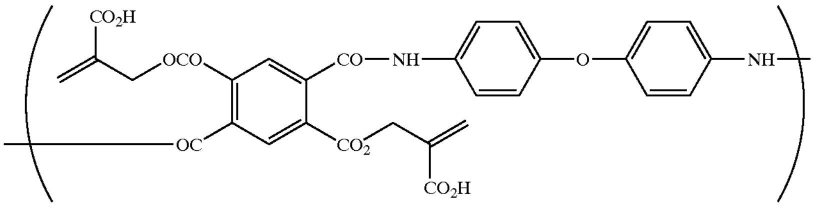 | Mw 15000 |

TABLE 7-continued
iv) Polymer Type
Group G
G-20 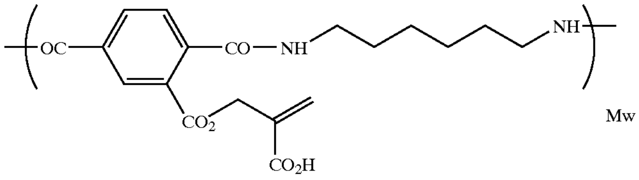 Mw 5000
G-21 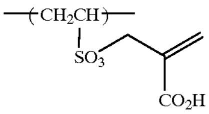 Mw 20000
G-22 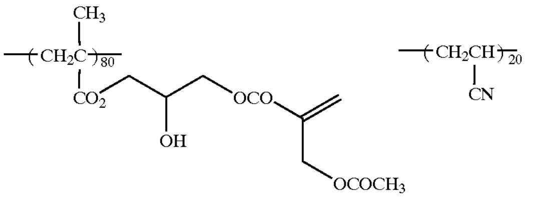 Mw 30000
G-23 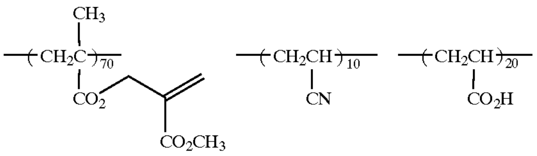 Mw 30000
G-24 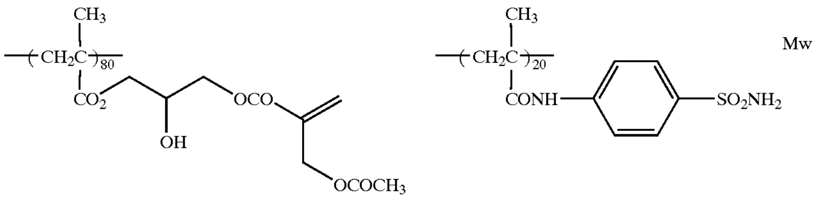 Mw 20000
G-25 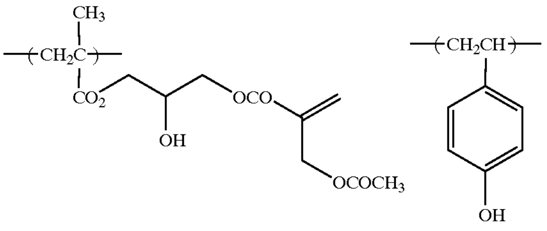 Mw 15000
G-26 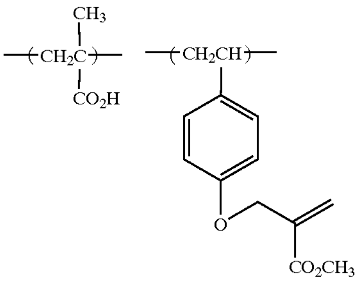 Mw 10000

TABLE 8
| v) Others<br>Group H | |
|---|---|
| H-1 | 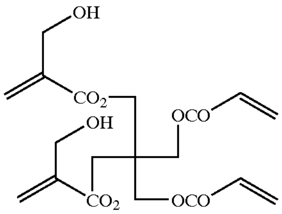 |
| H-2 | 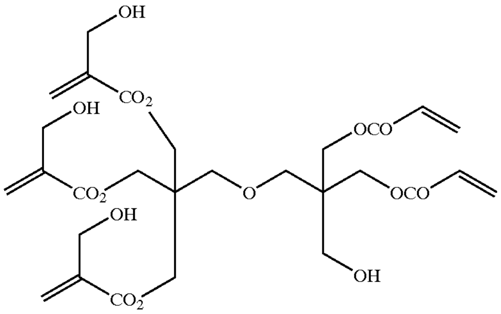 |
| H-3 | 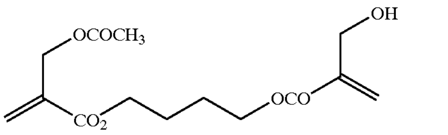 |
| H-4 | 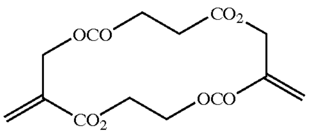 |
| H-5 | 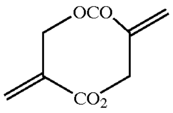 |
| H-6 | 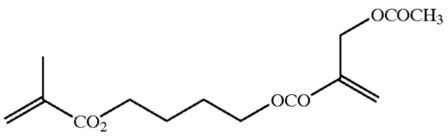 |
| H-7 | 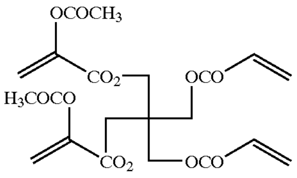 |
TABLE 9
| Group J | |
|---|---|
| J-1 | 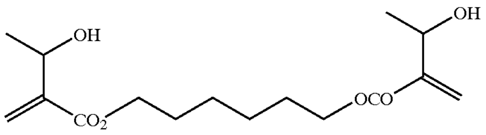 |
| J-2 | 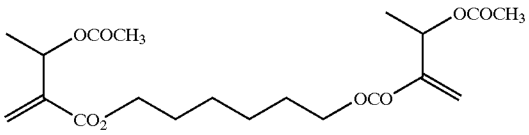 |
| J-3 | 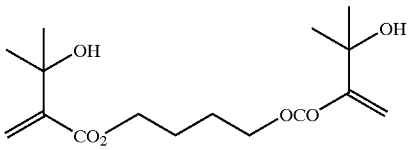 |
| J-4 | 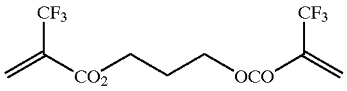 |
| J-5 | 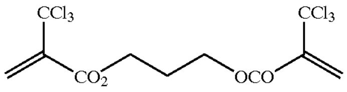 |
| J-6 | 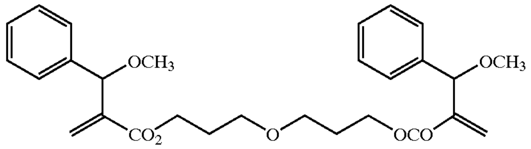 |
| J-7 | 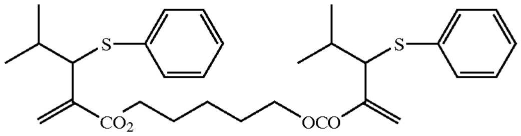 |
| J-8 | 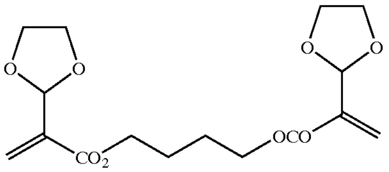 |
| J-9 | 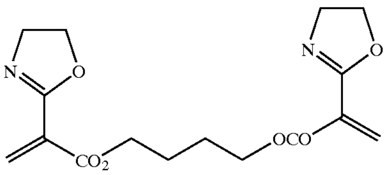 |
| J-10 | 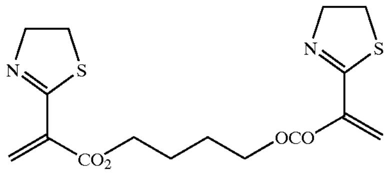 |

TABLE 9-continued

| Group J | |
|---|---|
| J-11 | 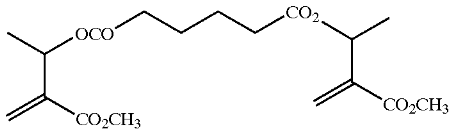 |
| J-12 | 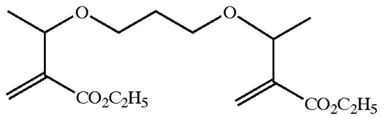 |
| J-13 | 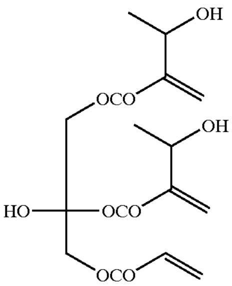 |
| J-14 | 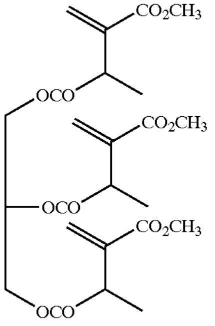 |
| J-15 | 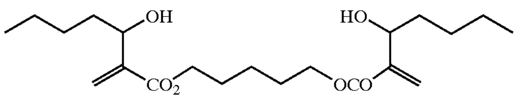 |

Of the compounds according to the present invention, multifunctional type compounds having two or more structures represented by formula (I) in molecules thereof (difunctional or more type and polymer type) and compounds which have both a structure represented by formula (I) and another radical polymerizable group in molecules thereof and substantially act as polyfunctional compounds in photopolymerization are particularly preferred.

The compounds having a structure represented by formula (I) are used individually or as a mixture of two or more thereof, or as a mixture of the compound together with a conventionally known compound having an addition polymerizable ethylenically unsaturated bond, as a compound having an addition polymerizable ethylenically unsaturated bond, in the image-forming according to the present invention.

The conventionally known compound having an addition polymerizable ethylenically unsaturated bond includes, for example, an ester of an unsaturated carboxylic acid (e.g., acrylic acid, methacrylic acid, itaconic acid, crotonic acid, isocrotonic acid or maleic acid) with an aliphatic polyhydric alcohol compound, and an amide of the above-described unsaturated carboxylic acid with an aliphatic polyvalent amine compound.

Specific examples of monomers, which are the esters of aliphatic polyhydric alcohol compounds with the unsaturated carboxylic acids, include an acrylic acid ester, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, or a polyester acrylate oligomer; a methacrylic acid ester, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, or bis[p-(methacryloxyethoxy)phenyl]dimethylmethane; an itaconic acid ester, for example, ethylene glycol diitaconate, propylene glycol diitaconate, 1,3-butanediol diitaconate, 1,4-butanediol diitaconate, tetramethylene glycol diitaconate, pentaerythritol diitaconate, or sorbitol tetraitaconate; a crotonic acid ester,for example, ethylene glycol dicrotonate, tetramethylene glycol dicrotonate, pentaerythritol dicrotonate, or sorbitol tetracrotonate; an isocrotonic acid ester, for example, ethylene glycol diisocrotonate, pentaerythritol diisocrotonate, or sorbitol tetraisocrotonate; and a maleic acid ester, for example, ethylene glycol dimaleate, triethylene glycol dimaleate, pentaerythritol dimaleate, or sorbitol tetramaleate. A mixture of the ester monomers is also employed. Specific examples of the of monomers, which are the amides of aliphatic polyvalent amine compounds with the unsaturated carboxylic acids, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide, or xylylene bismethacrylamide.

Other examples of the monomers include vinylurethane compounds having at least two polymerizable vinyl groups per molecule obtained by adding a vinyl monomer containing a hydroxyl group represented by formula (A) shown below to a polyisocyanate compound having at least two isocyanate groups in a molecule thereof as described, for example, in JP-B-48-41708 (the term "JP-B" as used herein means an "examined Japanese patent publication").

$$CH_2{=}C(R)COOCH_2CH(R')OH \qquad (A)$$

wherein, R and R' each represents H or $CH_3$.

Also, urethane acrylates as described in JP-A-51-37193, polyester acrylates as described in JP-A-48-64183, JP-B-49-43191 and JP-B-52-30490, and polyfunctional acrylates and methacrylates such as epoxy acrylates obtained by reacting an epoxy resin with (meth)acrylic acid may be used. Further, photosetting monomers and oligomers as described in *Nippon Secchaku Kyokai-Shi*, Vol. 20, No. 7, pages 300 to 308 (1984) can be used. In the present invention, such a monomer may also be used in the chemical form of a prepolymer, for example, a dimer or a trimer, an oligomer, a mixture thereof, or a copolymer thereof.

An amount of the whole compound containing a polymerizable group including the compound having a structure represented by formula (I) used is ordinarily from 1 to 99.99%, preferably from 5 to 90.0%, and more preferably from 10 to 70%, based on the total weight of components in the image-forming layer.

A content of the compound having a structure represented by formula (I) in the whole compound containing a polymerizable group is from 0.005 to 100% by weight, preferably from 1 to 100% by weight, and more preferably from 30 to 100% by weight. When the content of the compound according to the present invention is less than 0.005% by weight, the effects of the present invention may not be obtained.

According to the present invention, the above-described compound having a radical polymerizable group is added to the image-forming layer as the fine particles containing the compound or the microcapsules encapsulating the compound.

The fine particles containing the compound having a radical polymerizable group are obtained, for example, by a solvent evaporation method wherein the compound having a radical polymerizable group individually or as a mixture of two or more thereof is dissolved in a water-insoluble organic solvent, the solution is mixed with an aqueous solution containing a dispersing agent followed by emulsification, and then the organic solvent is evaporated by heating to solidify into fine particles, although the present invention should not be construed as being limited to the method.

Also, in the present invention, the fine particles containing at least one of the components selected from the infrared absorbing dye and radical initiator together with the compound having a radical polymerizable group are suitably used. Such fine particles are obtained by dissolving the compound having a radical polymerizable group together with the infrared absorbing dye, the radical initiator, an organic solvent-soluble polymer, etc. in the organic solvent and conducting the solvent evaporation method.

In order to encapsulate the compound having a radical polymerizable group, a known method can be employed. For instance, methods for the production of microcapsules include a method utilizing a coacervation as described in U.S. Pat. Nos. 2,800,457 and 2,800,458, a method using an interfacial polymerization as described in British Patent 990,443, U.S. Pat. No. 3,287,154, JP-B-38-19574, JP-B-42-446 and JP-B-42-711, a method using deposition of a polymer as described in U.S. Pat. Nos. 3,418,250 and 3,660,304, a method using an isocyanate polyol wall material as described in U.S. Pat. No. 3,796,669, a method using an isocyanate wall material as described in U.S. Pat. No. 3,914,511, a method using a urea-formaldehyde or urea-formaldehyde-resorcinol wall material as described in U.S. Pat. Nos. 4,001,140, 4,087,376, and 4,089,802, a method using a wall material, for example, a melamine-formaldehyde resin or hydroxy cellulose as described in U.S. Pat. No. 4,025,445, an in situ method of a monomer polymerization as described in JP-B-36-9163 and JP-B-51-9079, a spray drying method as described in British Patent 930,422 and U.S. Pat. No. 3,111,407, and an electrolytic dispersion cooling method as described in British Patents 952,807 and 967,074. However, the production method of the microcapsules in the present invention should not be construe as being limited thereto.

The microcapsule wall preferably used in the present invention has a three dimensional crosslinkage and a property of being swelled with a solvent. From such a standpoint, polyurea, polyurethane, polyester, polycarbonate, polyamide, and a mixture thereof are preferred as the wall material of microcapsules. Particularly, polyurea and polyurethane are preferred.

In the production of microcapsules according to the present invention, a solvent capable of dissolving the contents and swelling the wall material of the microcapsules can be added to the dispersion medium. By means of the solvent, diffusion of the encapsulated compound(s) to the outside of the microcapsules is accelerated.

The solvent to be used may be varied depending on the dispersion medium of microcapsules, the material of microcapsule wall, the wall thickness, and the encapsulated compound(s). However, an appropriate solvent can be easily selected from many commercially available solvents. For instance, in case of water-dispersible microcapsules having crosslinked polyurea or polyurethane walls, a solvent, for example, an alcohol, an ether, an acetal, an ester, a ketone, a polyhydric alcohol, an amide, an amine or a fatty acid is preferably used.

Specific examples of the solvent include methanol, ethanol, tertiary butanol, n-propanol, tetrahydrofuran, methyl lactate, ethyl lactate, methyl ethyl ketone, propylene glycol monomethyl ether, ethylene glycol diethyl ether, ethylene glycol monomethyl ether, γ-butyrolactone, N,N-dimethylformamide and N,N-dimethylacetamide, but the present invention should not be construed as being limited thereto. The solvents may be used as a mixture of two or more thereof.

A solvent, which is insoluble in the dispersion medium of microcapsules but is dissolved therein by mixing with the above-described solvent, can also be used.

An amount of the solvent added is determined according to the combination of materials used. When the amount added is smaller than an appropriate value, the image formation becomes insufficient and on the other hand, when the amount added is larger than the appropriate value, stability of the dispersion is deteriorated. The amount of solvent added is ordinarily effective in the range of from 5 to 95% by weight, preferably from 10 to 90% by weight, and more preferably from 15 to 85% by weight of the dispersion.

An average particle size of the fine particles and microcapsules containing the compound having a radical polymerizable group described above is preferably from 0.01 to 3.0 μm, more preferably from 0.05 to 2.0 μm, and still more preferably from 0.08 to 1.0 μm. In the range of the average particle size, good resolution and good stability with the lapse of time are obtained.

An amount of the fine particles or microcapsules added is preferably at least 50% by weight, more preferably at least 60% by weight, based on a solid content of the image-forming layer. In the range of the amount added, not only good on-machine developing property but also good sensitivity and press life are obtained.

<Radical Initiator>

The radical initiator, which is used together with the radical polymerizable compound in the image-forming layer of the lithographic printing plate precursor according to the present invention, includes (a) an aromatic ketone, (b) an aromatic onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

Preferred examples of the aromatic ketone (a) include compounds having a benzophenone skeleton or a thioxantone skeleton as described in J. P. Fouassier and J. F. Rabek,

*Radiation Curing in Polymer Science and Technology*, pages 77 to 117 (1993), specifically, for example,
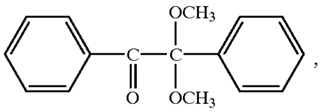
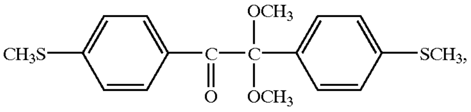
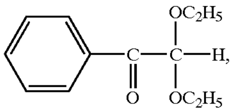
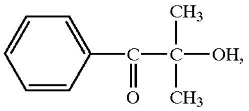
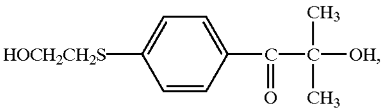
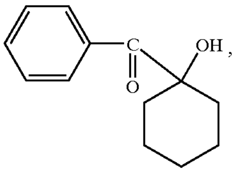
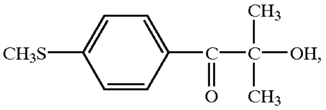
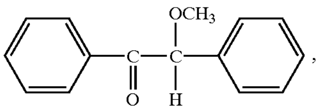
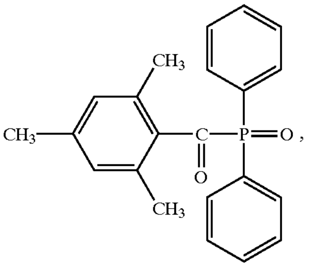
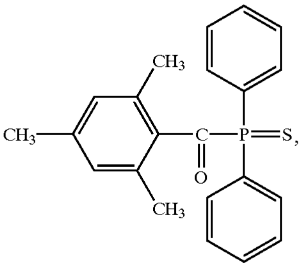
-continued
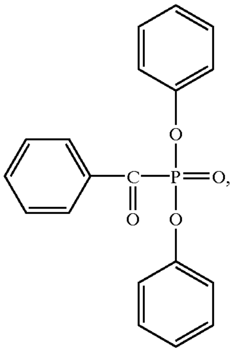
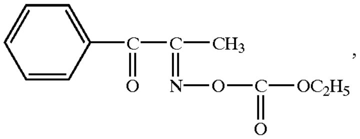
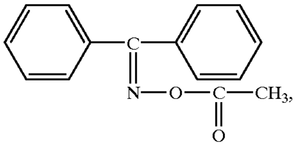
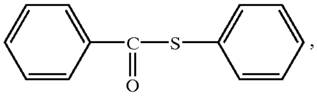
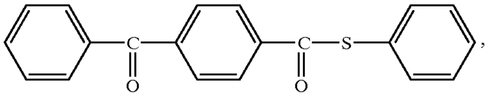
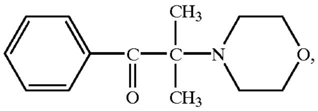
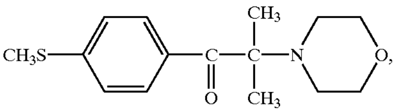
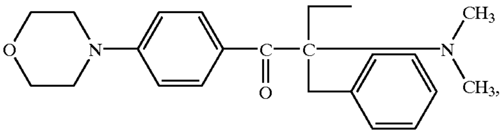
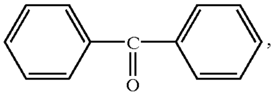
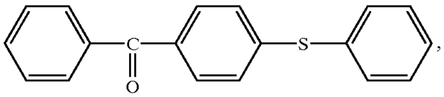
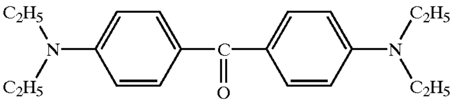
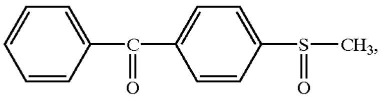
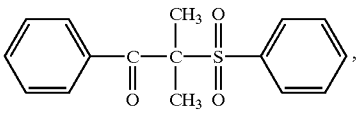

-continued

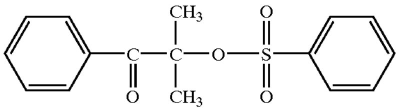

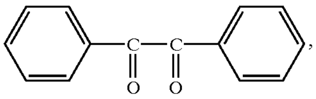,

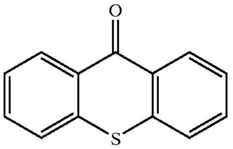,

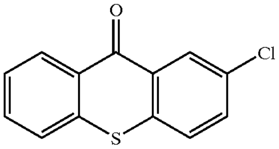,

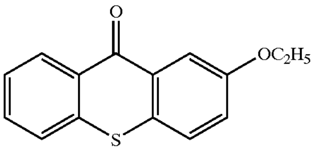

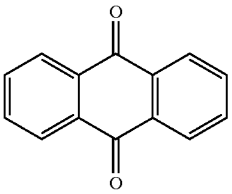,

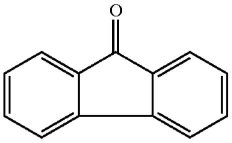,

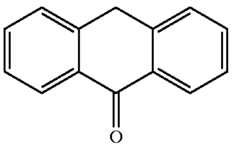,

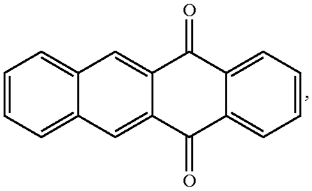,

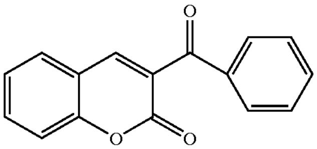,

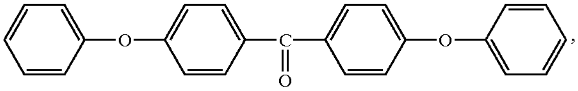,

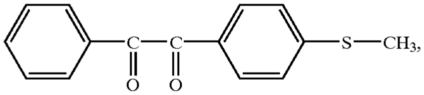

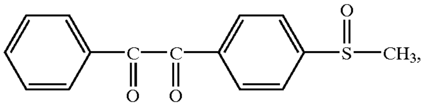

-continued

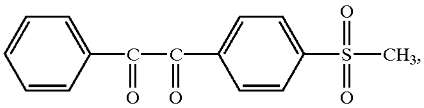

More preferred examples of the aromatic ketone (a) include α-thiobenzophenone compounds as described in JP-B-47-6416, and benzoin ether compounds as described in JP-B-47-3981, specifically, for example,

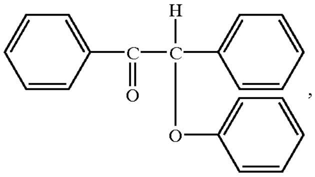,

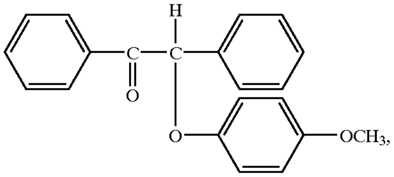

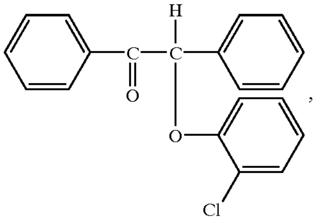,

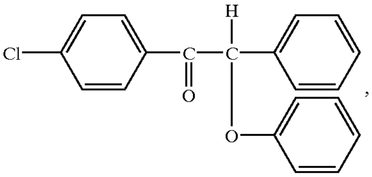,

α-substituted benzoin compounds as described in JP-B-47-22326, specifically, for example,

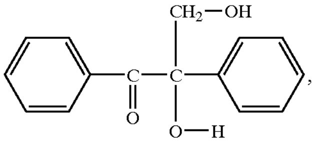,

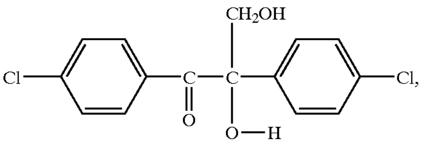

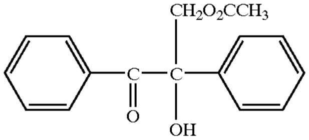

benzoin derivatives as described in JP-B-47-23664, aroylphophonic esters as described in JP-A-57-30704, and dialkoxybenzophenones as described in JP-B-60-26483, specifically, for example,

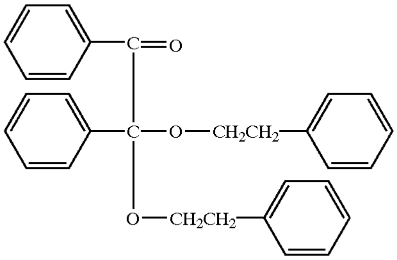
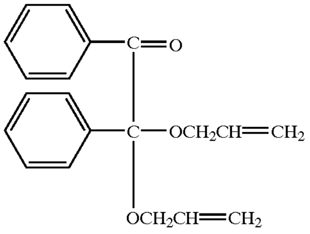
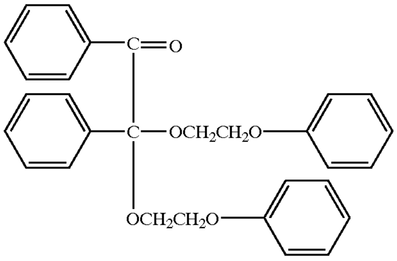
benzoin ethers as described in JP-B-60-26403 and JP-A-62-81345, specifically, for example,
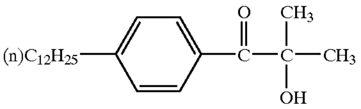
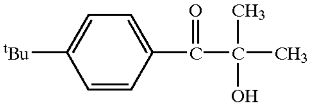
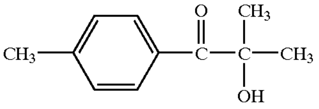
α-aminobenzophenones as described in JP-B-1-34242, U.S. Pat. No. 4,318,791 and EP-A-284,561, specifically, for example,
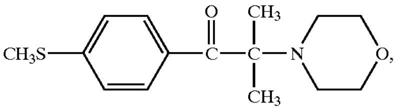
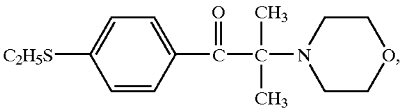
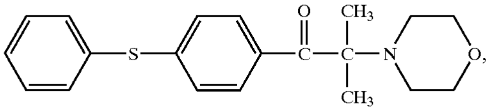
-continued
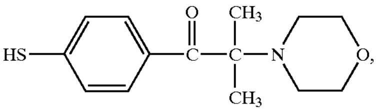
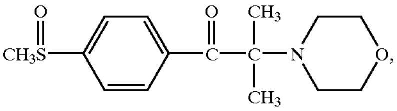
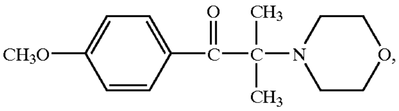
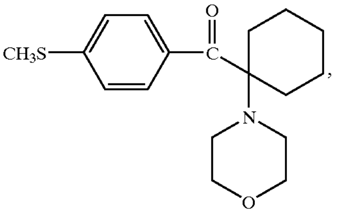
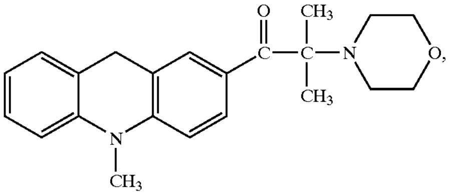
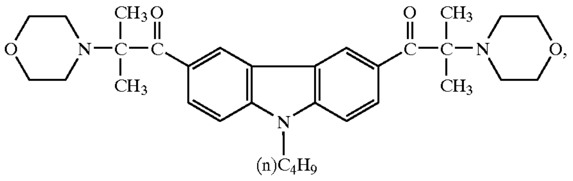
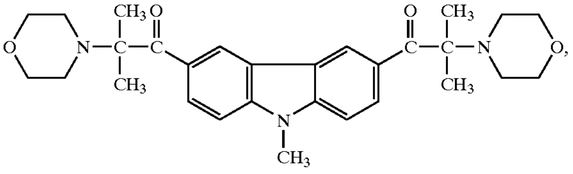
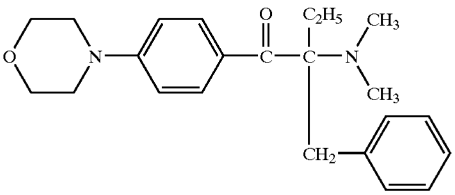
p-di(dimethylaminobenzoyl)benzene as described in JP-A-2-211452, specifically, for example,
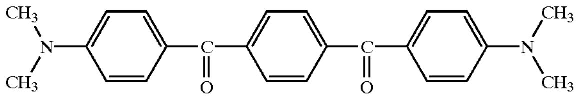
thio-substituted aromatic ketones as described in JP-A-61-194062, specifically, for example,

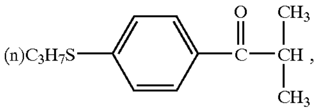

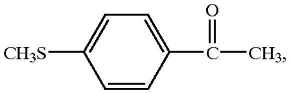

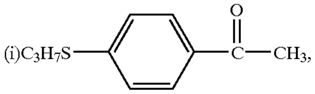

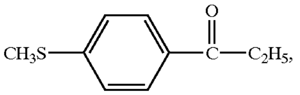

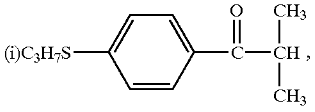

acylphosphinesulfides as described in JP-B-2-9597, specifically, for example,

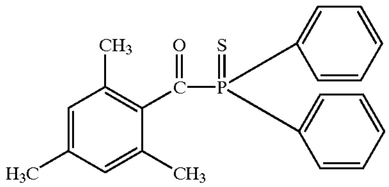

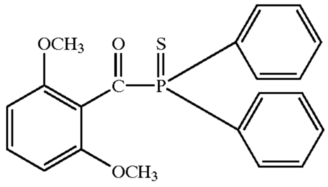

acylphosphines as described in JP-B-2-9596, specifically, for example,

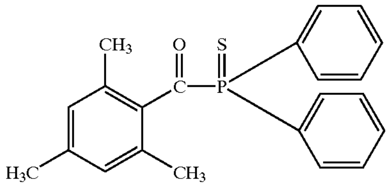

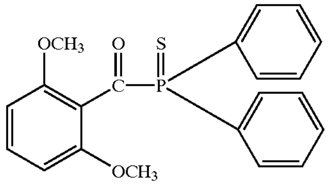

thioxantones as described in JP-B-63-61950, and coumarins as described in JP-B-59-42864.

The aromatic onium salt compound (b), which is another example of the radical initiator for use in the present invention, includes aromatic onium salts of atoms belonging to Group V, Group VI or Group VII of the periodic table, specifically, N, P, As, Sb, O, S, Se, Te and I. Examples of the aromatic onium salt compound include compounds as described in JP-B-52-14277, JP-B-52-14278 and JP-B-52-14279. Specific examples thereof include the following compounds:

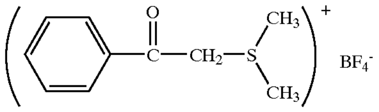

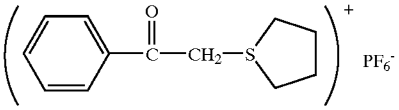

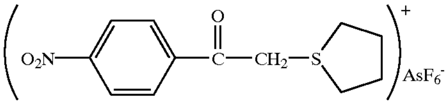

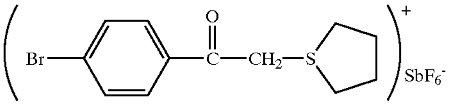

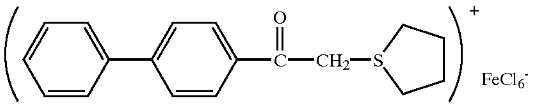

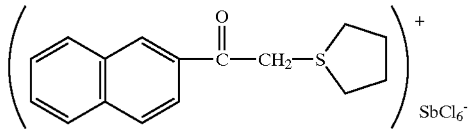

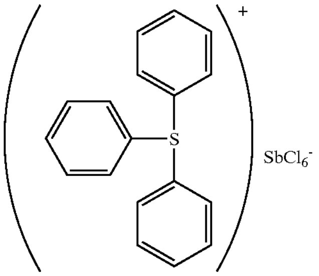

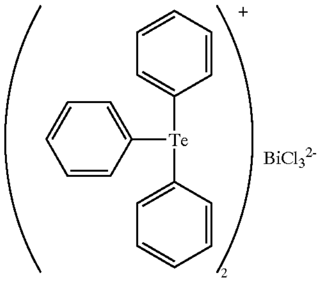

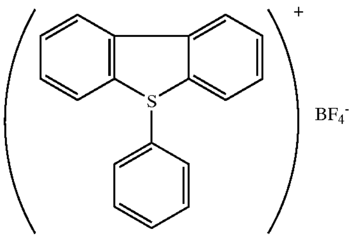

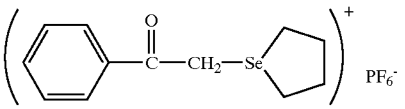

-continued
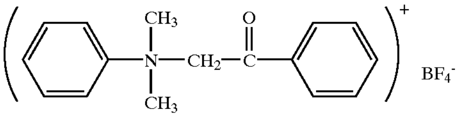
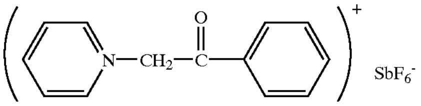
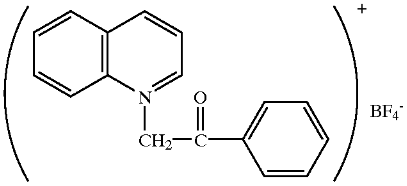
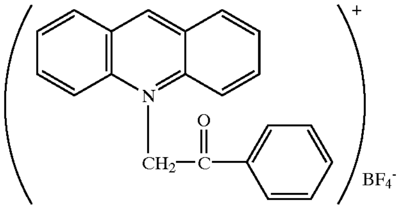
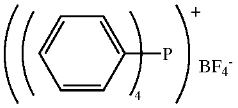
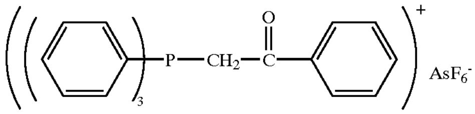
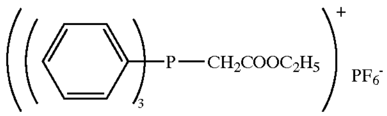
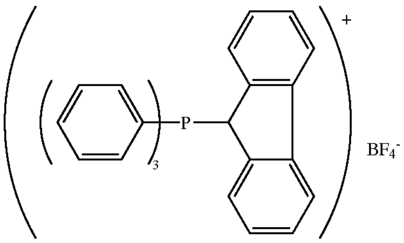
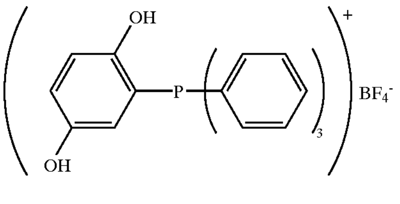
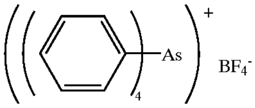
-continued
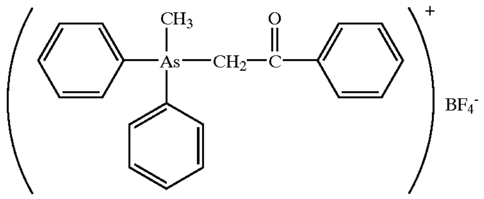
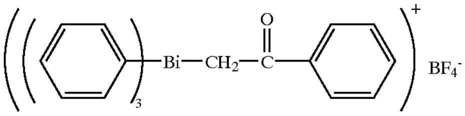
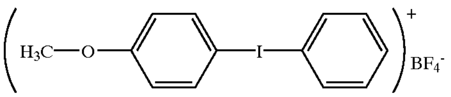
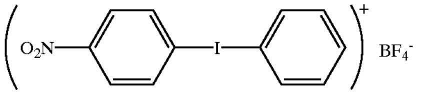
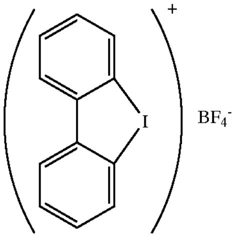
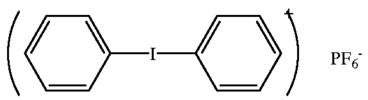
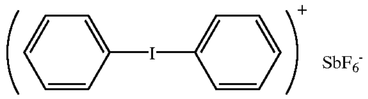
Also, the following diazonium salts are exemplified.
<Diazonium Salt or Quinonediazide>
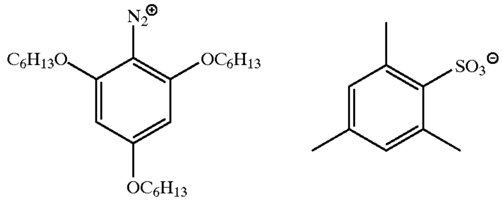
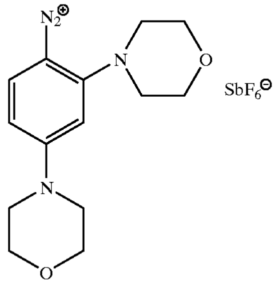

-continued

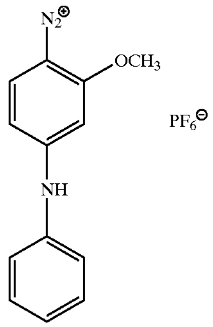

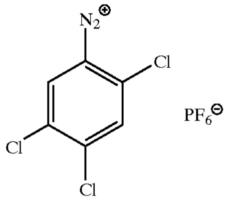

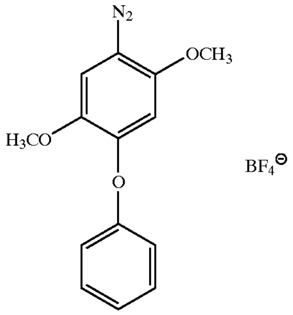

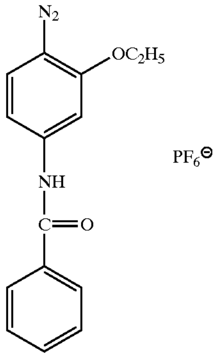

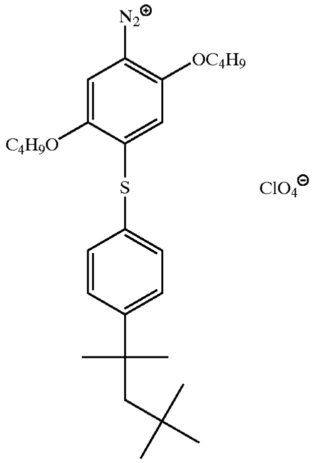

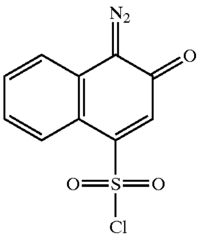

-continued

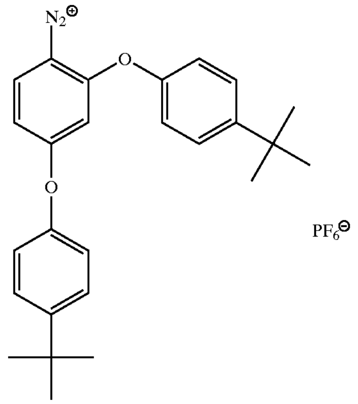

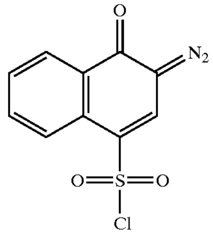

The organic peroxide (c), which is still another example of the radical initiator for use in the present invention, includes almost all organic compounds having at least one oxygen-oxygen bond in the molecules thereof. Specific examples of the organic peroxide include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy) cyclohexane, 2,2-bis(tert-butylperoxy)butane, tert-butylhydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butylcumyl peroxide, dicumyl peroxide, bis (tert-butylperoxyisopropyl)benzene, 2,5-dimethyl-2,5-di (tert-butylperoxy)hexane, 2,5-dimethylbenzoyl peroxide, succinic peroxide, benzoyl peroxide, 2,4-dichlorobenzoyl peroxide, metatoluoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy-3,5,5-trimethyl hexanoate, tert-butylperoxy laurate, tert-butyl carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

Of the organic peroxides, ester peroxides, for example, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra (cumylperoxycarbonyl)benzophenone, 3,3',4,4'-tetra(p-isopropylcumylperoxycarbonyl)benzophenone and di-tert-butyldiperoxy isophthalate are preferred.

The thio compound (d), which is a further example of the radical initiator for use in the present invention, includes compounds represented by the following formula (V):

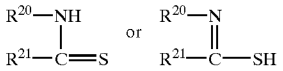

(V)

wherein $R^{20}$ represents an alkyl group, an aryl group or a substituted aryl group; $R^{21}$ represents a hydrogen atom or an alkyl group; or $R^{20}$ and $R^{21}$ combine with each other and together represent a non-metallic atomic group necessary for forming a 5-membered, 6-membered or 7-membered ring which may contain a hetero atom selected from an oxygen atom, a sulfur atom and a nitrogen atom.

The alkyl group in formula (V) is preferably that having from 1 to 4 carbon atoms. The aryl group in formula (V) is preferably that having from 6 to 10 carbon atoms, for example, phenyl and naphthyl groups. The substituted aryl group includes the above-described aryl group substituted with, for example, a halogen atom, e.g., chlorine, and an alkyl group, e.g., methyl, or an alkoxy group, e.g., methoxy or ethoxy. $R^{21}$ preferably represents an alkyl group having from 1 to 4 carbon atoms. Specific examples of the thio compound represented by formula (V) include the following compounds:

| No. | $R^{20}$ | $R^{21}$ |
|---|---|---|
| 1 | H | H |
| 2 | H | $CH_3$ |
| 3 | $CH_3$ | H |
| 4 | $CH_3$ | $CH_3$ |
| 5 | $C_6H_5$ | $C_2H_5$ |
| 6 | $C_6H_5$ | $C_4H_9$ |
| 7 | $C_6H_4Cl$ | $CH_3$ |
| 8 | $C_6H_4Cl$ | $C_4H_9$ |
| 9 | $C_6H_4—CH_3$ | $C_4H_9$ |
| 10 | $C_6H_4—OCH_3$ | $CH_3$ |
| 11 | $C_6H_4—OCH_3$ | $C_2H_5$ |
| 12 | $C_6H_4OC_2H_5$ | $CH_3$ |
| 13 | $C_6H_4OC_2H_5$ | $C_2H_5$ |
| 14 | $C_6H_4OCH_3$ | $C_4H_9$ |
| 15 | $—(CH_2)_2—$ | |
| 16 | $—(CH_2)_2—S—$ | |
| 17 | $—CH(CH_3)—CH_2—S—$ | |
| 18 | $—CH_2—CH(CH_3)—S—$ | |
| 19 | $—C(CH_3)_2—CH_2—S—$ | |
| 20 | $—CH_2—C(CH_3)_2—S—$ | |
| 21 | $—(CH_2)_2—O—$ | |
| 22 | $—CH(CH_3)—CH_2—O—$ | |
| 23 | $—C(CH_3)_2—CH_2—O—$ | |
| 24 | $—CH{=}CH—N(CH_3)—$ | |
| 25 | $—(CH_2)_3—S—$ | |
| 26 | $—(CH_2)_2—CH(CH_3)—S—$ | |
| 27 | $—(CH_2)_3—O—$ | |
| 28 | $—(CH_2)_5—$ | |
| 29 | $—C_6H_4—O—$ | |
| 30 | $—N{=}C(SCH_3)—S—$ | |
| 31 | $—C_6H_4—NH—$ | |
| 32 | 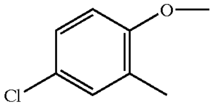 | |

The hexaarylbiimidazole compound (e), which is a still further example of the radical initiator for use in the present invention, includes lophine dimers as described in JP-B-45-37377 and JP-B-44-86516, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,p-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

The ketoxime ester compound (f), which is a still further example of the radical initiator for use in the present invention, includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

The borate compound (g), which is a still further example of the radical initiator for use in the present invention, includes compounds represented by the following formula (VI):

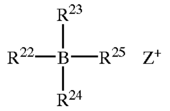

(VI)

wherein $R^{22}$, $R^{23}$, $R^{24}$ and $R^{25}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, or at least two of $R^{22}$, $R^{23}$, $R^{24}$ and $R^{25}$ may combine with each other to form a cyclic structure, provided that at least one of $R^{22}$, $R^{23}$, $R^{24}$ and $R^{25}$ represents a substituted or unsubstituted alkyl group; and $Z^+$ represents an alkali metal cation or a quaternary ammonium cation.

The alkyl group represented by $R^{22}$ to $R^{25}$ includes a straight chain, branched or cyclic alkyl group, and preferably has from 1 to 18 carbon atoms. Specific examples thereof include methyl, ethyl, propyl, isopropyl, butyl, pentyl, hexyl, octyl, stearyl, cyclobutyl, cyclopentyl and cyclohexyl groups. The substituted alkyl group represented by $R^{22}$ to $R^{25}$ includes the above-described alkyl group substituted with a halogen atom (e.g., chlorine or bromine), a cyano group, a nitro group, an aryl group (e.g., phenyl), a hydroxy group, $—N(R^{26})(R^{27})$ (wherein $R^{26}$ and $R^{27}$, which may be the same or different, each represents a hydrogen atom, an alkyl group having from 1 to 14 carbon atoms or an aryl group), —$COOR^{28}$ (wherein $R^{28}$ represents a hydrogen atom, an alkyl group having from 1 to 14 carbon atoms or an aryl group) —$OCOR^{29}$ (wherein $R^{29}$ represents an alkyl group having from 1 to 14 carbon atoms or an aryl group) or —$OR^{30}$ (wherein $R^{30}$ represents an alkyl group having from 1 to 14 carbon atoms or an aryl group). The aryl group represented by $R^{22}$ to $R^{25}$ includes an aryl group having from one to three rings, for example, phenyl or naphthyl. The substituted aryl group represented by $R^{22}$ to $R^{25}$ includes the above-described aryl group substituted with the substituent described for the substituted alkyl group above or an alkyl group having from 1 to 14 carbon atoms. The alkenyl group represented by $R^{22}$ to $R^{25}$ includes a straight chain, branched or cyclic alkenyl group having from 2 to 18 carbon atoms. In the substituted alkenyl group, the substituent includes the substituents described for the substituted alkyl group above. The alkynyl group represented by $R^{22}$ to $R^{25}$ includes a straight chain, branched or cyclic alkynyl group having from 2 to 28 carbon atoms. In the substituted alkynyl group, the substituent includes the substituents described for the substituted alkyl group above. The heterocyclic group represented by $R^{22}$ to $R^{25}$ includes a 5-membered or more heterocyclic group, preferably a 5-membered, 6-membered or 7-membered heterocyclic group, containing at least one hetero atom selected from a nitrogen atom, a sulfur atom and an oxygen atom. The heterocyclic group may have a condensed ring. In the substituted heterocyclic group, the substituent includes the substituents described for the substituted aryl group above. Specific examples of the compound represented by formula (VI) include compounds described in U.S. Pat. Nos. 3,567,453 and 4,343,891, European Patents 109,772 and 109,773, and the following compounds:

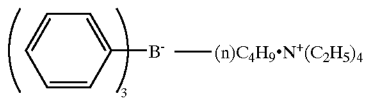

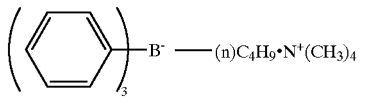

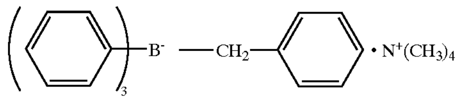

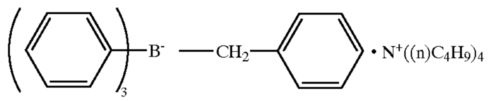

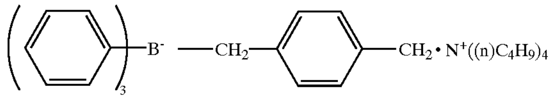

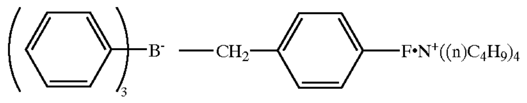

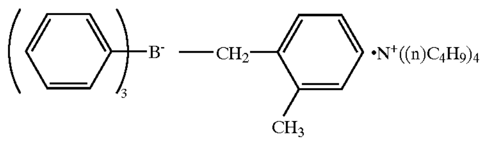

-continued

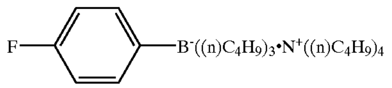

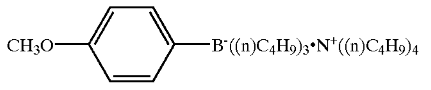

The azinium compound (h), which is a still further example of the radical initiator for use in the present invention, includes compounds having an N—O bond as described in JP-A-63-138345, JP-A-63-142345, JP-A-63-142346, JP-A-63-143537 and JP-B-46-42363.

The metallocene compound (i), which is a still further example of the radical initiator for use in the present invention, includes titanocene compounds as described in JP-A-59-152396, JP-A-61-151197, JP-A-63-41484, JP-A-2-249 and JP-A-2-4705, and iron-arene complexes as described in JP-A-1-304453 and JP-A-1-152109.

Specific examples of the titanocene compound include dicyclopentadienyl-Ti-dichloride, dicyclopentadienyl-Ti-biphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis[2,6-difluoro-3-(pyrol-1-yl)phenyl]-titanium, bis(cyclopentadienyl)bis[2,6-difluoro-3-methylsulfonamido)phenyl] titanium, bis(cyclopentadienyl)bis[2,6-difluoro-3-(N-butylpivaloylamino)phenyl]titanium, bis(cyclopentadienyl) bis[2,6-difluoro-3-(N-ethylacetylamino)phenyl]titanium, bis(cyclopentadienyl)bis[2,6-difluoro-3-(N-methylacetylamino)phenyl]titanium, bis(cyclopentadienyl)bis[2,6-difluoro-3-(N-ethylpropionylamino)phenyl]titanium, bis (cyclopentadienyl)bis[2,6-difluoro-3-(N-ethyl-(2,2-dimethylbutanoyl)amino)phenyl]titanium, bis (cyclopentadienyl)bis[2,6-difluoro-3-(N-butyl-(2,2-dimethylbutanoyl)amino)phenyl]titanium, bis (cyclopentadienyl)bis[2,6-difluoro-3-(N-pentyl-(2,2-dimethylbutanoyl)amino)phenyl]titanium, bis (cyclopentadienyl)bis[2,6-difluoro-3-(N-hexyl-(2,2-dimethylbutanoyl)amino)phenyl]titanium, bis (cyclopentadienyl)bis[2,6-difluoro-3-(N-methylbutyrylamino)phenyl]titanium, bis(cyclopentadienyl)bis[2,6-difluoro-3-(N-methylpentanoylamino)phenyl]titanium, bis (cyclopentadienyl)bis[2,6-difluoro-3-(N-ethylcyclohexylcarbonylamino)phenyl]titanium bis(cyclopentadienyl)bis[2,6-difluoro-3-(N-ethylisobutyryl- amino)phenyl]titanium, bis (cyclopentadienyl)bis[2,6-difluoro-3-(N-ethylacetylamino) phenyl]titanium, bis(cyclopentadienyl)bis[2,6-difluoro-3-(2,2,5,5-tetramethyl-1,2,5-azadisilazan-1-yl)phenyl] titanium, bis(cyclopentadienyl)bis[2,6-difluoro-3-(octylsulfonamido)phenyl]titanium, bis(cyclopentadienyl) bis[2,6-difluoro-3-(4-tolylsulfonamido)phenyl]titanium, bis (cyclopentadienyl)bis[2,6-difluoro-3-(4-dodecylphenylsulfonylamido)phenyl]titanium, bis(cyclopentadienyl)bis[2,6-difluoro-3-(4-(1-pentylheptyl)phenylsulfonylamido)phenyl] titanium, bis(cyclopentadienyl)bis[2,6-difluoro-3-(ethylsulfonylamido)phenyl]titanium, bis(cyclopentadienyl) bis[2,6-difluoro-3-((4-bromophenyl)-sulfonylamido) phenyl]titanium, bis(cyclopentadienyl)bis[2,6-difluoro-3-(2-naphthyl-sulfonylamido)phenyl]titanium, bis (cyclopentadienyl)bis [2,6-difluoro-3-(hexadecyl-sulfonylamido)phenyl]titanium, bis(cyclopentadienyl)bis[2,6-difluoro-3-(N-methyl-(4-dodecylphenyl)sulfonylamido)phenyl]titanium, bis(cyclopentadienyl)bis[2,6-difluoro-3-(N-methyl-(4-(1-pentylheptyl)phenyl)sulfonylamido)phenyl]titanium, bis(cyclopentadienyl)bis[2,6-difluoro-3-(N-hexyl-(4-tolyl)sulfonylamido)phenyl]titanium, bis(cyclopentadienyl)bis[2,6-difluoro-3-(pyrrolidin-2,5-dion-1-yl)phenyl]titanium, bis(cyclopentadienyl)bis[2,6-difluoro-3-(3,4-dimethyl-3-pyrrolidin-2,5-dion-1-yl)phenyl]titanium, bis(cyclopentadienyl)bis[2,6-difluoro-3-(phthalimido)-phenyl]titanium, bis(cyclopentadienyl)bis[2,6-difluoro-3-(isobutoxy-carbonylamino)phenyl]titanium, bis(cyclopenta- dienyl)bis[2,6-difluoro-3-(ethoxy-carbonylamino)phenyl]titanium, bis(cyclopentadienyl)bis[2,6-difluoro-3-((2-chloroethoxy)-carbonylamino)phenyl]titanium, bis(cyclopentadienyl)bis[2,6-difluoro-3-(phenoxy-carbonylamino)phenyl]titanium, bis(cyclopentadienyl)bis[2,6-difluoro-3-(3-phenyl-thioureido)phenyl]titanium, bis(cyclopentadienyl)bis[2,6-difluoro-3-(3-butyl-thioureido)phenyl]titanium, bis(cyclopentadienyl)bis[2,6-difluoro-3-(3-phenyl-ureido)phenyl]titanium, bis(cyclopentadienyl)bis[2,6-difluoro-3-(3-butyl-ureido)phenyl]titanium, bis(cyclopentadienyl)bis[2,6-difluoro-3-(N,N-diacetylamino)-phenyl]titanium, bis(cyclopentadienyl)bis[2,6-difluoro-3-(3,3-dimethylureido-phenyl]titanium, bis(cyclopentadienyl)bis[2,6-difluoro-3-(acetylamino)-phenyl]titanium, bis(cyclopentadienyl)bis[2,6-difluoro-3-(butyrylamino)-phenyl]titanium, bis(cyclopentadienyl)bis[2,6-difluoro-3-(decanoylamino)-phenyl]titanium, bis(cyclopentadienyl)bis[2,6-difluoro-3-(octadecanoylamino)-phenyl]titanium, bis(cyclopentadienyl)bis[2,6-difluoro-3-(isobutyrylamino)-phenyl]titanium, bis(cyclopentadienyl)bis[2,6-difluoro-3-(2-ethylhexanoyl-amino)phenyl]titanium, bis(cyclopentadienyl)bis[2,6-difluoro-3-(2-methylbutanoyl-amino)phenyl]titanium, bis(cyclopentadienyl)bis[2,6-difluoro-3-(pivaloylamino)-phenyl]titanium, bis(cyclopentadienyl)bis[2,6-difluoro-3-(2,2-dimethyl-butanoylamino)phenyl]titanium, bis(cyclopentadienyl)bis[2,6-difluoro-3-(2-ethyl-2-methyl-heptanoylamino)phenyl]titanium, bis(cyclopentadienyl)bis[2,6-difluoro-3-(cyclohexylcarbonyl-amino)phenyl]titanium, bis(cyclopentadienyl)bis[2,6-difluoro-3-(2,2-dimethyl-3-chloropropanoylamino)phenyl]titanium, bis(cyclopentadienyl)bis[2,6-difluoro-3-(3-phenyl-propanoylamino)phenyl]titanium, bis(cyclopentadienyl)bis[2,6-difluoro-3-(2-chloromethyl-2-methyl-3-chloropropanoylamino)phenyl]titanium, bis(cyclopentadienyl)bis[2,6-difluoro-3-(3,4-xyloylamino)-phenyl]titanium, bis(cyclopentadienyl)bis[2,6-difluoro-3-(4-ethylbenzoyl-amino)phenyl]titanium, bis(cyclopenta-dienyl)bis[2,6-difluoro-3-(2,4,6-mesityl-carbonylamino)phenyl]titanium, bis(cyclopentadienyl)bis[2,6-difluoro-3-(benzoylamino)-phenyl]titanium, bis(cyclopentadienyl)bis[2,6-difluoro-3-(N-(3-phenylpropyl)-benzoylamino)phenyl]titanium, bis(cyclopentadienyl)bis[2,6-difluoro-3-(N-(3-ethylheptyl)-2,2-dimethylpentanoylamino)phenyl]titanium, bis(cyclopentadienyl)bis[2,6-difluoro-3-(N-isobutyl-(4-toluyl)amino)phenyl]titanium, bis(cyclopentadienyl)bis[2,6-difluoro-3-(N-isobutyl-benzoylamino)phenyl]titanium, bis(cyclopentadienyl)bis[2,6-difluoro-3-(N-cyclohexyl-methyl-pivaloylamino)phenyl]titanium, bis(cyclopentadienyl)bis[2,6-difluoro-3-(N-(oxazolin-2-ylmethyl)benzoylamino)phenyl]titanium, bis(cyclopentadienyl)bis[2,6-difluoro-3-(N-(3-ethylheptyl)-2,2-dimethylbutanoylamino)phenyl]titanium, bis(cyclopentadienyl)bis[2,6-difluoro-3-(N-(3-phenylpropyl)-(4-tolyl)amino)phenyl]titanium, bis(cyclopentadienyl)bis[2,6-difluoro-3-(N-(oxolan-2-ylmethyl)-(4-tolyl)amino)phenyl]titanium, bis(cyclopentadienyl)bis[2,6-difluoro-3-(N-(4-toluylmethyl)-benzoylamino)phenyl]titanium, bis(cyclopentadienyl)bis[2,6-difluoro-3-(N-(4-toluylmethyl)-(4-toluyl)amino)phenyl]titanium, bis(cyclopentadienyl)bis[2,6-difluoro-3-(N-butylbenzoyl-amino)phenyl]titanium, bis(cyclopentadienyl)bis[2,6-difluoro-3-(N-butyl-(4-toluyl)-amino)phenyl]titanium, bis(cyclopentadienyl)bis[2,6-difluoro-3-(N-hexyl-(4-toluyl)-amino)phenyl]titanium, bis(cyclopentadienyl)bis[2,6-difluoro-3-(N-(2,4-dimethylpentyl)-2,2-dimethylbutanoylamino)phenyl]titanium, bis(cyclopentadienyl)bis[2,6-difluoro-3-(N-(2,4-dimethylpentyl)-2,2-dimethylpentanoylamino)phenyl]titanium, bis(cyclopentadienyl)bis[2,6-difluoro-3-((4-toluyl)amino)-phenyl]titanium, bis(cyclopentadienyl)bis[2,6-difluoro-3-(2,2-dimethylpentanoylamino)phenyl]titanium, bis(cyclopentadienyl)bis[2,6-difluoro-3-(2,2-dimethyl-3-ethoxypropanoylamino)phenyl]titanium, bis(cyclopentadienyl)bis[2,6-difluoro-3-(2,2-dimethyl-3-allyloxypropanoylamino)phenyl]titanium, bis(cyclopentadienyl)bis[2,6-difluoro-3-(N-allylacetylamino)phenyl]titanium, bis(cyclopentadienyl)bis[2,6-difluoro-3-(2-ethylbutanoylamino) phenyl]titanium, bis(cyclopentadienyl)bis[2,6-difluoro-3-(N-cyclohexylmethyl-benzoylamino)phenyl]titanium, bis(cyclopentadienyl)bis[2,6-difluoro-3-(N-cyclohexylmethyl-(4-toluyl)amino)phenyl]titanium, bis(cyclopentadienyl)bis[2,6-difluoro-3-(N-(2-ethylhexyl)benzoylamino)phenyl]titanium, bis(cyclopentadienyl)bis[2,6-difluoro-3-(N-isopropylbenzoyl-amino) phenyl]titanium, bis(cyclopentadienyl)bis[2,6-difluoro-3-(N-(3-phenylpropyl)-2,2-dimethylpentanoyl-amino)phenyl]titanium, bis(cyclopentadienyl)bis[2,6-difluoro-3-(N-hexylbenzoylamino) phenyl]titanium, bis(cyclopentadienyl)bis[2,6-difluoro-3-(N-cyclohexylmethyl-2,2-dimethylpentanoylamino)phenyl]titanium, bis(cyclopentadienyl)bis[2,6-difluoro-3-(N-butylbenzoyl-amino) phenyl]titanium, bis(cyclopentadienyl)bis[2,6-difluoro-3-(N-(2-ethylhexyl)-2,2-dimethylpentanoylamino)phenyl]titanium, bis(cyclopentadienyl)bis[2,6-difluoro-3-(N-hexyl-2,2-dimethylpentanoylamino)phenyl]titanium, bis(cyclopentadienyl)bis[2,6-difluoro-3-(N-isopropyl-2,2-dimethylpentanoylamino)phenyl]titanium, bis(cyclopenta-dienyl)bis[2,6-difluoro-3-(N-(3-phenylpropyl)-pivaloylamino)phenyl]titanium, bis(cyclopentadienyl)bis[2,6-difluoro-3-(N-butyl-2,2-dimethylpentanoylamino)phenyl]titanium, bis(cyclopentadienyl)bis[2,6-difluoro-3-(N-(2-methoxyethyl)-benzoylamino)phenyl]titanium, bis(cyclopentadienyl)bis[2,6-difluoro-3-(N-benzylbenzoyl-amino)phenyl]titanium, bis(cyclopentadienyl)bis[2,6-difluoro-3-(N-benzyl-(4-toluyl)amino)phenyl]titanium, bis(cyclopentadienyl)bis[2,6-difluoro-3-(N-(2-methoxylethyl)-(4-toluyl)amino)phenyl]titanium, bis(cyclopentadienyl)bis[2,6-difluoro-3-(N-(4-methylphenyl-methyl)-2,2-dimethylpentanoylamino)phenyl]titanium, bis(cyclopentadienyl)bis[2,6-difluoro-3-(N-(2-methoxyethyl)-2,2-dimethylpentanoylamino)phenyl]titanium, bis(cyclopentadienyl)bis[2,6-difluoro-3-(N-cyclohexylmethyl-(2-ethyl-2-methylheptanoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-hexyl-(2-ethyl-2-methylbutanoyl)amino)phenyl]titanium, bis(cyclopentadienyl)bis[2,6-difluoro-3-(N-cyclohexyl-2,2-dimethylpentanoylamino)phenyl]titanium, bis(cyclopentadienyl)bis[2,6-difluoro-3-(N-(oxolan-2-yl-methyl)-2,2-dimethylpentanoylamino)phenyl]titanium, bis(cyclopentadienyl)bis[2,6-difluoro-3-(N-cyclohexyl-(4-chlorobenzoyl)amino)phenyl]titanium, bis(cyclopentadienyl)bis[2,6-difluoro-3-(N-cyclohexyl-(2-chlorobenzoyl)amino)phenyl]titanium, bis(cyclopentadienyl)bis[2,6-difluoro-3-(3,3-dimethyl-2-azetidinon-1-yl)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropan-oyl)-2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)amino)phenyl]titanium, bis(cyclopentadienyl)bis[2,6-difluoro-3-(N-butyl-(2-chloromethyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(cyclopentadienyl)bis(2,6-difluoro-3-isocyanatophenyl)-titanium, bis(cyclopentadienyl)bis[2,6-difluoro-3-(N-ethyl-(4-tolylsulfonyl)amino)phenyl]titanium, bis(cyclopentadienyl)bis[2,6-difluoro-3-(N-hexyl-(4-tolylsulfonyl)amino)phenyl]titanium, bis(cyclopentadienyl)bis[2,6-difluoro-3-(N-butyl-(4-tolylsulfonyl)amino)phenyl]titanium, bis(cyclopentadienyl)bis[2,6-difluoro-3-(N-isobutyl-(4-tolylsulfonyl)amino)phenyl]titanium, bis(cyclopentadienyl)bis[2,6-difluoro-3-(N-butyl-(2,2-dimethyl-3-chloropropanoyl)amino)phenyl]titanium, bis(cyclopentadienyl)bis[2,6-difluoro-3-(N-(3-phenylpropan-oyl)-(2,2-dimethyl-3-chloropropanoyl)amino)phenyl]titanium, bis(cyclopentadienyl)bis[2,6-difluoro-3-(N-cyclohexylmethyl-(2,2-dimethyl-3-chloropropanoyl)amino)phenyl]titanium, bis(cyclopentadienyl)bis[2,6-difluoro-3-(N-isobutyl-(2,2-dimethyl-3-chloropropanoyl)amino)phenyl]titanium, bis(cyclopentadienyl)bis[2,6-difluoro-3-(N-butyl-(2-chloromethyl-2-methyl-3-chloropropanoyl)amino)phenyl]titanium, bis(cyclopentadienyl)bis[2,6-difluoro-3-(butylthiocarbonylamino)phenyl]titanium, bis(cyclopentadienyl)bis[2,6-difluoro-3-(phenylthiocarbonylamino)phenyl]titanium, bis(methylcyclopentadienyl)bis[2,6-difluoro-3-(N-hexyl-2,2-dimethylbutanonylamino)phenyl]titanium, bis(methylcyclopentadienyl)bis[2,6-difluoro-3-(N-hexyl-2,2-dimethylpentanonylamino)phenyl]titanium, bis(methylcyclopentadienyl)bis[2,6-difluoro-3-(N-ethylacetylamino) phenyl]titanium, bis(methylcyclopentadienyl)bis[2,6-difluoro-3-(N-ethylpropionylamino)phenyl]titanium, bis(trimethylsilylpentadienyl)bis[2,6-difluoro-3-(N-butyl-2,2-dimethylpropanonylamino)phenyl]titanium, bis(cyclopentadienyl)bis[2,6-difluoro-3-(N-(2-methoxyethyl)trimethylsilylamino)phenyl]titanium, bis(cyclopentadienyl)bis[2,6-difluoro-3-(N-butylhexyldimethylsilylamino)phenyl]titanium, bis(cyclopentadienyl)bis[2,6-difluoro-3-(N-ethyl-(1,1,2-trimethylpropyl)dimethylsilylamino)phenyl]titanium, bis(cyclopentadienyl)bis[2,6-difluoro-3-(3-ethoxymethyl-3-methyl-2-azetidinon-1-yl)phenyl]titanium, bis(cyclopentadienyl)bis[2,6-difluoro-3-(3-allyloxymethyl-3-methyl-2-azetidinon-1-yl)phenyl]titanium, bis(cyclopentadienyl)bis[2,6-difluoro-3-(3-chloromethyl-3-methyl-2-azetidinon-1-yl)phenyl]titanium, bis(cyclopentadienyl)bis[2,6-difluoro-3-(N-benzyl-2,2-dimethylpropanoylamino)phenyl]titanium, bis(cyclopentadienyl)bis[2,6-difluoro-3-(5,5-dimethyl-2-pyrrolidinon-1-yl)phenyl]titanium, bis(cyclopentadienyl)bis[2,6-difluoro-3-(6,6-diphenyl-2-piperidinon-1-yl)phenyl]titanium, bis(cyclopentadienyl)bis[2,6-difluoro-3-(N-(2,3-dihydro-1,2-benzothiazol-3-on(1,1-dioxido)-2-yl)phenyl]titanium, bis(cyclopentadienyl)bis[2,6-difluoro-3-(N-hexyl-(4-chlorobenzoyl)amino)phenyl]titanium, bis(cyclopentadienyl)bis[2,6-difluoro-3-(N-hexyl-(2-chlorobenzoyl)amino)phenyl]titanium, bis(cyclopentadienyl)bis[2,6-difluoro-3-(N-isopropyl-(4-chlorobenzoyl)amino)phenyl]titanium, bis(cyclopentadienyl)bis[2,6-difluoro-3-(N-(4-methylphenylmethyl-(4-chlorobenzoyl)amino)phenyl]titanium, bis(cyclopentadienyl)bis[2,6-difluoro-3-(N-(4-methylphenylmethyl)-(2-chlorobenzoyl)amino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolylsulfonylamino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis (cyclopentadienyl)bis [2,6-difluoro-3-(trifluoroacetylamino) phenyl]titanium, bis(cyclopentadienyl) bis [2,6-difluoro-3-(2-chlorobenzoylamino) phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium, and bis(cyclopentadienyl)bis[2,6-difluoro-3-(N-cyclohexylbenzoylamino)phenyl]titanium.

The active ester compound (j), which is a still further example of the radical initiator for use in the present invention, includes imidosulfonate compounds as described in JP-B-62-6223, and active sulfonates as described in JP-B-63-14340 and JP-A-59-174831.

Preferred examples of the compound having a carbon-halogen bond (k), which is a still further example of the radical initiator for use in the present invention, include the following compounds:

Compounds represented by the following formula (VII):

(VII)

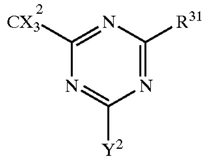

wherein $X^2$ represents a halogen atom; $Y^2$ represents $—C(X^2)_3$, $—NH_2$, $—NHR^{32}$, $—N(R^{32})_2$ or $—OR^{32}$; $R^{32}$ represents an alkyl group, a substituted alkyl group, an aryl group or a substituted aryl group; and $R^{31}$ represents $—C(X^2)_3$, an alkyl group, a substituted alkyl group, an aryl group, a substituted aryl group or a substituted alkenyl group;

Compounds represented by the following formula (VIII):

(VIII)

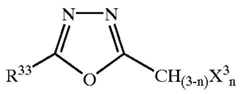

wherein $R^{33}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group; $X^3$ represents a halogen atom; and n represents an integer of from 1 to 3;

Compounds represented by the following formula (IX):

$$R^{34}—Z^2—CH_{(2-m)}X_m^{3}R^{35} \quad (IX)$$

wherein $R^{34}$ represents an aryl group or a substituted aryl group; $R^{35}$ represents

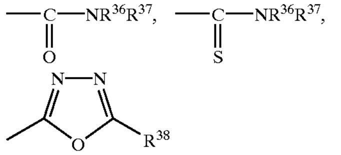

or a halogen atom; $Z^2$ represents —C(=O)—, —C(=S)— or —$SO_2$—; $R^{36}$ and $R^{37}$ each represents an alkyl group, a substituted alkyl group, an alkenyl group, a substituted alkenyl group, an aryl group or a substituted aryl group; $R^{38}$ has the same meaning as defined for $R^{32}$ in formula (VII); $X^3$ represents a halogen atom; and m represents 1 or 2;

Compounds represented by the following formula (X):

(X)

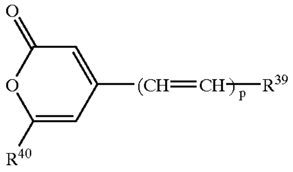

wherein $R^{39}$ represents an aryl group which may be substituted or a heterocyclic group which may be substituted; $R^{40}$ represents a trihaloalkyl or trihaloalkenyl group having from 1 to 3 carbon atoms; and p represents 1, 2 or 3;

Carbonylmethylene heterocyclic compounds having a trihalogenomethyl group represented by the following formula (XI):

(XI)

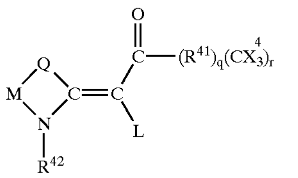

wherein L represents a hydrogen atom or a group represented by formula —CO—$(R^{41})_q(C(X^4)_3)_r$; Q represents a sulfur atom, a selenium atom, an oxygen atom, a dialkylmethylene group, an alken-1,2-ylene group, a 1,2-phenylene group or —N—R; M represents a substituted or unsubstituted alkylene group, a substituted or unsubstituted alkenylene group or a 1,2-arylene group; $R^{42}$ represents an alkyl group, an aralkyl group or an alkoxyalkyl group; $R^{41}$ represents a divalent carbocyclic or heterocyclic aromatic group; $X^4$ represents a chlorine atom, a bromine atom or an iodine atom; q represents 0 or 1; and r represents 1 or 2, provided that when q represents 0, r represents 1, and when q represents 1, r represents 1 or 2; 4-Halogeno-5-(halogenomethylphenyl)oxazole derivatives represented by the following formula (XII):

(XII)

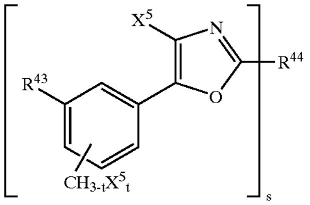

wherein $X^5$ represents a halogen atom, t represents an integer of from 1 to 3; s represents an integer of from 1 to 4; $R^{43}$ represents a hydrogen atom or —$CH_{3-t}X^5_t$; and $R^{44}$ represents an s-valent unsaturated organic residue which may be substituted; and 2-(Halogenomethylphenyl)-4-halogenooxazole derivatives represented by the following formula (XIII):

(XIII)

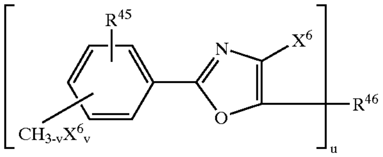

wherein $X^6$ represents a halogen atom, v represents an integer of from 1 to 3; u represents an integer of from 1 to 4; $R^{45}$ represents a hydrogen atom or —$CH_{3-v}X^6_v$; and $R^{46}$ represents an u-valent unsaturated organic residue which may be substituted.

Specific examples of the compound having a carbon-halogen bond include compounds as described in Wakabayashi et al., *Bull. Chem. Soc. Japan*, Vol. 42, page 2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine; compounds as described in British Patent 1,388,492, for example, 2-styryl-4,6-bis(trichoromethyl)-S-triazine, 2-(p-methylstyryl)-4,6-bis(trichloromethyl)-S-triazine, 2-(p-methoxylstyryl)-4,6-bis(trichloromethyl)-S-triazine and 2-(p-methoxylstyryl)-4-amino-6-trichloromethyl-S-triazine; and compounds as described in JP-A-53-133428, for example, 2-(4-methoxynaphth-1-yl)-4,6-bis(trichloromethyl)-S-triazine, 2-(4-ethoxynaphth-1-yl)-4,6-bis(trichloromethyl)-S-triazine, 2-[4-(2-ethoxyethyl)naphth-1-yl]-4,6-bis(trichloromethyl)-S-triazine, 2-(4,7-dimethoxynaphth-1-yl)-4,6-bis(trichloro-methyl)-S-triazine and 2-(acenaphth-5-yl)-4,6-bis(trichloro-methyl)-S-triazine; compounds as described in German Patent 3,337,024, for example,

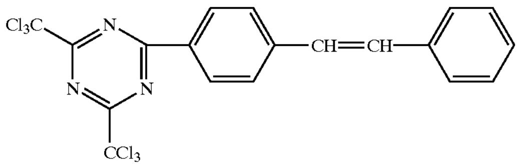

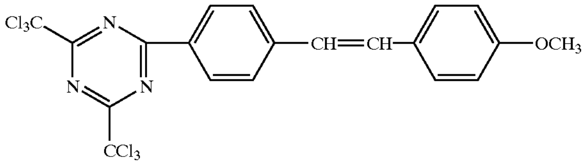

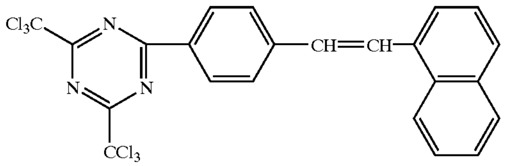

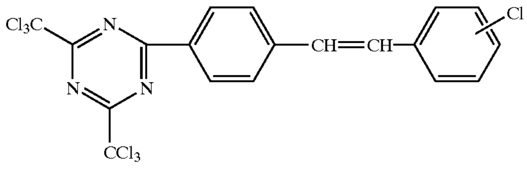

and other compounds, for example,

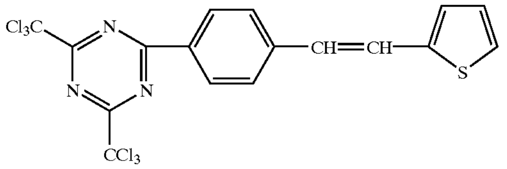

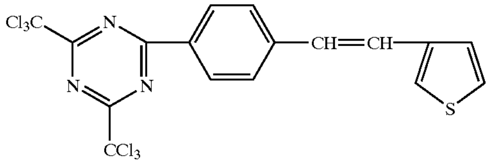

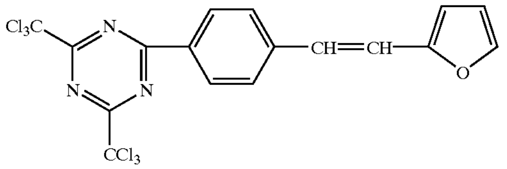

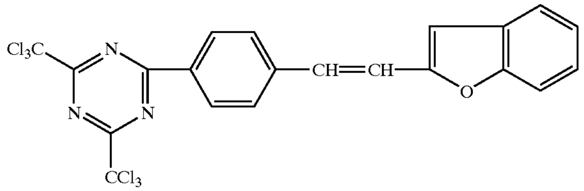

Specific examples of the compound having a carbon-halogen bond also include compounds as described in F. C. Schaefer et al., *J. Org. Chem.*, Vol. 29, page 1527 (1964), for example, 2-methyl-4,6-bis(tribromomethyl)-S-triazine, 2,4,6-tris(tri-bromomethyl)-S-triazine, 2,4,6-tris(dibromomethyl)-S-triazine, 2-amino-4-methyl-6-tribromomethyl-S-triazine and 2-methoxy-4-methyl-6-tribromomethyl-S-triazine; compounds as described in JP-A-62-58241, for example,

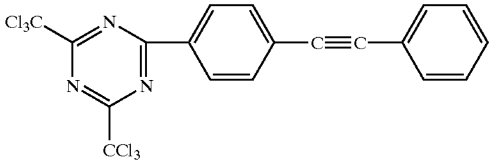

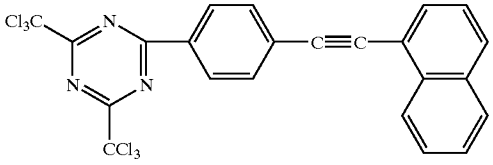

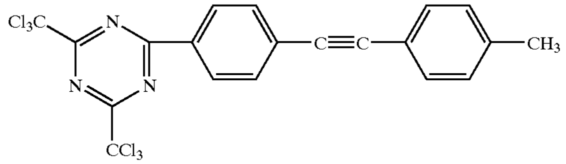

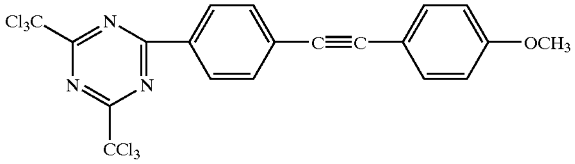

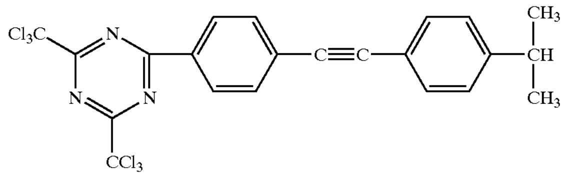

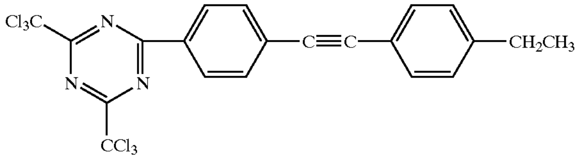

compounds as described in JP-A-5-281728, for example,

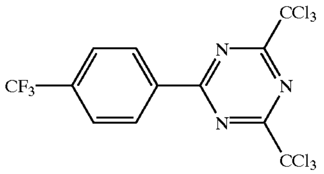

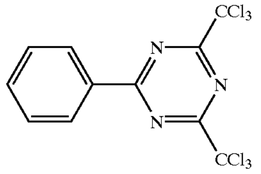

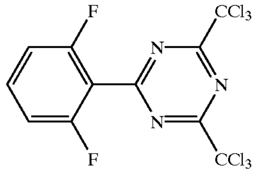

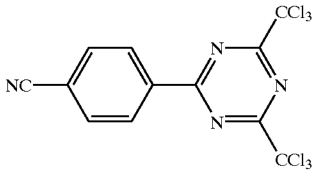

-continued
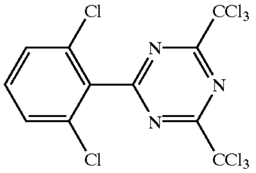
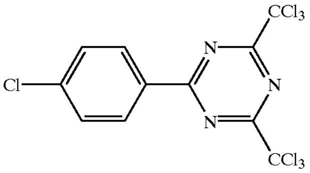
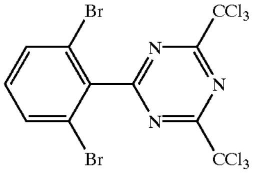
compounds which can be easily synthesized by one skilled in the art according to synthesis methods as described in M. P. Hutt, E. F. Elslager and L. M. Herbel, *Journal of Heterocyclic Chemistry*, Vol. 7, No. 3, page 511 (1970), for example,
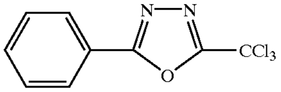
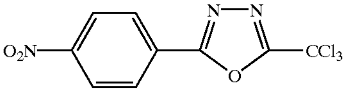
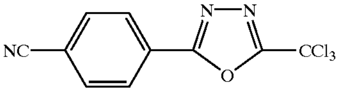
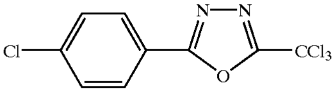
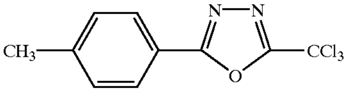
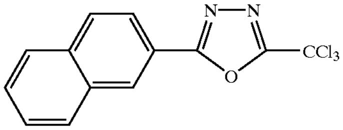
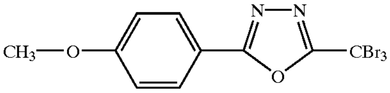
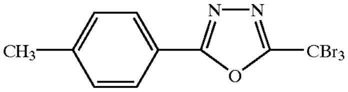
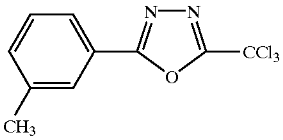
-continued
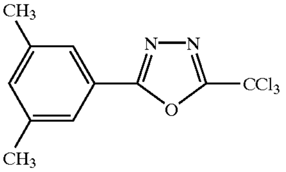
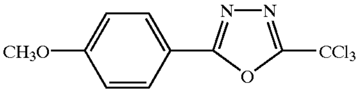
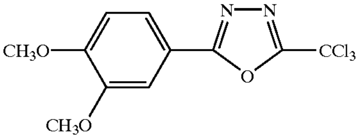
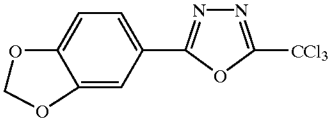
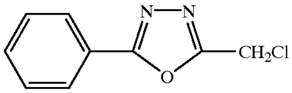
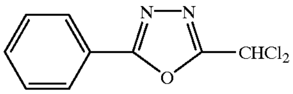
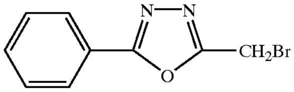
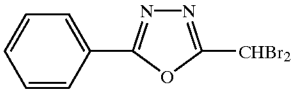
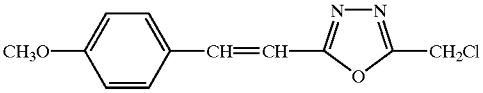
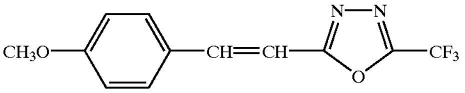
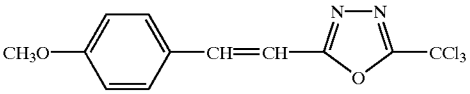
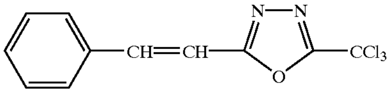
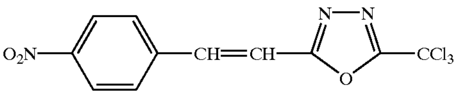
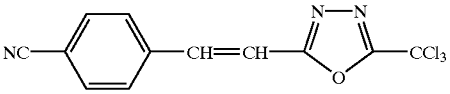
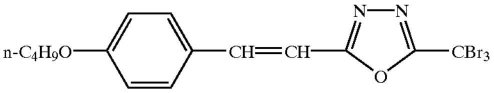
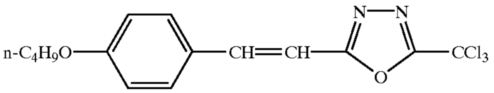

-continued
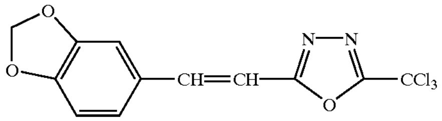
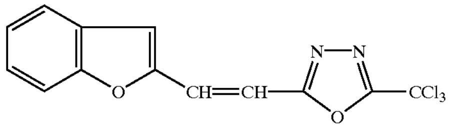
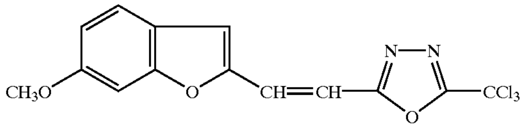
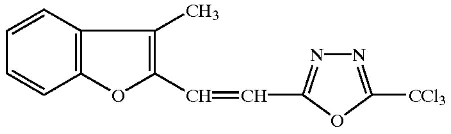
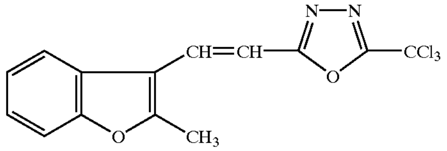
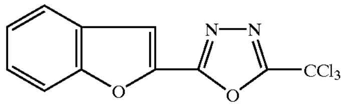
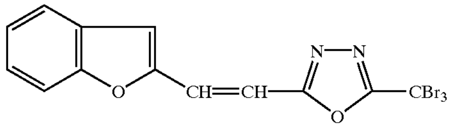
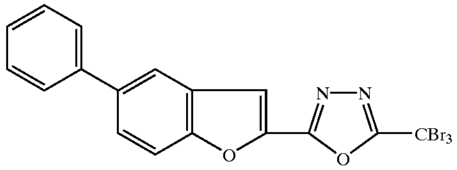
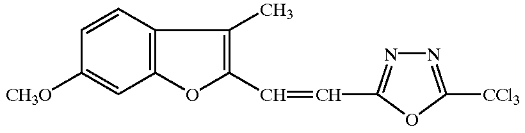
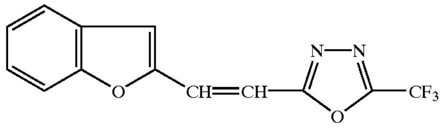
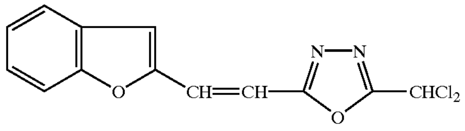
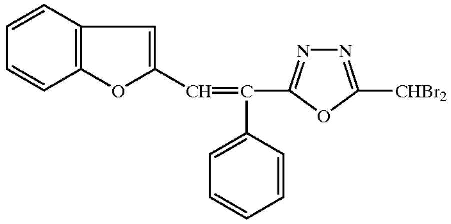
-continued
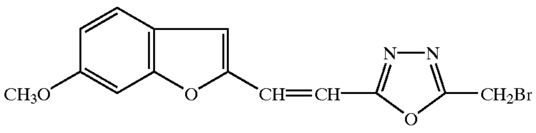
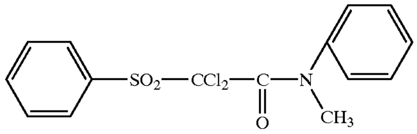
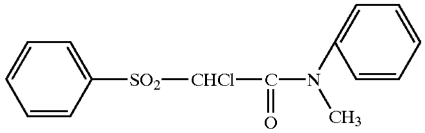
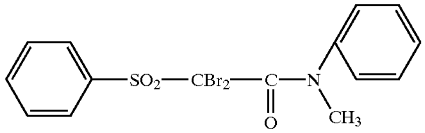
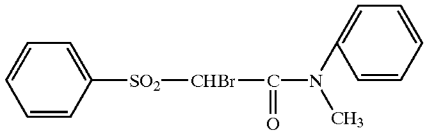
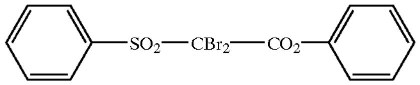
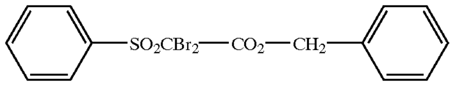
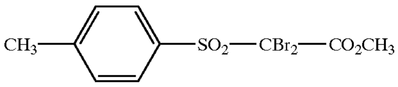
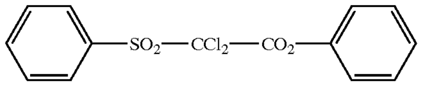
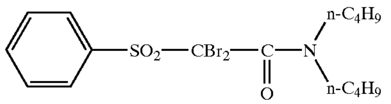
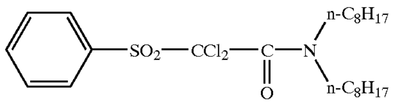
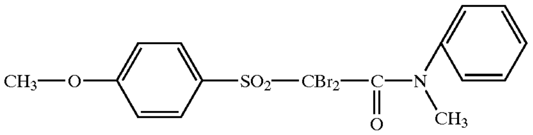
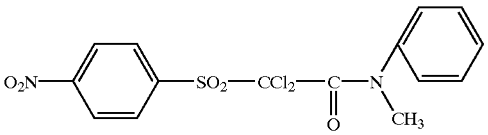
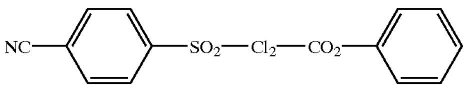
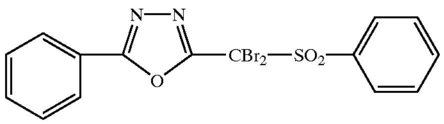

-continued

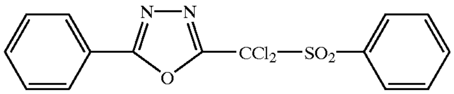

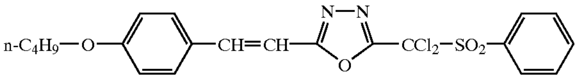

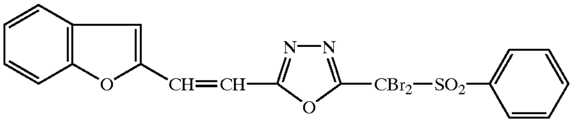

compounds as described in German Patent 2,641,100, for example, 4-(4-methoxystyryl)-6-(3,3,3-trichloropropenyl)-2-pyrrone and 4-(3,4,5-trimethoxystyryl)-6-trichloromethyl-2-pyrrone; compounds as described in German Patent 3,333,450, for example,

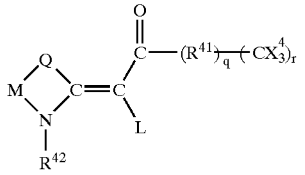

wherein $R^{14}$ represents a benzene ring; and $R^{42}$ represents an alkyl group, an aralkyl group or an alkoxyalkyl group,

| | $R^{42}$ | M | L | q | $(CX^4_3)_r$ |
|---|---|---|---|---|---|
| 1 | $C_2H_5$ | 1,2-phenylene | H | 1 | $4\text{-}CCl_3$ |
| 2 | $CH_2C_6H_5$ | 1,2-phenylene | H | 1 | $4\text{-}CCl_3$ |
| 3 | $C_2H_5$ | 1,2-phenylene | H | 1 | $3\text{-}CCl_3$ |
| 4 | $C_2H_5$ | 1,2-phenylene | H | 1 | $4\text{-}CF_3$ |
| 5 | $C_2H_5$ | $5\text{-}CH_3\text{-}1,2\text{-}$phenylene | H | 0 | $CCl_3$ |
| 6 | $CH_2C_6H_5$ | 1,2-phenylene | H | 0 | $CCl_3$ |
| 7 | $C_2H_4OCH_3$ | 1,2-phenylene | H | 1 | $4\text{-}CCl_3$ |

compounds as described in German Patent 3,021,590, for example,

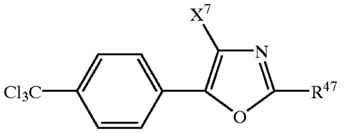

| | $R^{47}$ | $X^7$ |
|---|---|---|
| 1 | 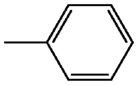 | Cl |
| 2 | 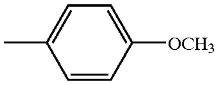 | Cl |
| 3 | 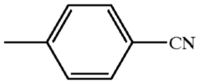 | Cl |

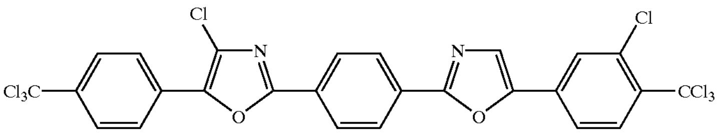

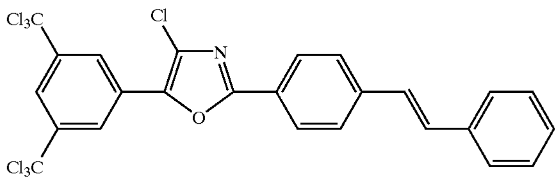

and compounds as described in German Patent 3,021,599, for example,

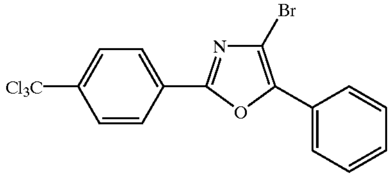

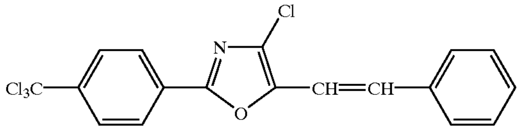

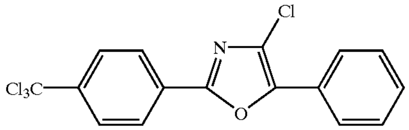

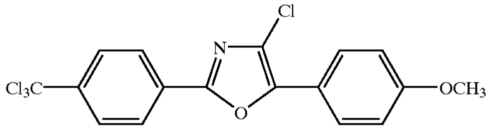

The radical initiators may be preferably employed individually or as a combination of two or more thereof in the present invention.

The radical initiator is a compound that generates a radical by heat energy and initiates and accelerates polymerization of a compound having polymerizable unsaturated group. The radical initiator for use in the present invention can be appropriately selected from known radical initiators and compounds having a bond of small bond dissociation energy as described above. More preferred examples of the radical initiator include onium salts, triazine compounds having a trihalomethyl group, peroxides, azo polymerization initiators, azide compounds, quinonediazide compounds and metallocene compounds, and the following onium salts are particularly preferred because of high sensitivity.

The onium salts preferably used in the present invention include, for example, diazonium salts, iodonium salts, sulfonium salts, ammonium salts and pyridinium salts. Of these onium salts, iodonium salts, diazonium salts and sulfonium salts are more preferably used. In the present invention, the onium salts function not as acid-generating agents but as the initiators of ionic radical polymerization. The onium salts, which are preferably used in the present invention, are those represented by the following formulae (II) to (IV):

[k-60]

$Ar^{11}—I^+—Ar^{12}Z^{11-}$ (II)

$Ar^{21}—N^+\equiv NZ^{21-}$ (III)

(IV)

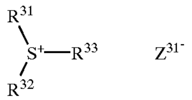

In formula (II), $Ar^{11}$ and $Ar^{12}$ each independently represents an aryl group having not more than 20 carbon atoms, which may have a substituent. When the aryl group has a substituent, preferred examples of the substituent include a halogen atom, a nitro group, an alkyl group having not more than 12 carbon atoms, an alkoxy group having not more than 12 carbon atoms and an aryloxy group having not more than 12 carbon atoms. $Z^{11-}$ represents a counter ion selected from the group consisting of a halogen ion, a perchlorate ion, a tetrafluoroborate ion, hexafluorophosphate ion and a sulfonate ion, and is preferably a perchlorate ion, a hexafluorophosphate ion or an arylsulfonate ion.

In formula (III), $Ar^{21}$ represents an aryl group having not more than 20 carbon atoms, which may have a substituent. Preferred examples of the substituent include a halogen atom, a nitro group, an alkyl group having not more than 12 carbon atoms, an alkoxy group having not more than 12 carbon atoms, an aryloxy group having not more than 12 carbon atoms, an alkylamino group having not more than 12 carbon atoms, a dialkylamino group having not more than 12 carbon atoms, an arylamino group having not more than 12 carbon atoms and a diarylamino group having not more than 12 carbon atoms. $Z^{21-}$ represents a counter ion having the same meaning as defined for $Z^{11-}$.

In formula (IV), $R^{31}$, $R^{32}$ and $R^{33}$, which may be the same or different, each represents a hydrocarbon group having not more than 20 carbon atoms, which may have a substituent. Preferred examples of the substituent include a halogen atom, a nitro group, an alkyl group having not more than 12 carbon atoms, an alkoxy group having not more than 12 carbon atoms and an aryloxy group having not more than 12 carbon atoms. $Z^{31-}$ represents a counter ion having the same meaning as defined for $Z^{11-}$.

Specific examples of the onium salts ([OI-1] to [OI-10]) represented by formula (II), the onium salts ([ON-1] to [ON-5]) represented by formula (III), and the onium salts ([OS-1] to [OS-6]) represented by formula (VI), which can be preferably used in the present invention, are set forth below but the onium salts used in the present invention should not be construed as being limited thereto.

[OI-1]

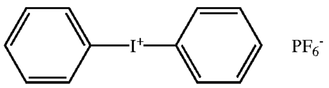

[OI-2]

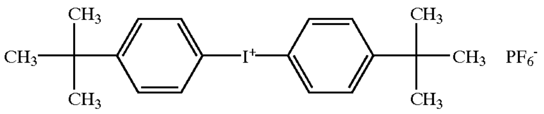

[OI-3]

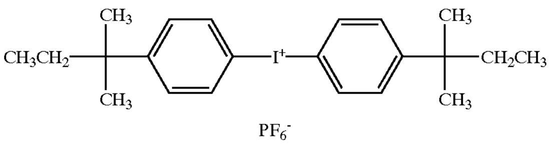

[OI-4]

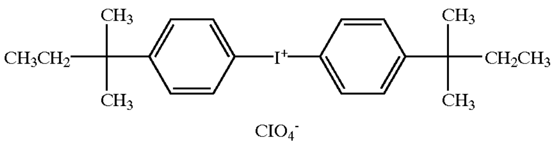

-continued
[OI-5]
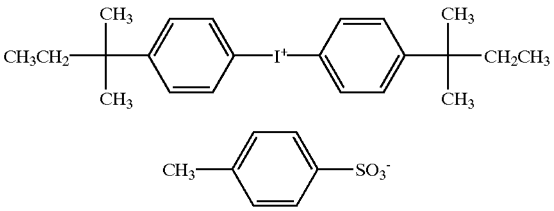
[OI-6]
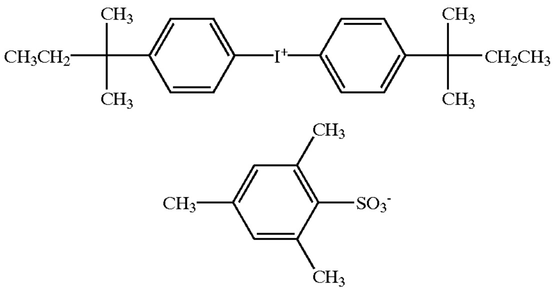
[OI-7]
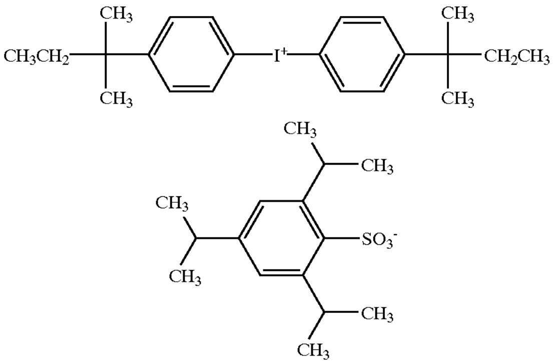
[OI-8]
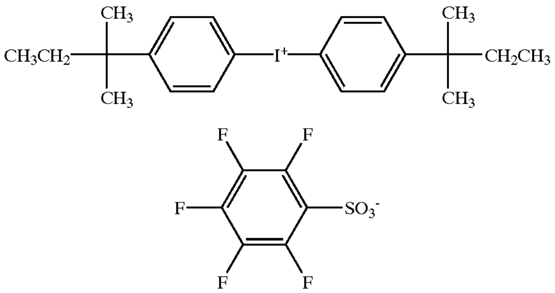
[OI-9]
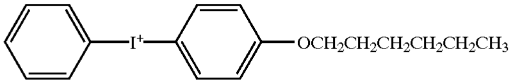
[OI-10]
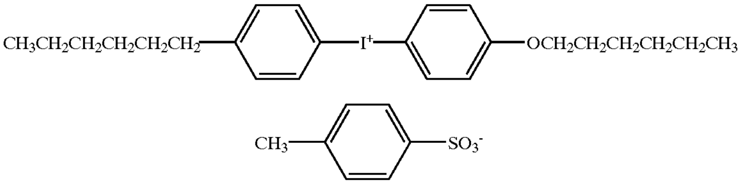
[ON-1]
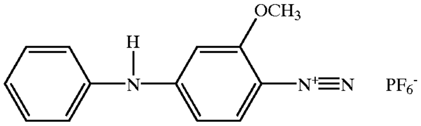
[ON-2]
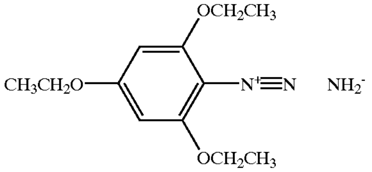
[ON-3]
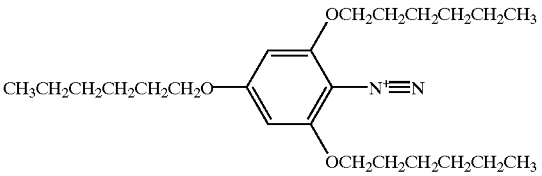
[ON-4]
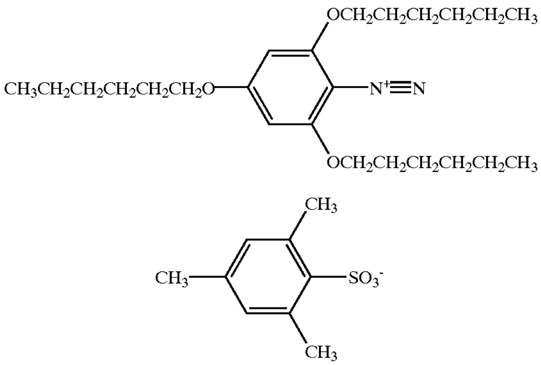

-continued

[ON-5]

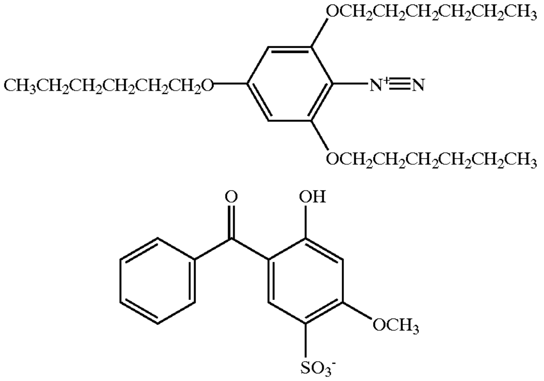

[OS-1]

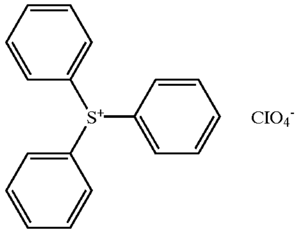

[OS-2]

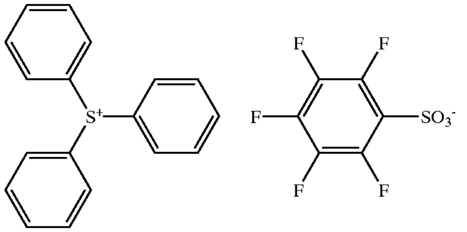

[OS-3]

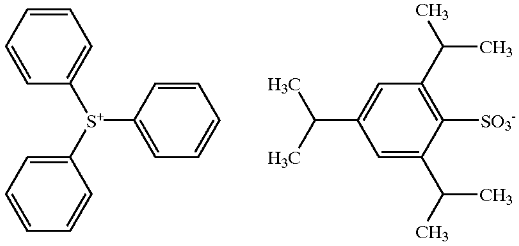

[OS-4]

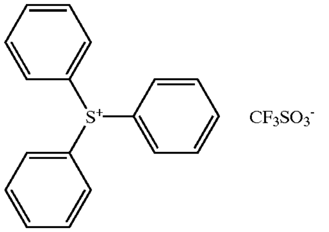

[0S-5]

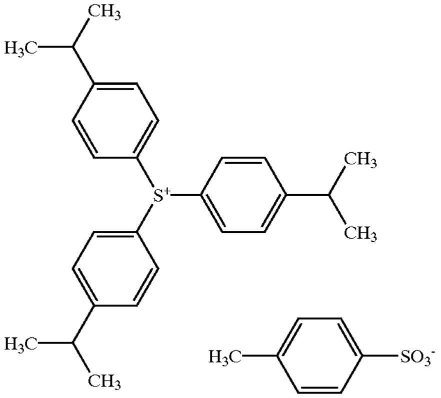

[OS-6]

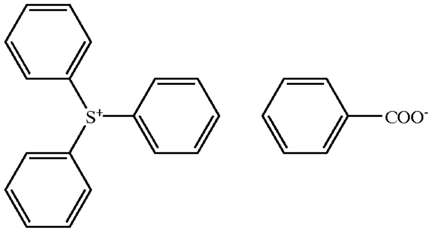

The onium salt for use in the present invention has the maximum absorption wavelength of preferably not longer than 400 nm, and more preferably not longer than 360 nm. By defining the absorption wavelength in the ultraviolet region as described above, the lithographic printing plate precursor can be handled under white light.

The onium salt can be added to the image-forming layer in an amount of from 0.1 to 50% by weight, preferably from 0.5 to 30% by weight, and particularly preferably from 1 to 20% by weight, based on the total solid content of the image-forming layer. When the amount added is less than 0.1% by weight, the sensitivity is lowered, and on the other hand, when the amount added exceeds 50% by weight, stains occur in the non-image areas at printing. The onium salts may be used individually or as a combination of two or more thereof. Also, the onium salt(s) may be incorporated into the fine particles or microcapsules described above. In such a case, water-insoluble onium salt(s) are preferably used. When the onium salt(s) are not incorporated into the fine particles or microcapsules, water-soluble onium salt(s) can be used.

<Infrared Absorbing Dye>

The infrared absorbing dye for use in the present invention includes dyes and pigments.

Preferred examples of the infrared absorbing dye include cyanine dyes as described, for example, in JP-A-58-125246, JP-A-59-84356, JP-A-59-202829 and JP-A-60-78787, and cyanine dyes as described in British Patent 434,875.

Other preferred examples of the infrared absorbing dye include near infrared absorbing sensitizers as described in U.S. Pat. No. 5,156,938, substituted arylbenzo(thio) pyrylium salts as described in U.S. Pat. No. 3,881,924, trimethinethiapyrylium salts as described in JP-A-57-142645 (U.S. Pat. No. 4,327,169), pyrylium compounds as described in JP-A-58-181051, JP-A-58-220143, JP-A-59-41363, JP-A-59-84248, JP-A-59-84249, JP-A-59-146063 and JP-A-59-146061, cyanine dyes as described in JP-A-59-216146, pentamethinethiopyrylium salts as described in U.S. Pat. No. 4,283,475, and pyrylium compounds as described in JP-B-5-13514 and JP-B-5-19702.

Other preferred examples of the infrared absorbing dye include near infrared absorbing dyes represented by formulae (I) and (II) in U.S. Pat. No. 4,756,993, and phthalocyanine dyes as described in EP-A-916,513.

Anionic infrared absorbing dyes as described in JP-A-11-338131 are also preferably used. The anionic infrared absorbing dye means a dye that does not have a cation structure in the dye skeleton substantially absorbing an infrared ray and has an anion structure. The anionic infrared absorbing dye includes, for example, (c1) anionic metal complex, (c2) anionic carbon black, (c3) anionic phthalocyanine, and (c4) compound represented by formula (1) shown below. A counter cation of the anionic infrared absorbing dye is a monovalent or polyvalent cation containing a proton.

$$[G_a^- \text{-M-} G_b]_m X^{m+} \qquad (1)$$

The anionic metal complex (c1) is a complex in which the center metal and ligand thereof substantially absorbing light form an anion, as a whole.

The anionic carbon black (c2) includes carbon black having bonded thereto an anion group, for example, sulfonic acid, carboxylic acid or phosphonic acid, as a substituent. In order to introduce the anion group into carbon black, for example, a method of oxidizing carbon black with the desired acid as described in Carbon Black Kyokai ed., *Carbon Black Binran*, Third Edition, page 12, Carbon Black Kyokai (Apr. 5, 1995) can be employed.

The anionic phthalocyanine (c3) is a compound in which the anion group as described in the anionic carbon black (c2) is bonded to a phthalocyanine skeleton as a substituent to form an anion, as a whole.

The compound (c4) represented by formula (1) will be described in detail below.

In formula (1) above, $G_a^-$ represents an anionic substituent; $G_b$ represents a neutral substituent; $X^{m+}$ represents a one- to m-valent cation containing a proton; m represents an integer of from 1 to 6; and M represents a conjugate chain. The conjugate chain may contain a substituent and/or a cyclic structure. The conjugate chain is represented by the following formula:

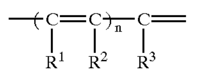

wherein $R^1$, $R^2$ and $R^3$ each independently represents a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group, or $R^1$, $R^2$ and $R^3$ may combine with each other to form a cyclic structure; and n represents an integer of from 1 to 8.

Of the anionic infrared absorbing dyes represented by formula (1), the following compounds A-1 to A-5 are preferably used.

A-1

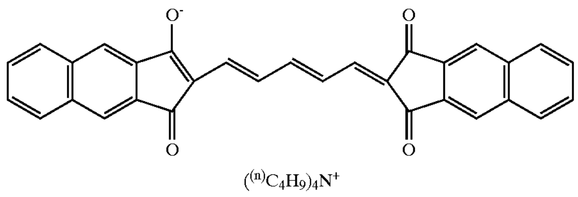

A-2

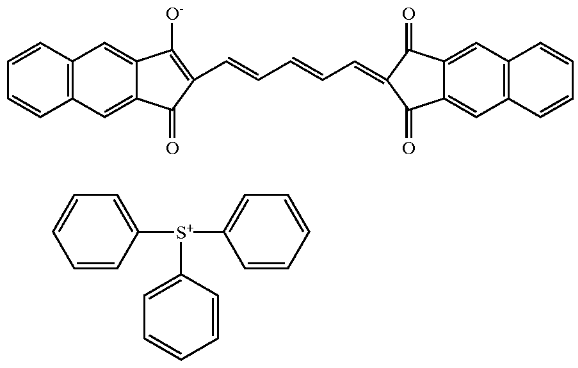

A-3

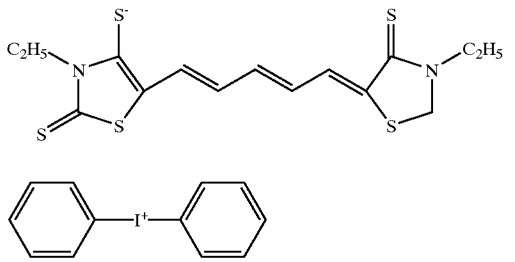

A-4

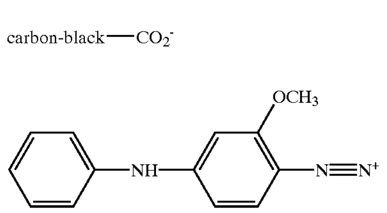

A-5

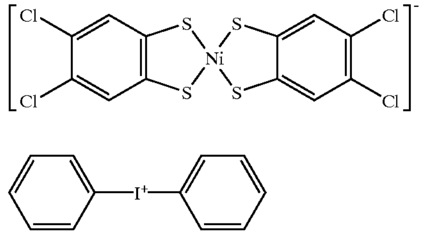

The following cationic infrared absorbing dyes CA-1 to CA-44 are also preferably employed.

CA-1
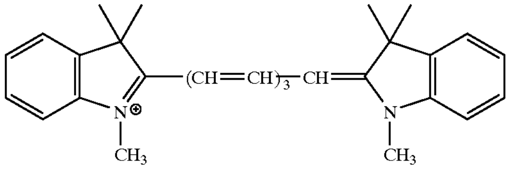
$T^{\ominus}$
CA-2
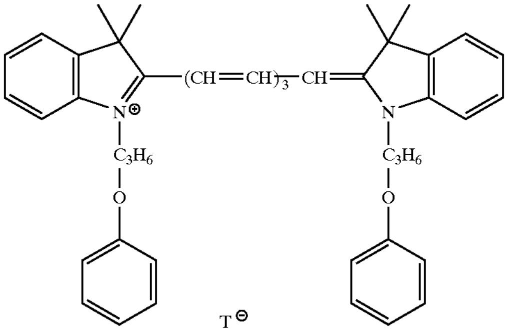
$T^{\ominus}$
CA-3
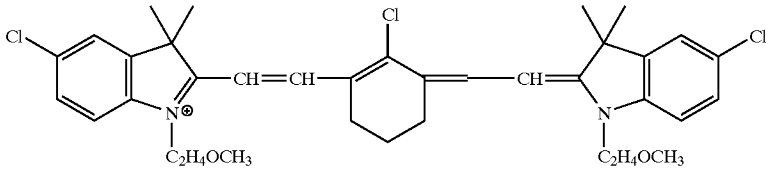
$T^{\ominus}$
CA-4
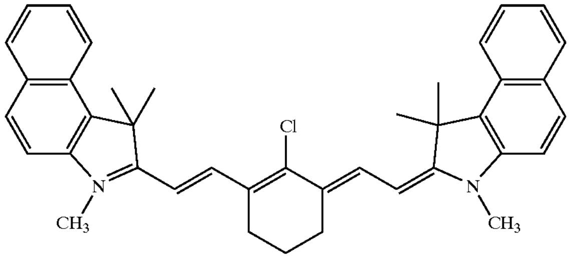
$T^{\ominus}$
CA-5
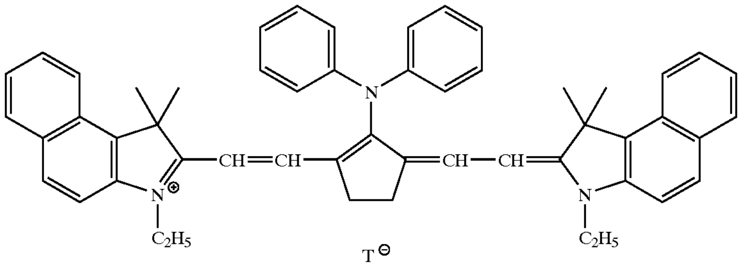
$T^{\ominus}$
CA-6
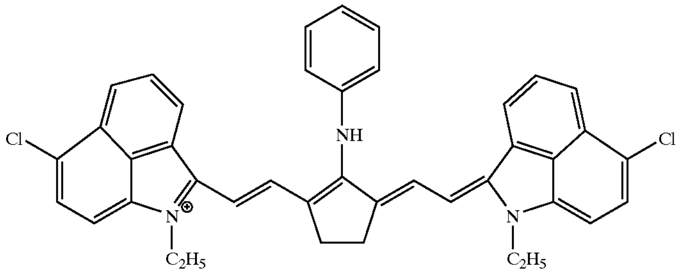
$T^{\ominus}$ -continued
CA-7
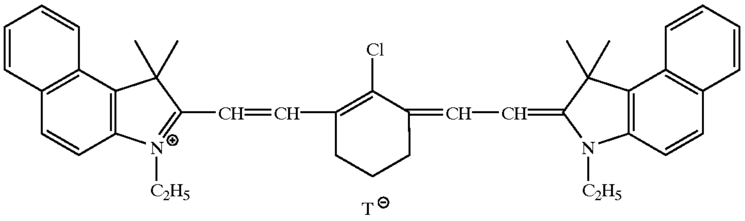
CA-8
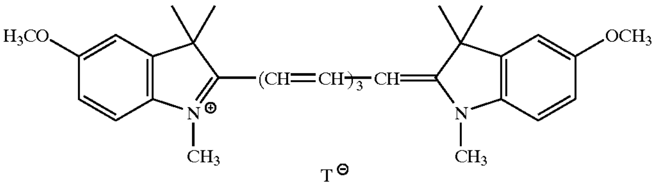
CA-9
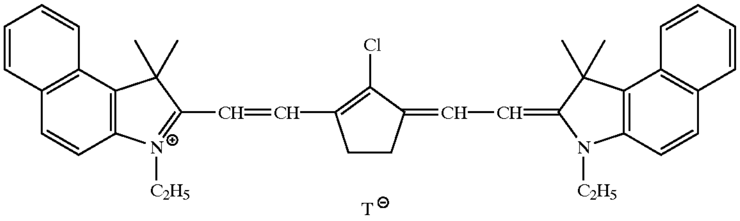
CA-10
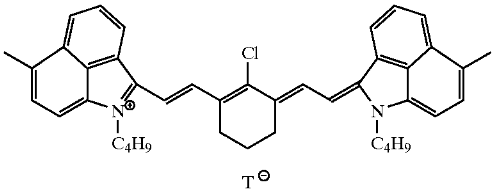
CA-11
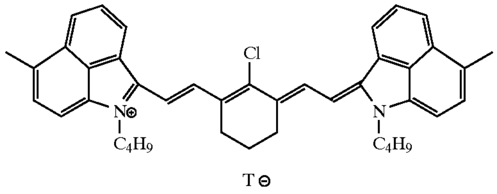
CA-12
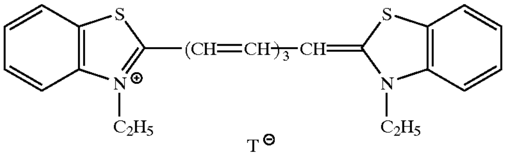
CA-13
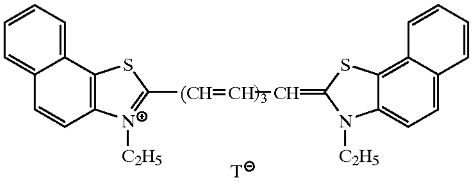
CA-14
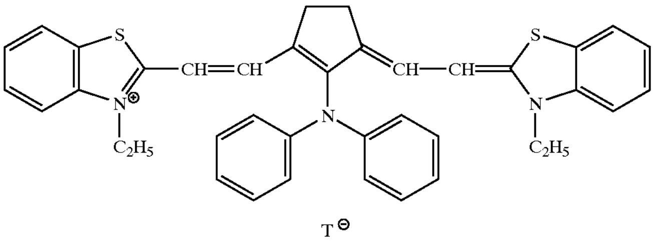
CA-15
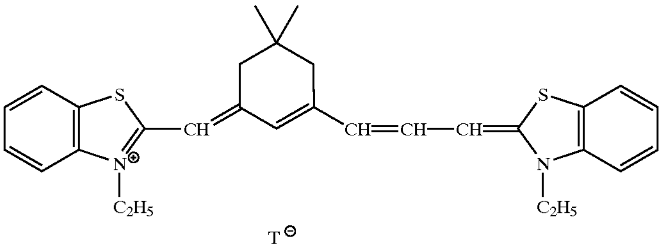

-continued
CA-16
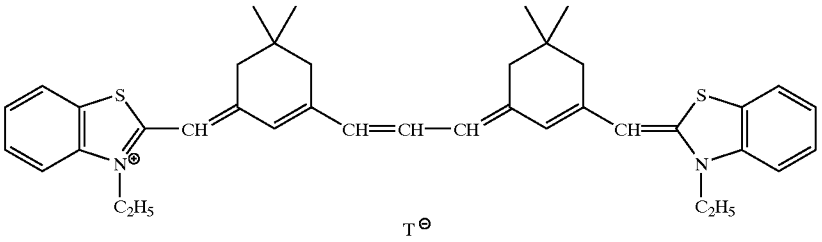
CA-17
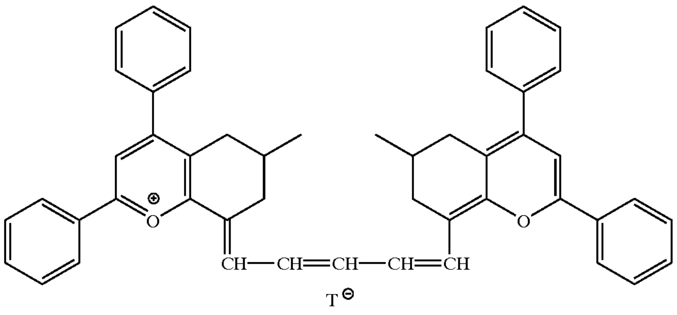
CA-18
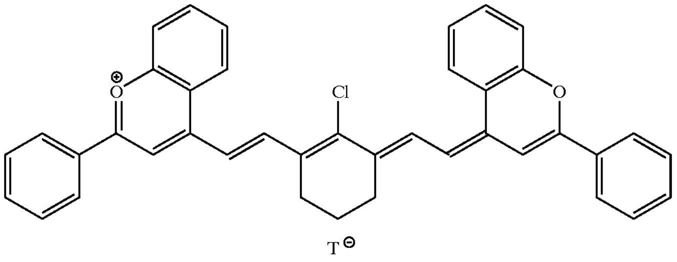
CA-19
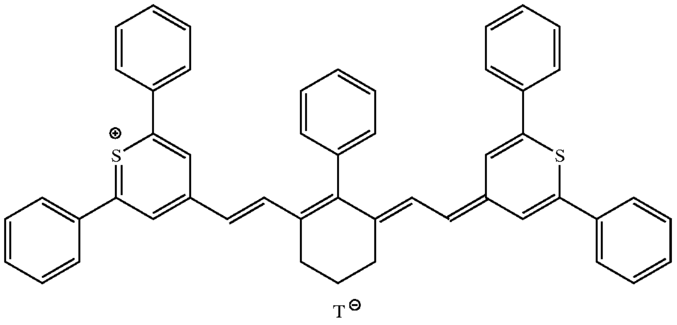
CA-20
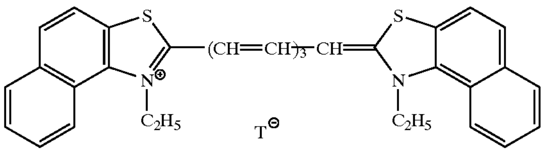
CA-21
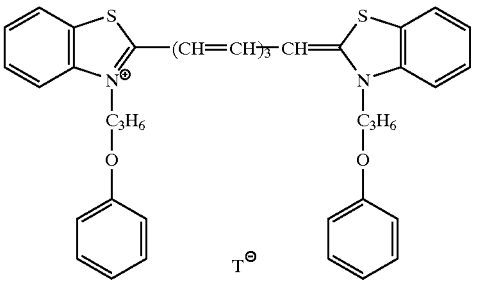

-continued
CA-22
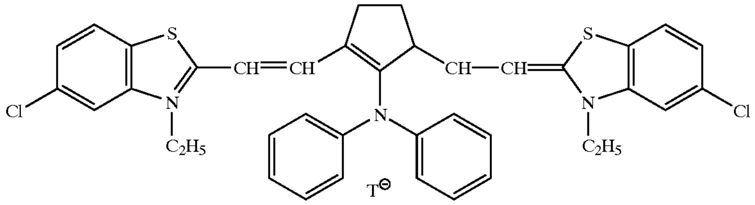
CA-23
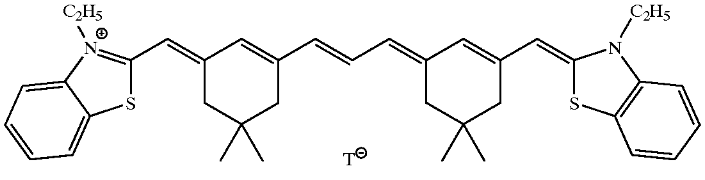
CA-24
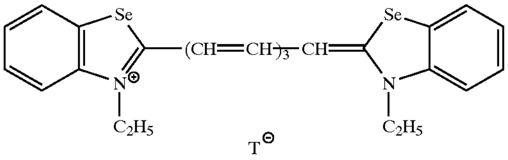
CA-25
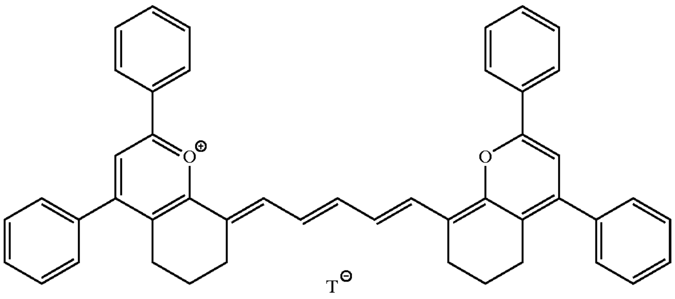
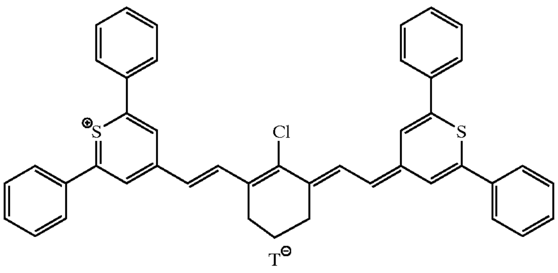
CA-26
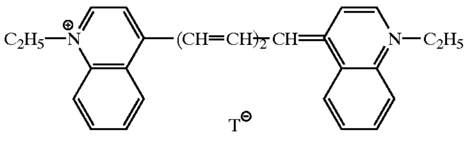
CA-28
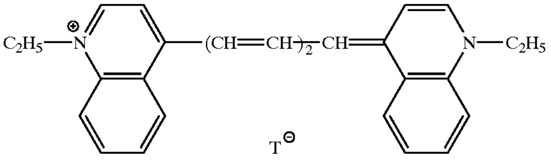
CA-29
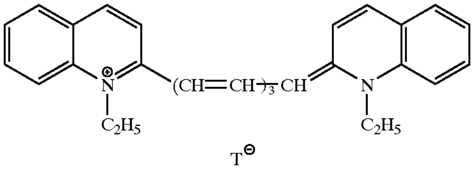

-continued
CA-30
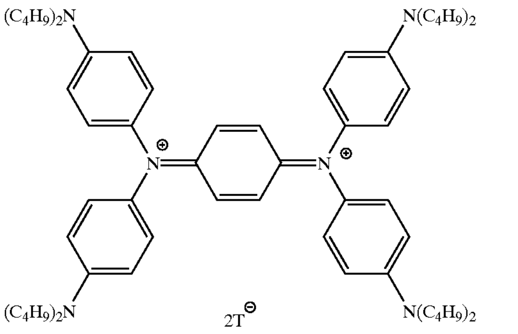
CA-31
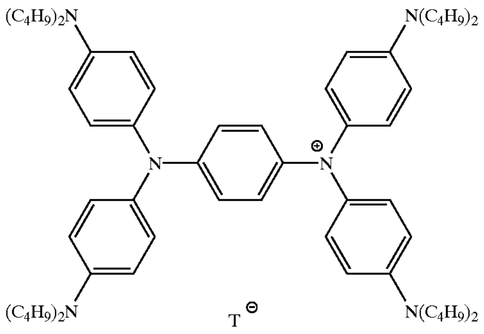
CA-32
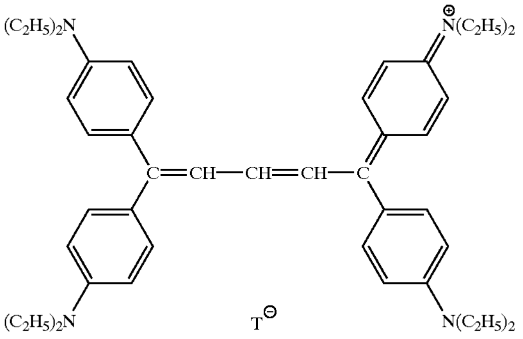
CA-33
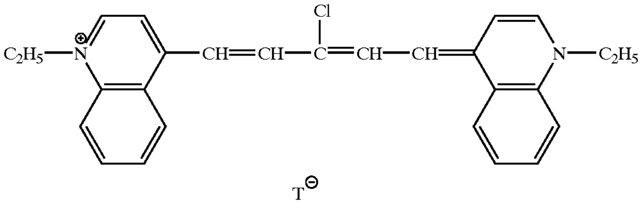
CA-34
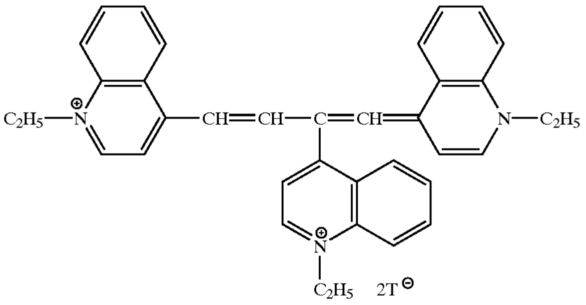
CA-35
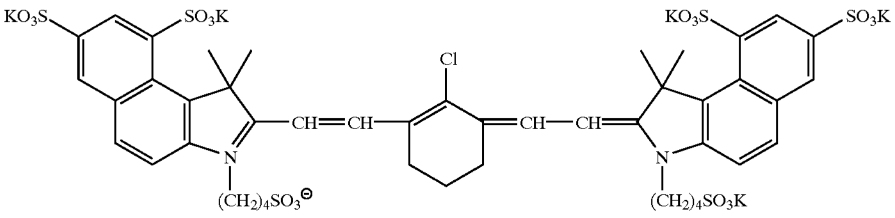

-continued
CA-36
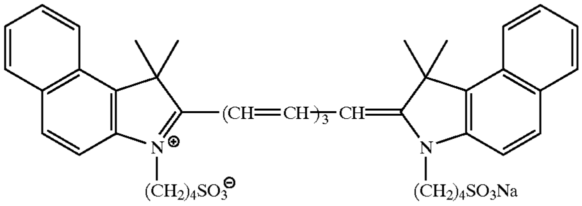
CA-37
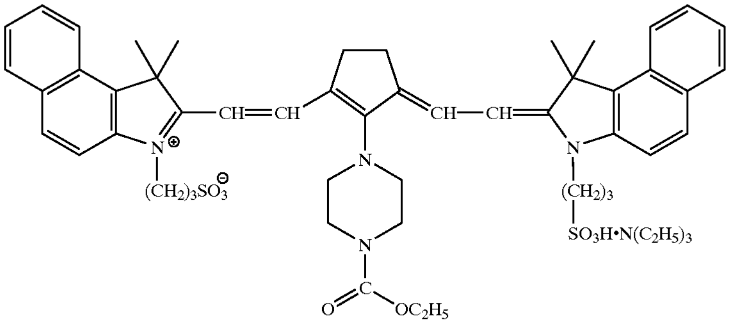
CA-38
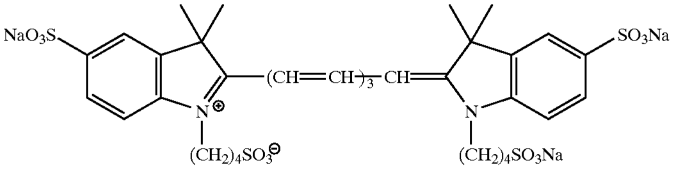
CA-39
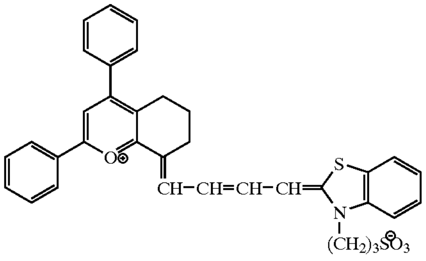
CA-40
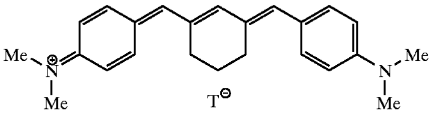
CA-41
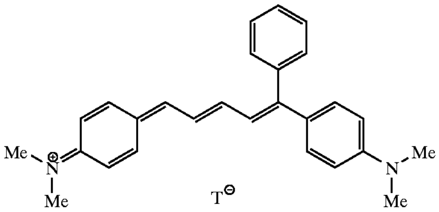
CA-42
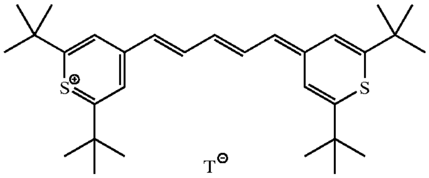
CA-43
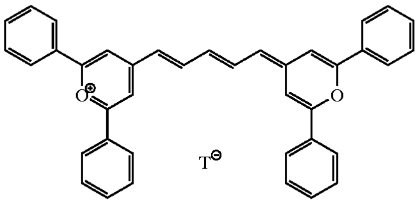

-continued

CA-44

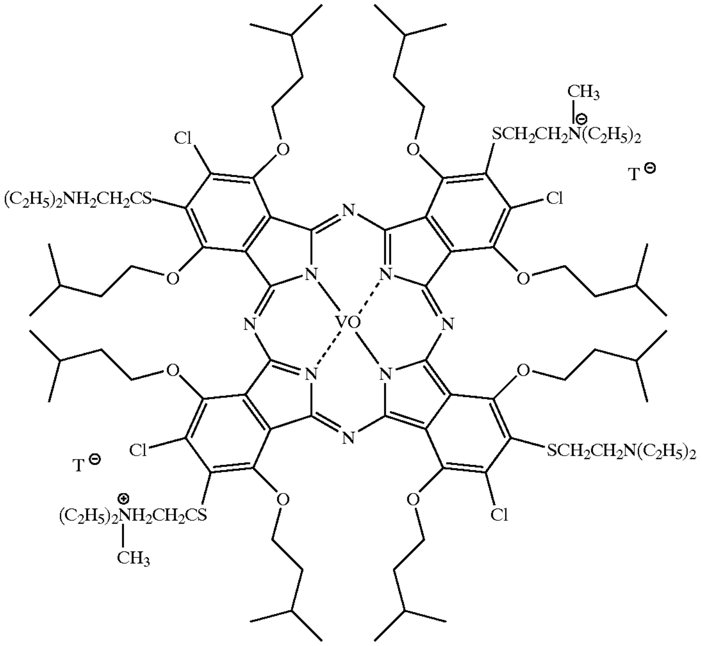

In the above-described formulae, $T^-$ represents a monovalent counter anion, preferably a halogen anion (e.g., $F^-$, $Cl^-$, $Br^-$ or $I^-$), a Lewis Acid anion (e.g., $BF_4^-$, $PF_6^-$, $SbCl_6^-$ or $ClO_4^-$), an alkylsulfonic acid anion or an arylsulfonic acid anion.

The alkyl group in the alkylsulfonic acid includes a straight chain, branched or cyclic alkyl group having from 1 to 20 carbon atoms. Specific examples thereof include methyl, ethyl, propyl, butyl, pentyl, hexyl, heptyl, octyl, nonyl, decyl, undecyl, dodecyl, tridecyl, hexadecyl, octadecyl, eicosyl, isopropyl, isobutyl, sec-butyl, tert-butyl, isopentyl, neopentyl, 1-methylbutyl, isohexyl, 2-ethylhexyl, 2-methylhexyl, cyclohexyl, cyclopentyl and 2-norbornyl groups. Of the alkyl groups, a straight chain alkyl group having from 1 to 12 carbon atoms, a branched alkyl group having from 3 to 12 carbon atoms and a cyclic alkyl group having from 5 to 10 carbon atoms are preferred.

The aryl group in the arylsulfonic acid includes an aryl group composed of one benzene ring, an aryl group formed by condensing two or three benzene rings and an aryl group formed by condensing a benzene ring and a 5-membered unsaturated ring. Specific examples of the aryl group include phenyl, naphthyl, anthryl, phenanthryl, indenyl, acenaphthenyl and fluorenyl groups. A phenyl group and a naphthyl group are preferred.

Further, the following nonionic infrared absorbing dyes NA-1 to NA-12 are also preferably employed.

NA-1

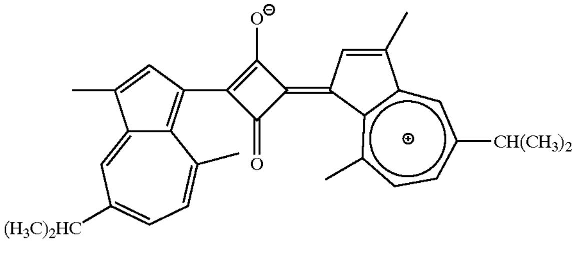

NA-2

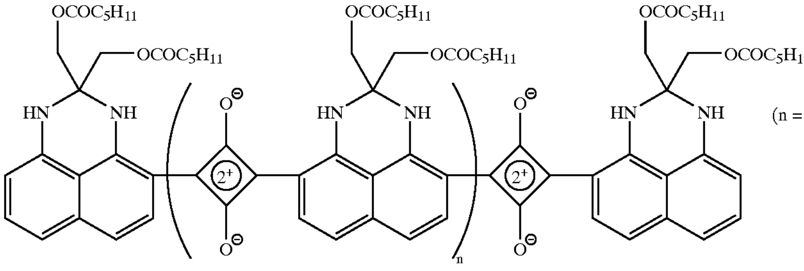

(n = 1,2)

-continued
NA-3
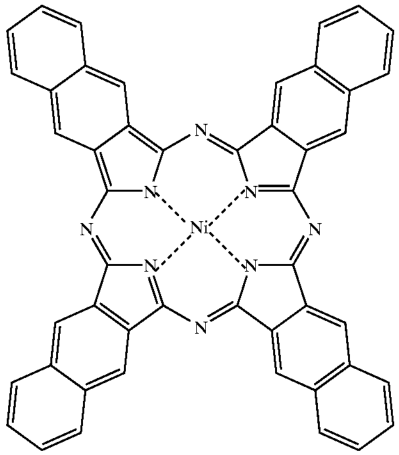
NA-4
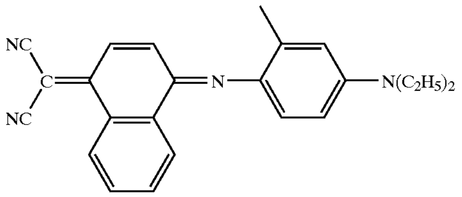
NA-5
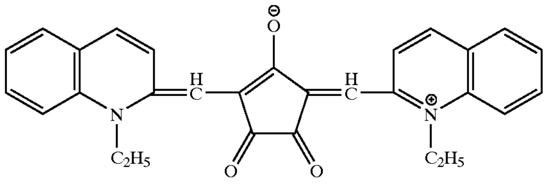
NA-6
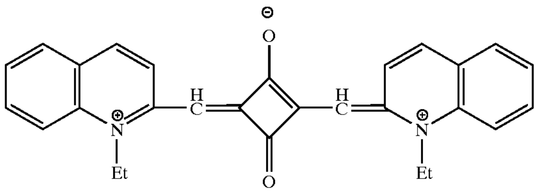
NA--7
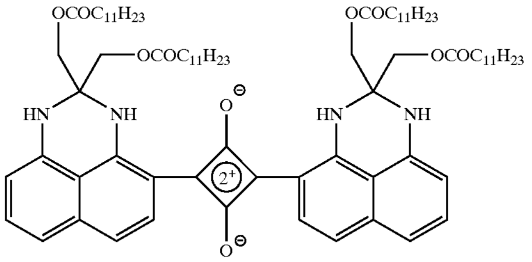
NA-8
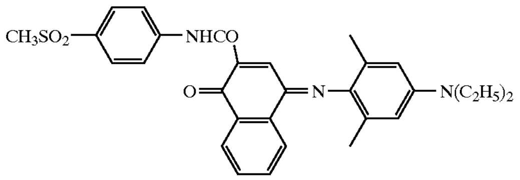
NA-9
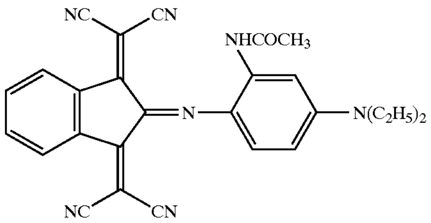
NA-10
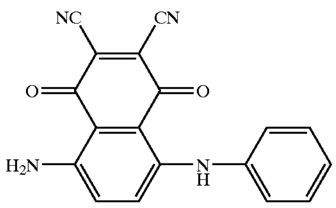

-continued

NA-11

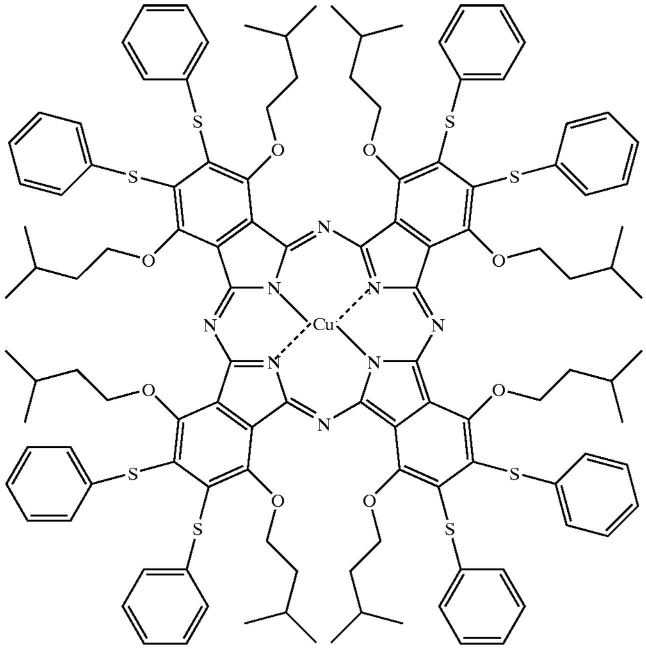

NA-12

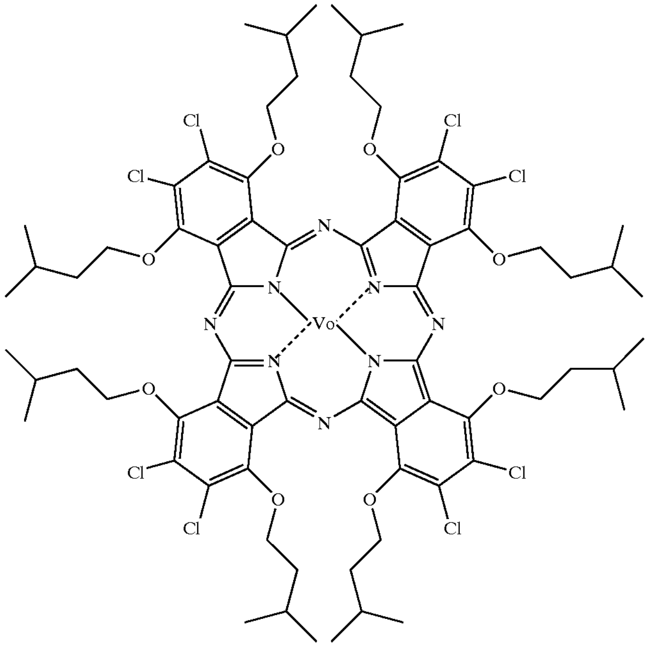

Of the specific compounds described above, A-1 is particularly preferred as the anionic infrared absorbing dye, CA-7, CA-30, CA-40 and CA-42 are particularly preferred as the cationic infrared absorbing dyes, and NA-11 is particularly preferred as the nonionic infrared absorbing dye.

Commercially available dyes and known dyes as described, for example, in Yuki Gosei Kagaku Kyokai ed., *Senryo Binran* (1970) may also employed. Specific examples of the dye include an azo dye, a metal complex azo dye, a pyrazolone azo dye, a naphthoquinone dye, an anthraquinone dye, a phthalocyanine dye, a carbonium dye, a quinoneimine dye, a methine dye, a diimmonium dye, an aminium dye, a squarylium dye, and a metal thiolate complex.

Pigments used as the sensitizing dyes include commercially available pigments and pigments described in *Colour Index* (*C.I.*), Nippon Ganryo Gijutsu Kyokai ed., *Saishin Ganryo Binran* (1977), *Saishin Ganryo Oyo Gijutsu*, CMC Publishing Co. (1986) and *Insatsu Ink Gijutsu*, CMC Publishing Co. (1984). The pigments include black pigment, yellow pigment, orange pigment, brown pigment, red pigment, purple pigment, blue pigment, green pigment, fluorescent pigment, metal powder pigment, and polymer-bonding dye. Specific examples of the pigment include an insoluble azo pigment, an azo lake pigment, a condensed azo pigment, a chelate azo pigment, a phthalocyanine pigment, an anthraquinone pigment, a perylene pigment, a perinone pigment, a thioindigo pigment, a quinacridone pigment, a dioxazine pigment, an isoindolinone pigment, a quinophthalone pigment, a Reichardt's dye, an azine pigment, a nitroso pigment, a nitro pigment, a natural pigment, a fluorescent pigment, an organic pigment, and carbon black. Of the pigments, carbon black is preferably used.

The pigment may be used without surface treatment or the pigment subjected to the surface treatment may be used. Methods of the surface treatment include coating a resin or wax on the surface of pigment, adhering a surface active agent to the surface of pigment and bonding a reactive substance (e.g., a silane coupling agent, an epoxy compound or a polyisocyanate) to the surface of pigment. The methods of surface treatment are described in *Kinzoku Sekken no Seishitu to Oyo*, Miyuki Shobo, *Insatsu Ink Gijutsu*, CMC Publishing Co. (1984) and *Saishin Ganryo Oyo Gijutsu*, CMC Publishing Co. (1986).

A particle size of the pigment is preferably from 0.01 to 10 $\mu$m, more preferably from 0.05 to 1 $\mu$m, and particularly preferably from 0.1 to 1 $\mu$m. When the particle size of pigment is less than 0.01 $\mu$m, the dispersion stability of pigment in a coating solution for the image-forming layer is inferior. On the other hand, the particle size exceeding 10 $\mu$m is not preferred in view of the uniformity of the image-forming layer.

Known dispersing technique used in the production of ink and toner can be utilized for dispersing the pigment. A dispersing machine, for example, an ultrasonic dispersing device, a sand mill, an attritor, a pearl mill, a super mill, a ball mill, an impeller, a disperser, a KD mill, a colloid mill, Dynatron, a three-roll mill or a pressure kneader can be used for dispersion. Details thereof are described in *Saishin Ganryo Oyo Gijutsu*, CMC Publishing Co. (1986).

In the lithographic printing plate precursor according to the present invention, a polymethine dye, for example, a cyanine dye or a (thio)pyrylium dye is used as the particularly preferred infrared absorbing dye from the viewpoints of the absorption wavelength aptitude, solubility, stability and image-forming property. The polymethine dye is ordinarily a cation dye wherein the chromophore has a positive charge, but as a betaine-type dye having also a negative charge in the chromophore, a polymethine dye having a squarylium skeleton or a croconium skeleton incorporated into the polymethine chain thereof can also be used.

Of the cyanine dyes, a cyanine dye having the partial structure represented by the following formula (2) is more preferred.

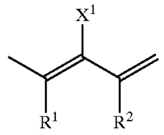

(2)

In formula (2), $R^1$ and $R^2$ each independently represents a hydrogen atom or a hydrocarbon group having from 1 to 12 carbon atoms, or $R^1$ and $R^2$ may combine with each other to form a ring structure. As the ring formed, a 5-membered ring or a 6-membered ring is particularly preferred.

In formula (2), $X^1$ represents a halogen atom or a substituent represented by the following formula (3), (4), (5) or (6):

$$—X^2\text{-}L^1 \quad (3)$$

In formula (3), $X^2$ represents an oxygen atom or a sulfur atom; and $L^1$ represents a hydrocarbon group having from 1 to 12 carbon atoms.

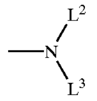

(4)

In formula (4), $L^2$ and $L^3$, which may be the same or different, each represents an aromatic hydrocarbon group having from 6 to 10 carbon atoms, which may have a substituent, an alkyl group having from 1 to 8 carbon atoms, which may have a substituent, or a hydrogen atom, or $L^2$ and $L^3$ may combine with each other to form a ring having the following structure:

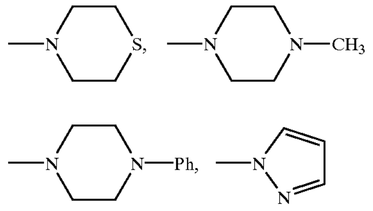

Of these groups, the aromatic hydrocarbon group, for example, a phenyl group is preferred for $L^2$ or $L^3$.

$$—S\text{-}L^4 \quad (5)$$

In formula (5), $L^4$ represents a monocyclic or polycyclic heterocyclic group having at least one of a nitrogen atom, an oxygen atom and a sulfur atom, and is preferably the heterocyclic group selected from the group consisting of a thiazole group, a benzothiazole group, a naphthothiazole group, a thianaphtheno-7',6',4,5-thiazole group, an oxazole group, a benzoxazole group, a naphthoxazole group, a selenazole group, a benzoselenazole group, a naphthoselenazole group, a thiazoline group, a 2-quinoline group, a 4-quinoline group, a 1-isoquinoline group, a 3-isoquinoline group, a benzimidazole group, a 3,3-dialkylbenzindolenine group, a 2-pyridine group, a 4-pyridine group, a 3,3-dialkylbenz[e]indole group, a tetrazole group, a triazole group, a pyrimidine group, and a thiadiazole group. Particularly preferred heterocyclic groups include those having the following structures:

(6)

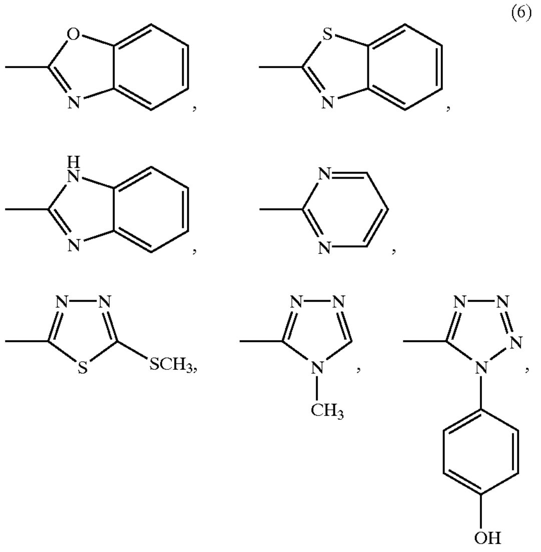

-continued

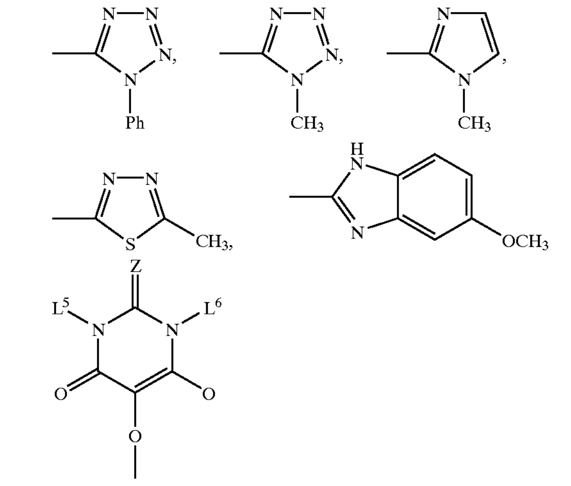

In formula (6), $L^5$ and $L^6$, which may be the same or different, each represents a hydrogen atom, an allyl group, a cyclohexyl group or an alkyl group having from 1 to 8 carbon atoms; and Z represents an oxygen atom or a sulfur atom.

Of the cyanine dyes having the partial structure shown by formula (2) described above, which are preferably used in the invention, a heptamethinecyanine dye represented by formula (7) shown below having an indolenine skeleton, a benzindolenine skeleton, a benzothiazole skeleton, a benzoxazole skeleton or a benzoselenazole skeleton is particularly preferred in view of the absorption wavelength aptitude.

(7)

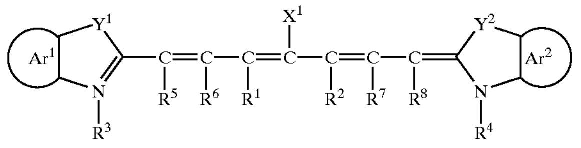

In formula (7), $X^1$, $R^1$ and $R^2$ have the same meanings as defined in formula (2) above, respectively. $Ar^1$ and $Ar^2$, which may be the same or different, each represents an aromatic hydrocarbon group which may has a substituent. Preferred examples of the aromatic hydrocarbon group include a benzene ring and a naphthalene ring. Preferred examples of the substituent include a hydrocarbon group having not more than 12 carbon atoms, a halogen atom, an alkoxy group having not more than 12 carbon atoms, a carboxyl group and a sulfo group. $Y^1$ and $Y^2$ which may be the same or different, each represents an oxygen atom, a sulfur atom, a selenium atom or a dialkylmethylene group having not more than 12 carbon atoms. $R^3$ and $R^4$, which may be the same or different, each represents a hydrocarbon group having not more than 20 carbon atoms, which may has a substituent. Preferred examples of the substituent include an alkoxy group having not more than 12 carbon atoms, a carboxy group and a sulfo group. $R^5$, $R^6$, $R^7$ and $R^8$, which may be the same or different, each represents a hydrogen atom or a hydrocarbon group having not more than 12 carbon atoms. From the standpoint of availability of raw materials, a hydrogen atom is preferred. $Z^{1-}$ represents a counter anion. However, when one of $R^1$ to $R^8$ is substituted with a sulfo group, $Z^{1-}$ is unnecessary. In view of storage stability of the coating solution for image-forming layer, $Z^{1-}$ is preferably a halogen ion, a perchlorate ion, a tetrafluoroborate ion, a hexafluorophosphate ion or a sulfonate ion, and particularly preferably a perchlorate ion, a hexafluorophosphate ion or an arylsulfonate ion.

Other examples of the dyes having a betaine skeleton include dyes represented by the following formulae (8) and (9):

(8)

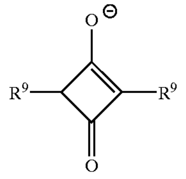

In formula (8), $R^9$ represents a substituent selected from the groups shown below, wherein $R^{14}$ and $R^{15}$ each represents an alkyl group having from 1 to 8 carbon atoms; and $Y^3$ represents an oxygen atom or a sulfur atom.

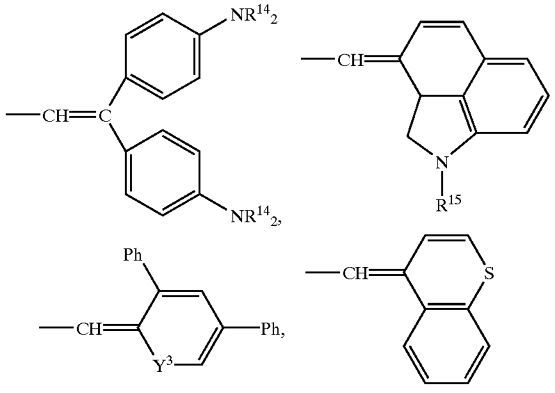

(9)

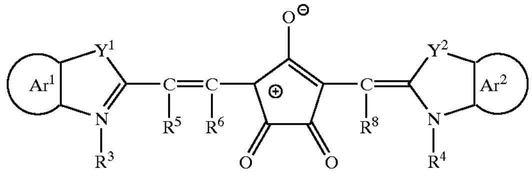

In formula (9), $R^3$ to $R^8$, $Ar^1$, $Ar^2$, $Y^1$ and $Y^2$ have the same meanings as defined in formula (7) above, respectively.

Of the dyes having the chromophore as described above, the cyanine dyes having the partial structure represented by formula (2) are preferred, and of these cyanine dyes, the heptamethinecyanine dyes represented by formula (7) are particularly preferred.

The above-described infrared absorbing dyes can be prepared according to known organic synthesis techniques. Specific synthesis methods are described in U.S. Pat. No. 5,441,866, *Zh. Org. Khim.*, Vol. 28, No. 10, pages 2159 to 2164 (1992) and EP-A-464,543.

Of these dyes, the infrared absorbing dyes (light-heat converting agents), which are preferably added to a hydrophilic matrix of a hydrophilic resin in the image-forming layer, are water-soluble dyes and specific examples thereof are set forth below.

(IR-1)
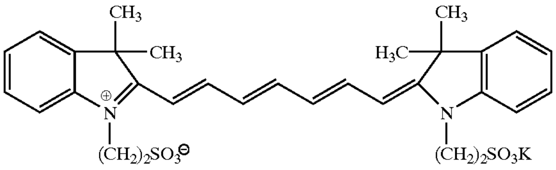
(IR-2)
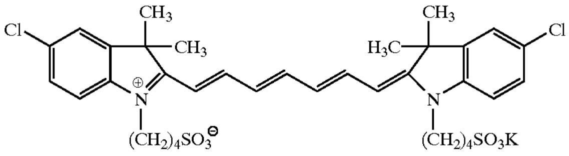
(IR-3)
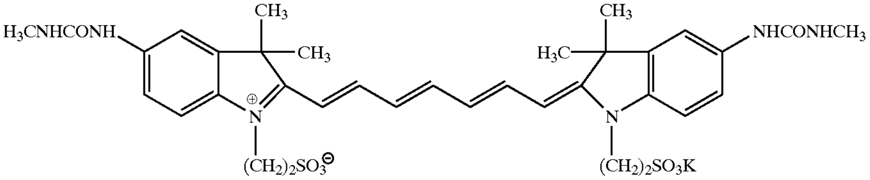
(IR-4)
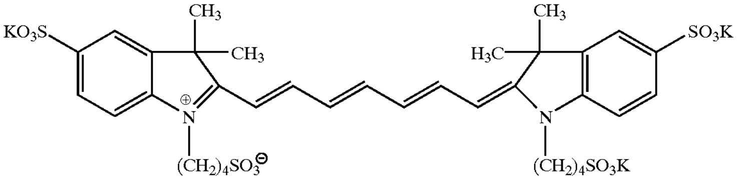
(IR-5)
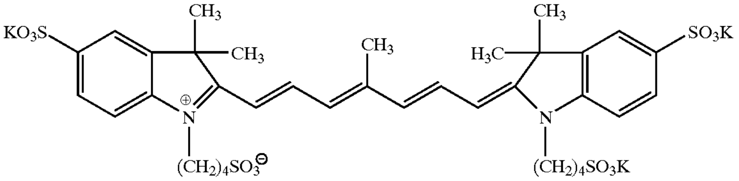
(IR-6)
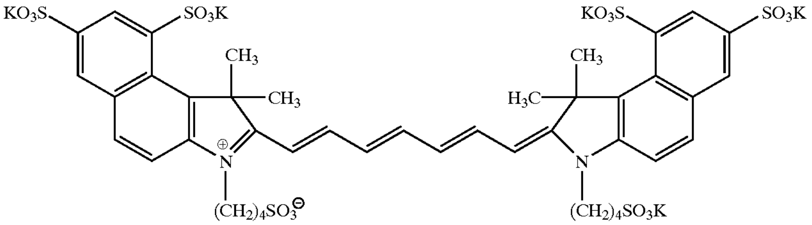
(IR-7)
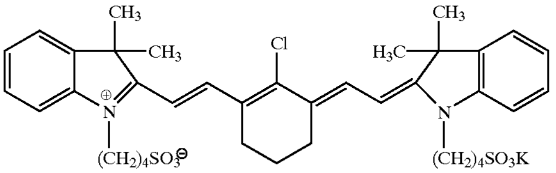
(IR-8)
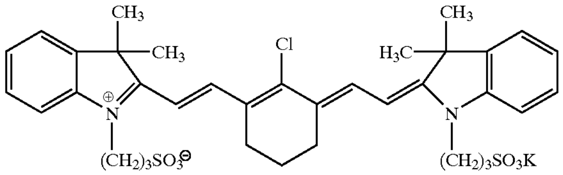
(IR-9)
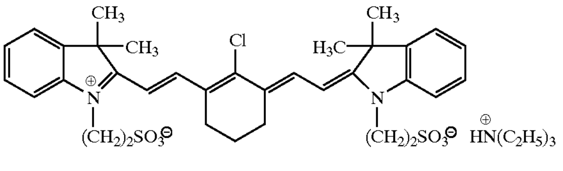
(IR-10)
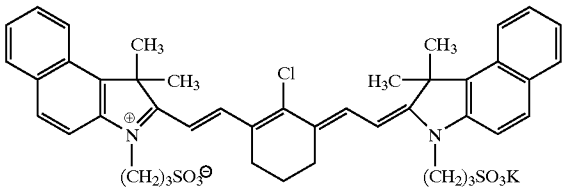

-continued (IR-11)

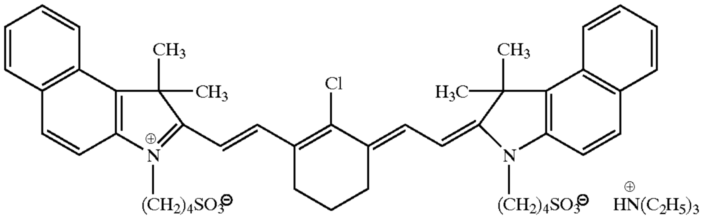

The light-heat converting agents, which are preferably added to the fine particles or microcapsules in the image-forming layer according to the present invention, may be the above-described infrared absorbing dyes, but are preferably lipophilic dyes. Specific examples of the lipophilic dyes include the following dyes:

IR21

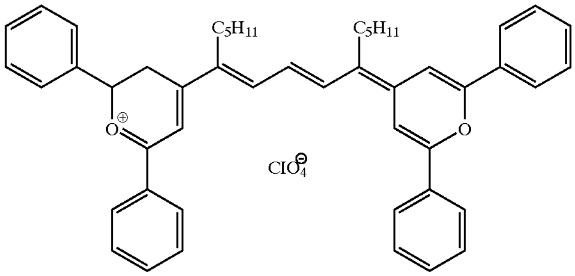

IR22

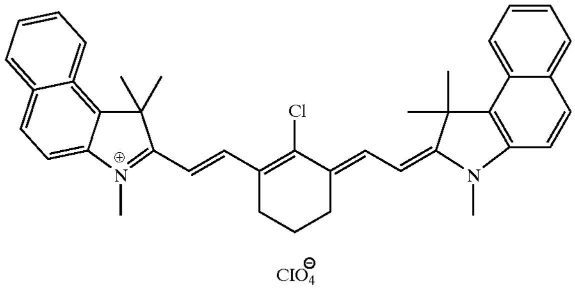

IR23

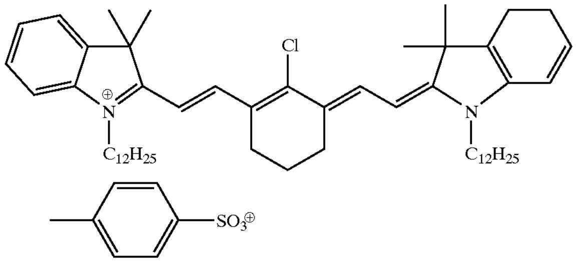

IR24

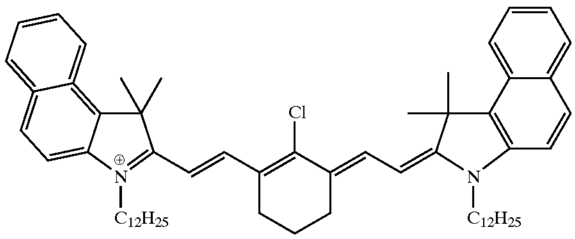

-continued

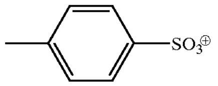

IR25

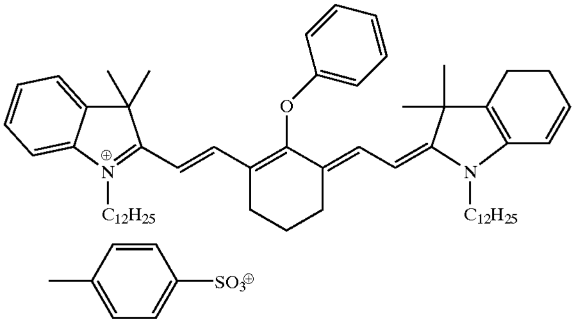

IR26

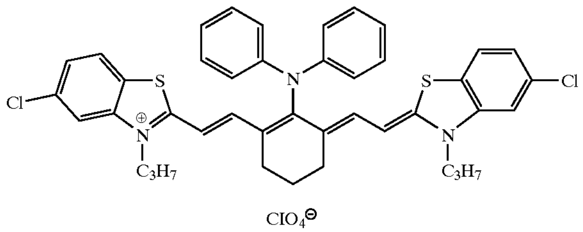

IR27

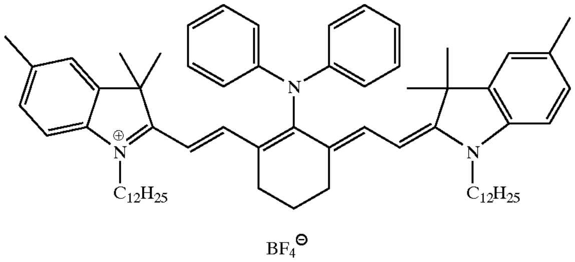

IR28

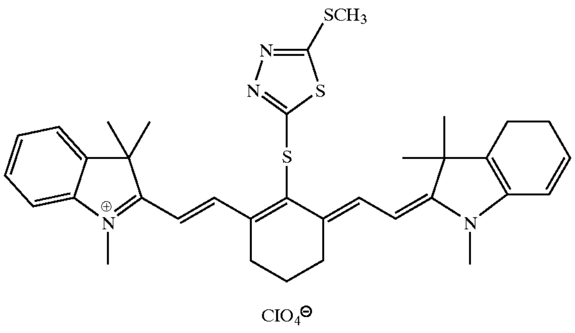

-continued

IR29

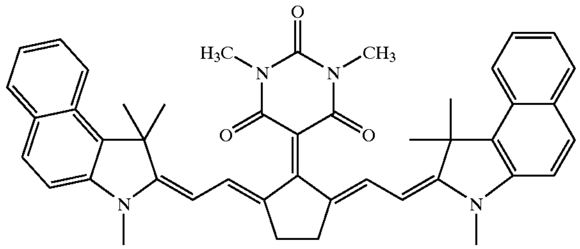

IR30

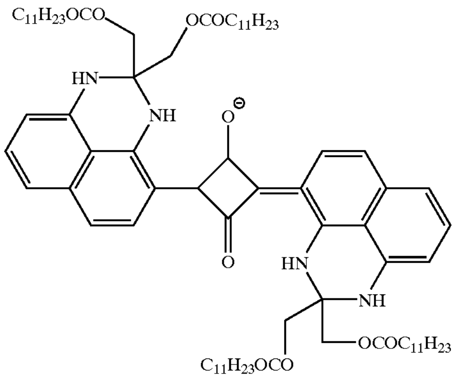

IR31

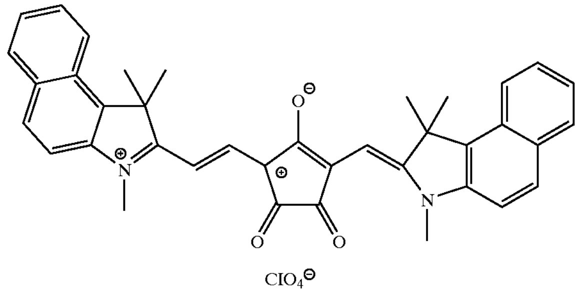

The sensitizing dyes may be preferably employed individually or as a combination of two or more thereof in the present invention. In the image-forming layer according to the present invention, known compounds which function for further increasing sensitivity or preventing the polymerization inhibition due to oxygen may be incorporated as cosensitizers.

Examples of the cosensitizer include amine compounds as described in M. R. Sander, *Journal of Polymer Society*, Vol., 10, page 3173 (1972), JP-B-44-20189, JP-A-51-82102, JP-A-52-134692, JP-A-59-138205, JP-A-60-84305, JP-A-62-18537, JP-A-64-33104 and *Research Disclosure*, No. 33825, and specifically triethanolamine, ethyl p-dimethylaminobenzoate, p-formyldimethylaniline and p-methylthiodimethylaniline.

Other examples of the cosensitizer include thiol compounds as described in JP-A-53-702, JP-B-55-50806 and JP-A-5-142772, and disulfide compounds as described in JP-A-56-75643, and specifically 2-mercaptobenzothiazole, 2-mercaptobenzoxazole, 2-mercaptobenzimidazole, 2-mercapto-4(3H)-quinazoline and β-mercaptonaphthalene.

Still other examples of the cosensitizer include amino acid compounds (e.g., N-phenylglycine), organometal compounds (e.g., tributyl tin acetate) as described in JP-B-48-42965, hydrogen donors as described in JP-B-55-34414, sulfur compounds (e.g., trithiane) as described in JP-A-6-308727, phosphorus compounds (e.g., diethylphosphite) as described in JP-A-6-250389, and Si—H or Ge—H compounds.

The amount of radical initiator used is preferably from 0.01 to 60% by weight, and more preferably form 0.05 to 30% by weight, based on the total solid content of the image-forming layer according to the present invention.

In the present invention, a molar ratio of the sensitizing dye to the radical initiator in the photopolymerizable composition is preferably from 99/1 to 1/99, more preferably from 90/10 to 10/90, and particularly preferably from 80/20 to 20/80.

In case of using the cosensitizer, the amount thereof is preferably from 0.01 to 50 parts by weight, more preferably from 0.02 to 20 parts by weight, and particularly preferably from 0.05 to 10 parts by weight per one part by weight of the radical initiator.

<Hydrophilic Resin>

The image-forming layer of lithographic printing plate precursor according to the present invention contains a hydrophilic resin for improving the on-machine developing property and the film strength of the image-forming layer itself.

The hydrophilic resin preferably has a hydrophilic group, for example, a hydroxy group, a carboxy group, a phosphoric acid group, a sulfonic acid group or an amido group. Because the image strength is increased by reacting the hydrophilic resin with a vinyloxy group to crosslink, thereby improving the press life, the hydrophilic resin having a functional group reacting with the vinyloxy group, for example, a hydroxy group, a carboxy group, a phosphoric acid group or a sulfonic acid group is also preferred. The hydrophilic resin having a hydroxy group or a carboxy group is more preferred.

Specific examples of the hydrophilic resin include gum arabic, casein, gelatin, a starch derivative, Soya gum (water-soluble soy polysaccharide), hydroxypropyl cellulose, methyl cellulose, carboxymethyl cellulose and sodium salt thereof, cellulose acetate, sodium alginate, a vinyl acetate-maleic acid copolymer, a styrene-maleic acid copolymer, a polyacrylic acid and salt thereof, a polymethacrylic acid and salt thereof, a homopolymer and copolymer of hydroxyethyl methacrylate, a homopolymer and copolymer of hydroxyethyl acrylate, a homopolymer and copolymer of hydroxypropyl methacrylate, a homopolymer and copolymer of hydroxypropyl acrylate, a homopolymer and copolymer of hydroxybutyl methacrylate, a homopolymer and copolymer of hydroxybutyl acrylate, a polyethylene glycol, a hydroxypropylene polymer, a polyvinyl alcohol, hydrolyzed polyvinyl acetate having a hydrolysis degree of at least 60% by weight, preferably at least 80% by weight, polyvinylformal, polyvinylpyrrolidone, a homopolymer and copolymer of acrylamide, a homopolymer and copolymer of methacrylamide, a homopolymer and copolymer of N-methylolacrylamide, a homopolymer and copolymer of 2-acrylamido-2-methyl-1-propanesulfonic acid, and a homopolymer and copolymer of 2-methacryloyloxyethylphosphonic acid.

The above-described hydrophilic resin may also be used after crosslinking to the extent capable of developing the unexposed area on a printing machine. The crosslinking agent which can be used includes, for example, an aldehyde, e.g., glyoxal, a melamine-formaldehyde resin or a urea-formaldehyde resin; a methylol compound, e.g., N-methylolurea, N-methylolmelamine or a methylolated polyamide resin; an active vinyl compound, e.g., divinylsulfone or bis(β-hydroxyethylsulfonic acid); an epoxy compound, e.g., epichlorohydrin, polyethylene glycol diglycidyl ether, a polyamide-polyamine-epichlorohydrin addition product or a polyamide-epichiorohydrin resin; an ester compound, e.g., a monochloroacetic acid ester or a thioglycolic acid ester; a polycarboxylic acid, e.g., polyacrylic acid or a methyl vinyl ether/maleic acid copolymer; an inorganic crosslinking agent, e.g., boric acid, titanyl sulfate, a Cu salt, an Al salt, a Sn salt, a V salt or a Cr salt; and a modified polyimide resin.

Further, a crosslinking catalyst, for example, ammonium chloride, a silane coupling agent or a titanate coupling agent can be used together.

<Other Additives>

In order to easily distinguish the image area and the non-image area after the image formation, a dye having a large absorption in the visible region can be used as a coloring agent for the image in the image-forming layer. Specific examples of the dye include Oil Yellow #101, Oil yellow #103, Oil pink #312, Oil Green BG, Oil Blue BOS, Oil Blue #603, Oil Black BY and Oil Black T-505 (these are manufactured by Orient Chemical Industries, Ltd.), Victoria Pure Blue, Crystal Violet (CI 42555), Methyl Violet (CI 42535). Ethyl Violet, Rhodamine B (CI 45170B), Malachite Green (CI 42000), Methylene Blue (CI 52015), and dyes described in JP-A-62-293247. Also, a pigment, for example, a phthalocyanine pigment, an azo pigment or titanium oxide can be preferably used. The amount of coloring agent added is preferably from 0.01 to 10% by weight based on the total solid content of a coating solution for the image-forming layer.

Further, a plasticizer may be added to the image-forming layer according to the present invention for imparting flexibility to the film formed, if desired. For example, polyethylene glycol, tributyl citrate, diethyl phthalate, dibutyl phthalate, dihexyl phthalate, dioctyl phthalate, tricresyl phosphate, tributyl phosphate, trioctyl phosphate or tetrahydrofurfuryl oleate is used.

For forming the image-forming layer according to the present invention, a coating solution is prepared by dissolving or dispersing the above-described necessary components in a solvent and coated on a support. Examples of the solvent used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, $\gamma$-butyrolactone, toluene and water, although the solvent used in the present invention is not limited thereto. The solvents are used individually or as a mixture of two or more thereof. The concentration of the solid content in the coating solution is preferably from 1 to 50% by weight.

A coating amount (solid content) of the image-forming layer on the support after coating and drying may be varied depending upon the use, but is preferably from 0.2 to 5.0 $g/m^2$. As a coating method, various methods can be used. Examples of the coating method include bar coater coating, rotary coating, spray coating, curtain coating, dip coating, air knife coating, blade coating and roll coating.

A surface active agent, for example, a fluorine surface active agent as described in JP-A-62-170950 can be added to the coating solution for image-forming layer according to the present invention for improving the coating property. The amount of surface active agent added is preferably from 0.01 to 1% by weight, more preferably from 0.05 to 0.5% by weight, based on the total solid content of the image-forming layer.

<<Overcoat Layer>>

A water-soluble overcoat layer may be provided on the image-forming layer of the lithographic printing plate precursor according to the present invention for preventing the surface of image-forming layer from contamination with lipophilic substances. The water-soluble overcoat layer used in the present invention is a layer which is easily removed at printing and contains a resin selected from a water-soluble organic polymer compound. The water-soluble organic polymer compound used is a compound, a coating film of which formed by coating and drying has a film-forming ability. Specific examples of the water-soluble organic polymer compound include polyvinyl acetate having the hydrolysis degree of at least 65%, polyacrylic acid and alkali metal salt or amine salt thereof, a polyacrylic acid copolymer and alkali metal salt or amine salt thereof, polymethacrylic acid and alkali metal salt or amine salt thereof, a polymethacrylic acid copolymer and alkali metal salt or amine salt thereof, polyacrylamide and copolymer thereof, polyhydroxyethyl acrylate, polyvinylpyrrolidone and copolymer thereof, polyvinyl methyl ether, a vinyl methyl ether/maleic anhydride copolymer, poly-2-acrylamido-2-methyl-1-propanesulfonic acid and alkali metal salt or amine salt thereof, a poly-2-acrylamido-2-methyl-1-propanesulfonic acid copolymer and alkali metal salt or amine salt thereof, gum arabic, a cellulose derivative (for example, carboxymethyl cellulose, carboxyethyl cellulose or methyl cellulose) and modified product thereof, white dextrin, pullulan, and enzyme-decomposed etherified dextrin. Two or more of these resins can be used as a mixture thereof according to the purposes.

As the polymer used for the water-soluble overcoat layer, the above-described polar-conversion polymer, e.g., polyacrylic acid is particularly preferred in view of increasing the resistance of image area to a fountain solution and thus improving the press life.

The overcoat layer may also contain the above-described water-soluble infrared absorbing dye. Furthermore, when an aqueous coating solution is used for forming the overcoat layer, a nonionic surface active agent, for example, polyoxyethylene nonylphenyl ether or polyoxyethylene dodecyl ether may be added to the coating solution for the purpose of ensuring the uniformity of coating.

The dry coating amount of overcoat layer is preferably from 0.1 to 2.0 $g/m^2$. Within such a range of the dry coating amount, contamination on the surface of image-forming layer due to lipophilic substances, for example, attachment of fingerprint, can be effectively prevented without deteriorating the on-machine developing property.

<<Support>>

The support of the lithographic printing plate precursor according to the present invention, to which the above-described image-forming layer is applied, is a dimensionally stable plate material. Examples of the support include paper, paper laminated with a plastic (e.g., polyethylene, polypropylene or polystyrene), a metal plate (e.g., aluminum, zinc or copper plate), a plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal film), and paper or a plastic film laminated or vapor-deposited with the metal as described above. A polyester film and an aluminum plate are preferably used as the support.

The aluminum plate includes a pure aluminum plate, an aluminum alloy plate containing a very small amount of foreign element(s) and a plate formed by laminating a plastic on a thin aluminum or aluminum alloy plate. Examples of the foreign element contained in the aluminum alloy include silicon, iron, manganese, copper, magnesium, chromium, zinc, bismuth, nickel and titanium. The content of the foreign element in the aluminum alloy is not more than 10% by weight. The aluminum plate may be an aluminum plate from aluminum ingot obtained by using a DC casting method or an aluminum plate from aluminum ingot obtained by a continuous casting method. The aluminum plate used in the present invention can also be appropriately selected from aluminum plates hitherto known and used.

A thickness of the support used in the present invention is from 0.05 to 0.6 mm, preferably from 0.1 to 0.4 mm, and particularly preferably from 0.15 to 0.3 mm.

Prior to the use of aluminum plate, it is preferred to perform a surface treatment, for example, surface graining or anodizing (anodic oxidation). By the surface treatment, hydrophilic property of the surface is improved and it becomes easy to ensure adhesion to the image-forming layer.

The graining treatment of surface of aluminum plate can be conducted using various methods, for example, a method of mechanical graining, a method of graining by electrochemically dissolving the surface of aluminum plate, and a method of selectively chemically dissolving the surface of aluminum plate.

As the mechanical graining method, known methods, for example, a ball graining method, a brush graining method, a blast graining method or a buff graining method can be used. As the chemical graining method, a method of dipping an aluminum plate in a saturated aqueous solution of aluminum salt of mineral acid as described in JP-A-54-31187 is suitably used. As the electrochemical graining method, a method of graining in an electrolytic solution containing an acid such as hydrochloric acid or nitric acid by applying an alternating current or a direct current is used. Also, an electrolytic graining method using a mixed acid as described in JP-A-54-63902 can be utilized.

It is preferred that the graining treatment of the surface of aluminum plate using the method as described above is conducted in an extent that the center line average roughness (Ra) of the surface of aluminum plate becomes in the range of from 0.2 to 1.0 $\mu$m.

The surface-grained aluminum plate is, if desired, subjected to an alkali etching treatment using an aqueous solution of potassium hydroxide or sodium hydroxide, and then subjected to a neutralization treatment. Thereafter, the aluminum plate is subjected to an anodizing treatment for increasing the abrasion resistance, if desired.

As an electrolyte, which is used for the anodizing treatment of aluminum plate, various electrolytes that form a porous oxide film can be used. Ordinarily, sulfuric acid, hydrochloric acid, oxalic acid, chromic acid, or a mixture thereof is used. The concentration of electrolyte is appropriately determined depending on the kind of electrolyte.

The conditions of anodizing treatment cannot be generally determined since the conditions variously change depending on the kind of electrolyte used. Ordinarily, however, it is suitable that the concentration of electrolyte is from 1 to 80% by weight, the solution temperature is from 5 to 70° C., a current density is from 5 to 60 A/dm$^2$, an electric voltage is from 1 to 100 V, and the electrolytic time is from 10 seconds to 5 minutes.

An amount of the anodized film formed is preferably from 1.0 to 5.0 g/m$^2$, and particularly preferably from 1.5 to 4.0 g/m$^2$.

The aluminum plate subjected to the surface treatment and having the anodized film as described above may be used, as it is as the support in the present invention. However, in order to more improving the adhesion to a layer provided thereon, hydrophilic property, resistance to contamination or heat insulating property, other treatments, for example, a treatment for enlarging micropores of the anodized film as described in JP-A-2001-253181 and JP-A-2001-322365, a sealing treatment of the micropores, and a surface hydrophilic treatment of immersing in an aqueous solution containing a hydrophilic compound can be appropriately selectively applied to the aluminum plate, if desired.

Suitable examples of hydrophilic compound for the above-described surface hydrophilic treatment include polyvinylphosphonic acid, a compound having a sulfonic acid group, a saccharide compound, citric acid, an alkali metal silicate, potassium zirconium fluoride and a phosphate/inorganic fluorine compound.

In case of using a support having an insufficient hydrophilic property, for example, a polyester film, in the present invention, it is desirable to coat a hydrophilic layer thereon to make the surface sufficiently hydrophilic. For such a purpose, a hydrophilic layer formed by coating a coating solution containing a colloid of an oxide or hydroxide of at least one element selected from beryllium, magnesium, aluminum, silicon, titanium, boron, germanium, tin, zirconium, iron, vanadium, antimony and a transition metal as described in JP-A-2001-199175 is preferred. Of the hydrophilic layers, a hydrophilic layer formed by coating a coating solution containing a colloid of silicon oxide or silicon hydroxide is preferably used.

In the present invention, an inorganic under coat layer of a water-soluble metal salt, for example, zinc borate, as described in JP-A-2001-322365, or an organic under coat layer containing, for example, carboxymethyl cellulose, dextrin or polyacrylic acid may be provided on the support before coating the image-forming layer, if desired.

The under coat layer may also contain the above-described infrared absorbing dye.

<<Plate-Making and Printing>>

The formation of image on the lithographic printing plate precursor of the present invention is carried out by means of heat. Specifically, for instance, direct imagewise recording by a thermal recording head, a scanning exposure by an infrared laser, a high-illuminance flash exposure by a xenon discharge lamp or an infrared lamp exposure is used. Exposure by a solid high-output infrared laser, for example, a semiconductor laser emitting an infrared ray having a wavelength of from 700 to 1200 nm or a YAG laser is preferably used.

The image-exposed lithographic printing plate precursor according to the present invention is mounted on a printing machine without any other processes, and subjected to printing by an ordinary procedure using ink and a fountain solution.

Also, as a simple lithographic printing system without using a fountain solution, lithographic printing using emulsion ink as described, for example, in JP-B-49-26844, JP-B-49-27124, JP-B-49-27125, JP-A-53-36307, JP-A-53-36308, JP-B-61-52867, JP-A-58-211484, JP-A-53-27803, JP-A-53-29807, JP-A-54-146110, JP-A-57-212274, JP-A-58-37069 and JP-A-54-106305 can be used.

The lithographic printing plate precursor can be, after mounting on a cylinder of printing machine, exposed by a laser loaded on the printing machine, and then subjected to on-machine development by supplying a fountain solution and/or ink.

Also, the lithographic printing plate precursor can be developed using water or an appropriate aqueous solution as a developer, and then subjected to printing.

The present invention will be described in greater detail with reference to the following examples, but the present invention should not be construed as being limited thereto.

Production of Support

A melt of JIS A 1050 alloy containing not less than 99.5% of aluminum, 0.30% of Fe, 0.10% of Si, 0.02% of Ti, and 0.013% of Cu was subjected to a cleaning treatment and casting. The cleaning treatment includes a degassing treatment for removing undesirable gas, for example, hydrogen gas in the melt, and a treatment with a ceramic tube filter. The casting was conducted according to a DC casting method. A surface of the solidified ingot plate having a thickness of 500 mm was ground by 10 mm, and the ingot plate was subjected to a homogenizing treatment at 550° C. for 10 hours in order to prevent the formation of coarse intermetallic compound. Then, the ingot plate was subjected to hot rolling at 400° C., intermediate annealing in a continuous annealing furnace at 500° C. for 60 seconds, and cold rolling to produce a rolled aluminum plate having a thickness of 0.30 mm. The center line average surface roughness Ra of the rolled aluminum plate was adjusted to 0.2 μm by means of controlling the roughness of rolling roller. Thereafter, the aluminum plate was subjected to treatment with a tension leveler for improving the flatness thereof.

The aluminum plate was then subjected to surface treatment for preparing a support for lithographic printing plate in the following manner.

First, the aluminum plate was subjected to a degreasing treatment with a 10% aqueous solution of sodium aluminate at 50° C. for 30 seconds for removing rolling oil on the surface thereof and then neutralization and desmut treatments with a 30% aqueous solution of sulfuric acid at 50° C. for 30 seconds.

Then, a so-called graining treatment for roughening a surface of the support was carried out for improving adhesion between the support and the image-forming layer and also imparting a water-retaining property to the non-image area. Specifically, the aluminum web was transported in an aqueous solution containing 1% nitric acid and 0.5% aluminum nitrate, which had been maintained at 45° C., while applying an anode side quantity of electricity of 240 $C/dm^2$ at a current density of 20 $A/dm^2$ and an AC wave-form of a duty ratio of 1:1 by means of an indirect electric power supply cell, whereby electrolytic graining was conducted. The aluminum web was then subjected to an etching treatment with a 10% aqueous solution of sodium aluminate at 50° C. for 30 seconds, and neutralization and desmut treatments with a 30% aqueous solution of sulfuric acid at 50° C. for 30 seconds.

For the purpose of further improving abrasion resistance, chemical resistance, and water-retaining property, an oxide film was formed on the surface of support by an anodizing treatment. Specifically, the aluminum web was transported in a 20% aqueous solution of sulfuric acid as an electrolyte at 35° C. to carry out an electrolytic treatment with a direct current of 14 $A/dm^2$ by means of an indirect electric power supply cell, whereby an anodized film of 2.5 $g/m^2$ was formed.

Thereafter, the aluminum plate was subjected to a silicate treatment for ensuring the hydrophilic property in the non-image area of a printing plate. Specifically, the aluminum web was transported in a 1.5% aqueous solution of sodium silicate (#3), which had been maintained at 70° C., so that the contact time of the aluminum web with the solution became 15 seconds, and then washed with water. The amount of Si attached was 10 $mg/m^2$. The center line average surface roughness Ra of the support thus-prepared was 0.25 μm.

Synthesis of Fine Particle and Microcapsule

<Synthesis of Monomer M-1>

To a solution of 260.3 g of hydroxyethyl methacrylate in 1,000 ml of tetrahydrofuran was added dropwise 253.9 g of 3-chloropropionic chloride, followed by allowing to react.

Water was added to the reaction solution, and then the mixture was neutralized with potassium carbonate and extracted with ethyl acetate. The extract was purified by distillation to obtain Monomer M-1. (Yield: 92%)

<Synthesis of Radical Polymerizable Group-Containing Polymer P-1>

A mixed solution of 68 g of Monomer M-1 described above, 7.9 g of methacrylic acid, 140 ml of propylene glycol monomethyl ether and 0.5 g of Initiator V-65 was raised to 70° C. with stirring under nitrogen gas atmosphere, followed by reacting for 4 hours. After cooling, to the reaction solution were added 500 ml of propylene glycol monomethyl ether and then 81 g of triethylamine, followed by stirring for one hour. Further, 100 ml of concentrated hydrochloric acid and 100 ml of water were added dropwise to the solution with stirring. The precipitates thus-deposited were collected by filtration and purified to obtain Polymer P-1 containing a methacryloyl group.

<Synthesis of Radical Polymerizable Group-Containing Polymer P-2>

To a mixed solution of 12.2 g of poly-p-hydroxystyrene (weight average molecular weight: 8,000), 15.5 g of 2-methacryloyloxyethyl isocyanate and 500 ml of tetrahydrofuran was added 10 g of triethylamine, and the mixture was raised to 70° C. with stirring, followed by reacting for 3 hours.

After cooling, the solution was reprecipitated with water and the precipitates were collected and purified to obtain Polymer P-2 containing a methacryloyl group. The introduction rate of methacryloyl group determined by NMR was 80 equivalent %.

<Synthesis of Fine Particle (1) for Comparison>

In a mixture of 7.4 g of methyl ethyl ketone and 13.7 g of ethyl acetate were dissolved 6 g of Polymer P-1 described above, 1.5 of an infrared absorbing dye (IR-24 described hereinbefore), 0.6 g of a radical initiator (OI-5 described hereinbefore) and 0.1 g of an anionic surface active agent (Paionin A-41C, manufactured by Takemoto Oil and Fat Co., Ltd.) to prepare an oil phase component. The oil phase component was mixed with 53 g of a 1.8% aqueous solution of polyvinyl alcohol (PVA 205, manufactured by Kuraray Co., Ltd.) as an aqueous phase component, and the mixture was emulsified and dispersed by a homogenizer at 15,000 rpm for 10 minutes. Then, the emulsified dispersion was stirred at 40° C. for 3 hours to evaporate the methyl ethyl ketone and ethyl acetate. The solid content concentration of the resulting fine particle dispersion was 15.4% by weight. The average particle size of the fine particles was 0.30 μm.

<Synthesis of Fine Particle (2) for Comparison>

In the same manner as in Synthesis of Fine Particle (1) for Comparison except for using Polymer P-2 (weight average molecular weight: 8,000) described above in place of Polymer P-1, a dispersion of Fine Particle (2) for Comparison was synthesized. The solid content concentration of the resulting fine particle dispersion was 15.3%. The average particle size of the fine particles was 0.2 μm.

<Synthesis of Fine Particle (3) for Comparison>

In a mixture of 7.4 g of methyl ethyl ketone and 13.7 g of ethyl acetate were dissolved 5.5 g of an allyl methacrylate/methyl methacrylate copolymer (copolymerization ratio: 70/30, weight average molecular weight: 15,000), 1.5 g of an infrared absorbing dye (IR-24 described hereinbefore), 0.5 g of dipentaerythritol hexaacrylate (KAYARAD DPHA, manufactured by Nippon Kayaku Co., Ltd.), 0.6 g of a radical initiator (OI-5 described hereinbefore) and 0.1 g of an anionic surface active agent (Paionin A-41C, manufactured by Takemoto Oil and Fat Co., Ltd.) to prepare an oil phase component. The oil phase component was mixed with 53 g of a 1.8% aqueous solution of polyvinyl alcohol (PVA 205, manufactured by Kuraray Co., Ltd.) as an aqueous phase component, and the mixture was emulsified and dispersed by a homogenizer at 15,000 rpm for 10 minutes. Then, the emulsified dispersion was stirred at 40° C. for 3 hours to evaporate the methyl ethyl ketone and ethyl acetate. The solid content concentration of the resulting fine particle dispersion was 15.3% by weight. The average particle size of the fine particles was 0.35 μm.

<Synthesis of Fine Particle (1) of Invention)

In a mixture of 7.4 g of methyl ethyl ketone and 13.7 g of ethyl acetate were dissolved 6 g of Polymer Q-1 (weight average molecular weight: 20,000) of the present invention described below, 1.5 of an infrared absorbing dye (IR-24 described hereinbefore), 0.6 g of a radical initiator (OI-5 described hereinbefore) and 0.1 g of an anionic surface active agent (Paionin A-41C, manufactured by Takemoto Oil and Fat Co., Ltd.) to prepare an oil phase component. The oil phase component was mixed with 53 g of a 1.8% aqueous solution of polyvinyl alcohol (PVA 205, manufactured by Kuraray Co., Ltd.) as an aqueous phase component, and the mixture was emulsified and dispersed by a homogenizer at 15,000 rpm for 10 minutes. Then, the emulsified dispersion was stirred at 40° C. for 3 hours to evaporate the methyl ethyl ketone and ethyl acetate. The solid content concentration of the resulting fine particle dispersion was 16.0% by weight. The average particle size of the fine particles was 0.29 μm.

<Synthesis of Fine Particle (2) of Invention>

In the same manner as in Synthesis of Fine Particle (1) of Invention except for using Polymer Q-2 (weight average molecular weight: 8,000) of the present invention described below in place of Polymer Q-1, a dispersion of Fine Particle (2) of Invention was synthesized. The solid content concentration of the resulting fine particle dispersion was 15.0%. The average particle size of the fine particles was 0.22 μm.

<Synthesis of Fine Particle (3) of Invention>

In the same manner as in Synthesis of Fine Particle (1) of Invention except for using an infrared absorbing dye (IR-41) shown below in place of the infrared absorbing dye (IR-24), a dispersion of Fine Particle (3) of Invention was synthesized. The solid content concentration of the resulting fine particle dispersion was 15.5%. The average particle size of the fine particles was 0.33 μm.

IR-41

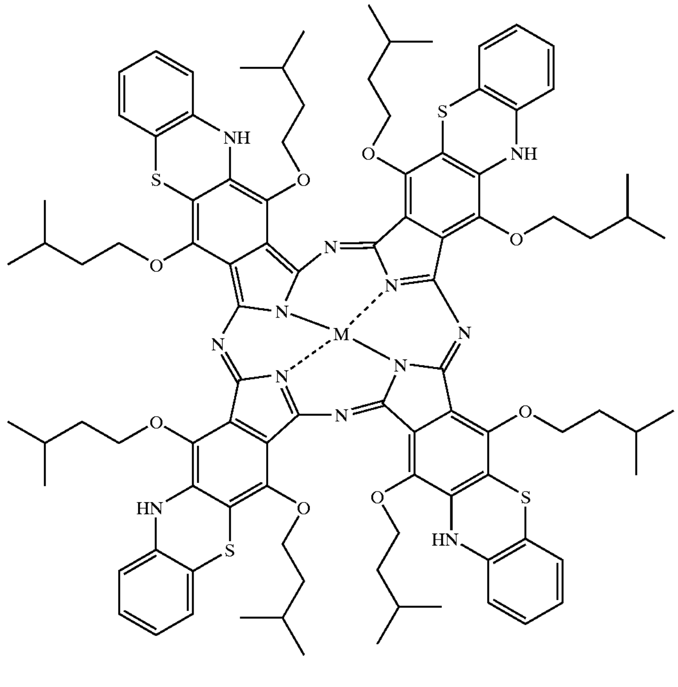

M = VO

<Synthesis of Microcapsule (1) for Comparison>

In a mixture of 30 g of methyl ethyl ketone and 60 g of ethyl acetate were dissolved 40 g of a 50% ethyl acetate solution of an addition product of trimethylolpropane and xylylene diisocyanate (Takenate D-110N, manufactured by Takeda Chemical Industries, Ltd.,) as a microcapsule wall material, 25 g of dipentaerythritol hexaacrylate (KAYARAD DPHA, manufactured by Nippon Kayaku Co., Ltd.), 3 g of an infrared absorbing dye (IR-24 described hereinbefore), 2.5 g of a radical initiator (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous component were emulsified using a homogenizer at 10,000 rpm for 10 minutes. Then, 200 g of water was added to the emulsion, and the mixture was stirred at room temperature for 30 minutes and further at 40° C. for 3 hours. The solid content concentration of the resulting microcapsule liquid was 15.5% by weight, and the average particle size of the microcapsules was 0.35 μm.

<Synthesis of Microcapsule (2) for Comparison>

In a mixture of 30 g of methyl ethyl ketone and 60 g of ethyl acetate were dissolved 40 g of a 50% ethyl acetate solution of an addition product of trimethylolpropane and xylylene diisocyanate (Takenate D-110N, manufactured by Takeda Chemical Industries, Ltd.,) as a microcapsule wall material, 10 g of dipentaerythritol hexaacrylate (KAYARAD DPHA, manufactured by Nippon Kayaku Co., Ltd.), 15 g of an allyl methacrylate/methyl methacrylate copolymer (copolymerization ratio: 70/30, weight average molecular weight: 15,000), 3 g of an infrared absorbing dye (IR-24 described hereinbefore), 2.5 g of a radical initiator (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous component were emulsified using a homogenizer at 10,000 rpm for 10 minutes. Then, 200 g of water was added to the emulsion, and the mixture was stirred at room temperature for 30 minutes and further at 40° C. for 3 hours. The solid content concentration of the resulting microcapsule liquid was 15.3% by weight, and the average particle size of the microcapsules was 0.31 $\mu$m.

<Synthesis of Microcapsule (3) for Comparison>

In the same manner as in Synthesis of Microcapsule (1) for Comparison except for using IR-41 shown above as the infrared absorbing dye, in place of IR-24, Microcapsule (3) for Comparison was synthesized. The solid content concentration of the resulting microcapsule liquid was 15.5% by weight, and the average particle size of the microcapsules was 0.36 $\mu$m.

<Synthesis of Microcapsule (1) of Invention>

In a mixture of 30 g of methyl ethyl ketone and 60 g of ethyl acetate were dissolved 40 g of a 50% ethyl acetate solution of an addition product of trimethylolpropane and xylylene diisocyanate (Takenate D-110N, manufactured by Takeda Chemical Industries, Ltd.,) as a microcapsule wall material, 12 g of dipentaerythritol hexaacrylate (KAYARAD DPHA, manufactured by Nippon Kayaku Co., Ltd.), 13 g of Monomer R-1 of the present invention described below, 3 g of an infrared absorption dye (IR-24 described hereinbefore), 2.5 g of a radical initiator (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous component were emulsified using a homogenizer at 10,000 rpm for 10 minutes. Then, 200 g of water was added to the emulsion, and the mixture was stirred at room temperature for 30 minutes and further at 40° C. for 3 hours. The solid content concentration of the resulting microcapsule liquid was 15.0% by weight, and the average particle size of the microcapsules was 0.33 $\mu$m.

<Synthesis of Microcapsule (2) of Invention>

In a mixture of 30 g of methyl ethyl ketone and 60 g of ethyl acetate were dissolved 40 g of a 50% ethyl acetate solution of an addition product of trimethylolpropane and xylylene diisocyanate (Takenate D-110N, manufactured by Takeda Chemical Industries, Ltd.,) as a microcapsule wall material, 5 g of dipentaerythritol hexaacrylate (KAYARAD DPHA, manufactured by Nippon Kayaku Co., Ltd.), 5 g of Monomer R-2 of the present invention described below, 15 g of an allyl methacrylate/methyl methacrylate copolymer (copolymerization ratio: 70/30, weight average molecular weight: 15,000), 3 g of an infrared absorbing dye (IR-24 described hereinbefore), 2.5 g of a radical initiator (OI-5 described hereinbefore) and 0.1 g of Paionin A-41C to prepare an oil phase component. As an aqueous phase component, 120 g of a 4% aqueous solution of PVA 205 was prepared. The oil phase component and the aqueous phase component were emulsified using a homogenizer at 10,000 rpm for 10 minutes. Then, 200 g of water was added to the emulsion and the mixture was stirred at room temperature for 30 minutes and further at 40° C. for 3 hours. The solid component concentration of the resulting microcapsule liquid was 15.0% by weight, and the average particle size of the microcapsules was 0.30 $\mu$m.

<Synthesis of Microcapsule (3) of Invention>

In the same manner as in Synthesis of Microcapsule (1) of Invention except for using IR-41 shown above as the infrared absorbing dye, in place of IR-24, Microcapsule (3) of Invention was synthesized. The solid content concentration of the resulting microcapsule liquid was 15.3%, and the average particle size of the microcapsules was 0.35 $\mu$m.

EXAMPLES 1 TO 6 AND COMPARATIVE EXAMPLES 1 TO 6

Coating solutions for the image-forming layer having the composition shown below each containing fine particles or microcapsules selected from Fine Particles (1) to (3) of Invention, Fine Particles (1) to (3) for Comparison, Microcapsules (1) to (3) of Invention and Microcapsules (1) to (3) for Comparison described above as shown in Table A below were prepared. Each coating solution was coated on the support prepared described above by a bar coating method and dried in an oven under the conditions of 60° C. for 120 seconds to prepare a lithographic printing plate precursor having a dry coating amount of the image-forming layer of 1 g/$m^2$.

| Coating Solution for Image-Forming Layer | |
|---|---|
| Water | 25 g |
| Fine particles or microcapsules | 20 g |

Each of the lithographic printing plate precursors thus prepared was exposed by means of Trendsetter 3244 VFS (manufactured by Creo Co.) equipped with a water-cooled 40 W infrared semiconductor laser under the conditions of output of 9 W, outer surface drum rotation speed of 210 rpm, plate surface energy of 100 mJ/$m^2$, and resolution of 2,400 dpi, and without development processing, mounted on a cylinder of a printing machine (SOR-M, manufactured by Heidelberg Co.). After supplying first a fountain solution and then printing ink, paper was fed to conduct printing.

As a result, with all of the lithographic printing plate precursors, on-machine development could be carried out without causing any trouble and printing was possible. Press life (printable numbers of paper) of each lithographic printing plate precursor is shown in Table A below. As is apparent from the results shown in Table A, good press life is obtained with the lithographic printing plate precursors according to the present invention, even when an overcoat layer is omitted.

TABLE A

| | Fine Particle or Microcapsule | Press Life |
|---|---|---|
| Example 1 | Fine particle (1) of Invention | 60,000 |
| Example 2 | Fine particle (2) of Invention | 40,000 |
| Example 3 | Fine particle (3) of Invention | 50,000 |
| Example 4 | Microcapsule (1) of Invention | 50,000 |
| Example 5 | Microcapsule (2) of Invention | 40,000 |
| Example 6 | Microcapsule (3) of Invention | 50,000 |
| Comparative Example 1 | Fine particle (1) for Comparison | 20,000 |
| Comparative Example 2 | Fine particle (2) for Comparison | 15,000 |
| Comparative Example 3 | Fine particle (3) for Comparison | 5,000 |
| Comparative Example 4 | Microcapsule (1) for Comparison | 13,000 |
| Comparative Example 5 | Microcapsule (2) for Comparison | 12,000 |
| Comparative Example 6 | Microcapsule (3) for Comparison | 6,000 |

EXAMPLE 7

A coating solution for overcoat layer described below was prepared, coated on the image-forming layer of lithographic printing plate precursor of Example 1 above by a bar coating method and dried in an oven under the conditions of 60° C. for 120 seconds to prepare a lithographic printing plate precursor having a dry coating amount of the overcoat layer of 0.5 $g/m^2$.

| Coating Solution for Overcoat Layer | |
|---|---|
| Water | 95 g |
| Carboxymethyl cellulose | 5 g |

The lithographic printing plate precursor thus obtained was exposed and subjected to printing in the same manner as in Example 1. It was found that the on-machine development was possible without causing any trouble, and 123,000 prints were obtained.

From the results described above, it can be seen that the lithographic printing plate precursor according to the present invention using the fine particles containing the compound having the specific radical polymerizable group or the microcapsules encapsulating the compound having the specific radical polymerizable group has good press life. Also, even when the radical initiator or the polymethine dye, which is an infrared absorbing dye, is incorporated into the fine particles or microcapsules, the lithographic printing plate precursor shows good press life.

Structures of the compounds used in the above-described examples are shown below.

The radical polymerizable compound having a structure represented by formula (I) hardly suffers polymerization inhibition due to oxygen in comparison with conventional polymerizable compounds, provides a photosensitive material having high sensitivity and forms a film having high hardness by means of heat so that a lithographic printing plate having excellent press life can be obtained.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A lithographic printing plate precursor comprising a hydrophilic support having provided thereon an image-forming layer containing a radical initiator, an infrared absorbing dye, and at least one component selected from fine particles containing a radical polymerizable compound having a structure represented by formula (I) shown below and microcapsules encapsulating a radical polymerizable compound having a structure represented by formula (I) shown below:

(Q-1)

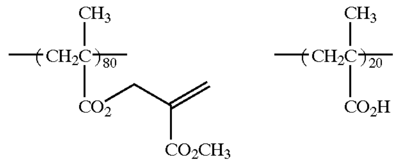

($\bar{M}w$ 20000)

(Q-2)

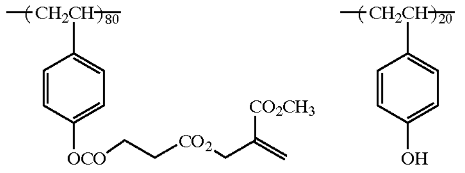

($\bar{M}w$ 8000)

(R-1)

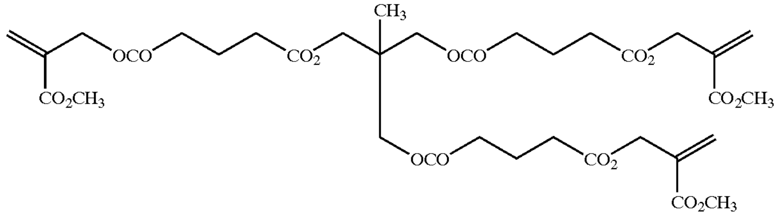

(R-2)

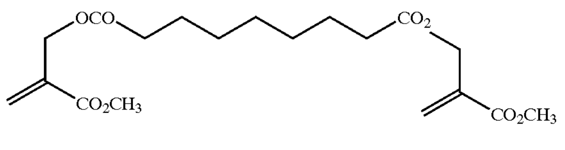

As described above, the lithographic printing plate precursor of the present invention can form images by a scanning exposure based on digital signals. Specifically, when heat is applied due to light exposure, the fine particles containing a radical polymerizable compound having a structure represented by formula (I) or the microcapsules encapsulating a radical polymerizable compound having structure represented by formula (I) cause a reaction with the radical initiator and the infrared absorbing dye contained in the hydrophilic image-forming layer. Thus, the lithographic printing plate precursor shows a good on-machine developing property, high sensitivity, and excellent press life due to increase in the film strength of the image areas heated.

(I)

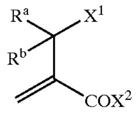

wherein $X^1$ and $X^2$, which may be the same or different, each represents a halogen atom or a group connected through a hetero atom; $R^a$ and $R^b$, which may be the same or different, each represents a hydrogen atom, a halogen atom, a cyano group or an organic residue; or $X^1$ and $X^2$, $R^a$ and $R^b$, or $X^1$ and $R^a$ or $R^b$ may combine with each other to form a cyclic structure.

2. The lithographic printing plate precursor as claimed in claim 1, wherein $X^1$ represents a halogen atom, a hydroxy group, a substituted oxy group. a mercapto group, a substituted thio group, an amino group, a substituted amino group, a sulfo group, a sulfonato group, a substituted sulfinyl group, a substituted sulfonyl group, a phosphono group, a substituted phosphono group, a phosphonato group, a substituted phosphonato group, a nitro group or a heterocyclic group that is connected through a hetero atom included therein.

3. The lithographic printing plate precursor as claimed in claim 1, wherein $X^2$ represents a halogen atom, a hydroxy group, a substituted oxy group, a mercapto group, a substituted thio group, an amino group, a substituted amino group or a heterocyclic group that is connected through a hetero atom included therein.

4. The lithographic printing plate precursor as claimed in claim 1, wherein $R^a$ and $R^b$, which may be the same or different, each represents a hydrogen atom, a halogen atom, a cyano group, a hydrocarbon group which may have a substituent and/or an unsaturated bond, a substituted oxy group, a substituted thio group, a substituted amino group, a substituted carbonyl group or a carboxylato group.

5. The lithographic printing plate precursor as claimed in claim 1, wherein the radical polymerizable compound has at least two structures represented by formula (I).

6. The lithographic printing plate precursor as claimed in claim 1, wherein the radical polymerizable compound is a polymer having the structure represented by formula (I) in the side chain thereof.

7. The lithographic printing plate precursor as claimed in claim 1, wherein the radical initiator is selected from (a) an aromatic ketone, (b) an aromatic onium salt compound, (C) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, and (k) a compound having a carbon-halogen bond.

8. The lithographic printing plate precursor as claimed in claim 1, wherein the radical initiator is an onium salt selected from a diazonium salt, an iodonium salt, a sulfonium salt, an ammonium salt and a pyridinium salt.

9. (Original) The lithographic printing plate precursor as claimed in claim 8, wherein the onium salt is a compound represented by the following formulae (II) to (IV):

(IV)

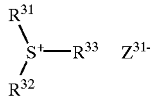

wherein $Ar^{11}$ and $Ar^{12}$ each independently represents an aryl group having not more than 20 carbon atoms, which may have a substituent; $Z^{11-}$ represents a counter ion selected from the group consisting of a halogen ion, a perchlorate ion, a tetrafluoroborate ion, hexafluorophosphate ion and a sulfonate ion; $Ar^{21}$ represents an aryl group having not more than 20 carbon atoms, which may have a substituent; $Z^{21-}$ represents a counter ion having the same meaning as defined for $Z^{11-}$; $R^{31}$, $R^{32}$ and $R^{33}$, which may be the same or different, each represents a hydrocarbon group having not more than 20 carbon atoms, which may have a substituent; and $Z^{31-}$ represents a counter ion having the same meaning as defined for $Z^{11-}$.

10. The lithographic printing plate precursor as claimed in claim 1, wherein the infrared absorbing dye is an anionic infrared absorbing dye, a cationic infrared absorbing dye or a nonionic infrared absorbing dye.

11. The lithographic printing plate precursor as claimed in claim 1, wherein the infrared absorbing dye is a polymethine dye.

12. The lithographic printing plate precursor as claimed in claim 1, wherein the infrared absorbing dye is a cyanine dye having the partial structure represented by the following formula (2):

(2)

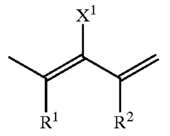

wherein, $R^1$ and $R^2$ each independently represents a hydrogen atom or a hydrocarbon group having from 1 to 12 carbon atoms, or $R^1$ and $R^2$ may combine with each other to form a ring structure; and $X^1$ represents a halogen atom or a substituent represented by the following formula (3), (4), (5) or (6):

$$—X^2\text{-}L^1 \quad (3)$$

wherein $X^2$ represents an oxygen atom or a sulfur atom; and $L^1$ represents a hydrocarbon group having from 1 to 12 carbon atoms;

(4)

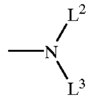

wherein $L^2$ and $L^3$, which may be the same or different, each represents an aromatic hydrocarbon group having from 6 to 10 carbon atoms, which may have a substituent, an alkyl group having from 1 to 8 carbon atoms, which may have a substituent, or a hydrogen atom, or $L^2$ and $L^3$ may combine with each other to form a ring having the following structure;

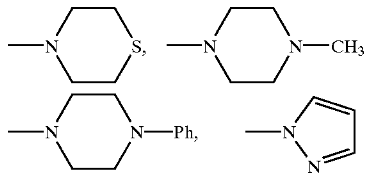

$$—S\text{-}L^4 \quad (5)$$

wherein $L^4$ represents a monocyclic or polycyclic heterocyclic group having at least one of a nitrogen atom, an oxygen atom and a sulfur atom;

(6)

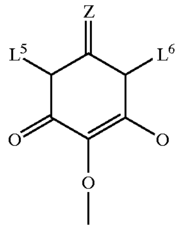

wherein $L^5$ and $L^6$, which may be the same or different, each represents a hydrogen atom, an allyl group, a cyclohexyl group or an alkyl group having from 1 to 8 carbon atoms; and Z represents an oxygen atom or a sulfur atom.

13. The lithographic printing plate precursor as claimed in claim 1, wherein the fine particles containing a radical polymerizable compound having a structure represented by formula (I) or the microcapsules encapsulating a radical polymerizable compound having a structure represented by formula (I) contains at least one of the radical initiator and infrared absorbing dye.

14. The lithographic printing plate precursor as claimed in claim 1, wherein the image-forming layer further contains a hydrophilic resin.

15. The lithographic printing plate precursor as claimed in claim 1, which further comprises an overcoat layer provided on the image-forming layer.

16. The lithographic printing plate precursor as claimed in claim 12, wherein the cyanine dye is a heptamethinecyanine dye represented by formula (7) shown below having an indolenine skeleton, a benzindolenine skeleton, a benzothiazole skeleton, a benzoxazole skeleton or a benzoselenazole skeleton:

(7)

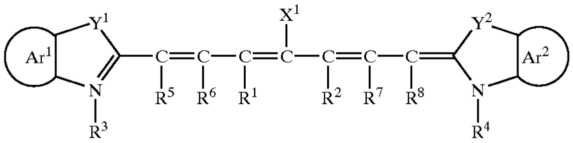

wherein $X^1$, $R^1$ and $R^2$ have the same meanings as defined in formula (2); $Ar^1$ and $Ar^2$, which may be the same or different, each represents an aromatic hydrocarbon group which may has a substituent; $Y^1$ and $Y^2$, which may be the same or different, each represents an oxygen atom, a sulfur atom, a selenium atom or a dialkylmethylene group having not more than 12 carbon atoms; $R^3$ and $R^4$, which may be the same or different, each represents a hydrocarbon group having not more than 20 carbon atoms, which may has a substituent; $R^5$, $R^6$, $R^7$ and $R^8$, which may be the same or different, each represents a hydrogen atom or a hydrocarbon group having not more than 12 carbon atoms; and $Z^{1-}$ represents a counter anion provided that, when one of $R^1$ to $R^8$ is substituted with a sulfo group or when $X^1$ represents the substituent represented by the formula (6), $Z^{1-}$ is unnecessary.

17. The lithographic printing plate precursor as claimed in claim 12, wherein the cyanine dye is a dye represented by the following formula (8) or (9):

(8)

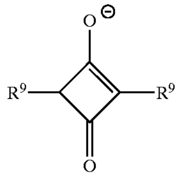

wherein $R^9$ represents a substituent selected from the groups shown below;

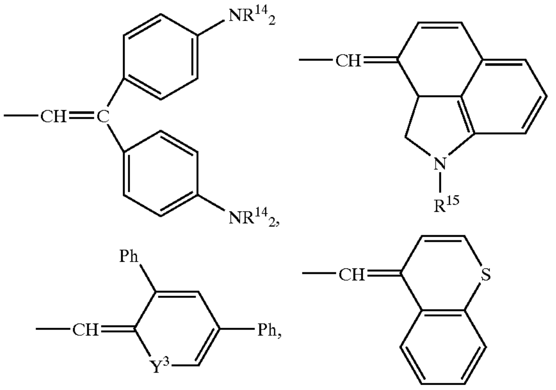

wherein $R^{14}$ and $R^{15}$ each represents an alkyl group having from 1 to 8 carbon atoms; and $Y^3$ represents an oxygen atom or a sulfur atom;

(9)

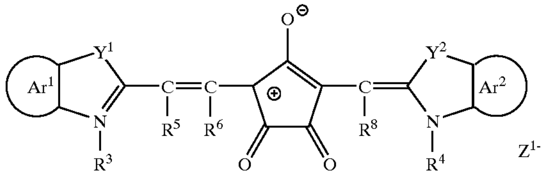

wherein $R^3$ and $R^4$, which may be the same or different, each represents a hydrocarbon group having not more than 20 carbon atoms, which may has a substituent; $R^5$, $R^6$ and $R^8$, which may be the same or different, each represents a hydrogen atom or a hydrocarbon group having not more than 12 carbon atoms; $Ar^1$ and $Ar^2$, which may be the same or different, each represents an aromatic hydrocarbon group which may has a substituent; $Y^1$ and $Y^2$, which may be the same or different, each represents an oxygen atom, a sulfur atom, a selenium atom or a dialkylmethylene group having not more than 12 carbon atoms; and $Z^{1-}$ represents a counter ion.

* * * * *